United States Patent
Hsieh et al.

(10) Patent No.: US 11,961,938 B2
(45) Date of Patent: Apr. 16, 2024

(54) METHOD OF PROCESSING LIGHT-EMITTING ELEMENTS, SYSTEM AND DEVICE USING THE SAME

(71) Applicant: EPISTAR CORPORATION, Hsinchu (TW)

(72) Inventors: Min-Hsun Hsieh, Hsinchu (TW); Chang-Lin Lee, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 16/817,621

(22) Filed: Mar. 13, 2020

(65) Prior Publication Data
US 2020/0295225 A1 Sep. 17, 2020

Related U.S. Application Data

(60) Provisional application No. 62/884,698, filed on Aug. 9, 2019, provisional application No. 62/817,601, filed on Mar. 13, 2019.

(51) Int. Cl.
*H01L 33/00* (2010.01)
*H01L 25/075* (2006.01)

(52) U.S. Cl.
CPC ...... *H01L 33/0095* (2013.01); *H01L 25/0753* (2013.01)

(58) Field of Classification Search
CPC .............. H01L 25/0753; H01L 33/0095; H01L 21/67333; H01L 33/14; H01L 33/005
See application file for complete search history.

(56) References Cited

U.S. PATENT DOCUMENTS

| 6,892,450 | B2 | 5/2005 | Ohba et al. | |
| 2010/0002440 | A1* | 1/2010 | Negley | F21K 9/00 313/503 |
| 2015/0221623 | A1 | 8/2015 | Tischler et al. | |
| 2016/0043292 | A1* | 2/2016 | Wang | H01L 33/62 362/249.02 |
| 2018/0040665 | A1* | 2/2018 | Ohmae | H01L 33/46 |

FOREIGN PATENT DOCUMENTS

CN 107251131 A 10/2017
GB 2541970 A 3/2017

* cited by examiner

*Primary Examiner* — Ratisha Mehta
(74) *Attorney, Agent, or Firm* — Huan-Yi Lin

(57) ABSTRACT

A method of processing light-emitting elements includes: transferring a plurality of light-emitting elements from original wafers or next-stage carriers, based on a predetermined pattern. The predetermined pattern arranges two adjacent LED groups in a first direction on the original wafer or carriers to be placed on two non-adjacent positions in the first direction on the next-stage carriers. The light-emitting elements on the original wafer have a horizontal wafer pitch and a vertical wafer pitch. The light-emitting elements on each of the next-stage carriers have a first horizontal pitch and a first vertical pitch. The first horizontal pitch is greater than the horizontal wafer pitch, or the first vertical pitch is greater than the vertical wafer pitch. Besides, a light-emitting element device using the aforementioned method is also provided.

20 Claims, 92 Drawing Sheets

Second horizontal pitch ≥ First horizontal pitch (Fig. A1 )

Second vertical pitch ≥ First vertical pitch (Fig. A1)

Unit-mapping table 2

| 1 | 3 | 2 |
|---|---|---|
| 2 | 1 | 3 |
| 3 | 2 | 1 |

Fig. 36-1

Unit-mapping table 3

| 2 | 3 | 1 |
|---|---|---|
| 1 | 2 | 3 |
| 3 | 1 | 2 |

Fig. 36-2

Unit-mapping table 4

| 3 | 2 | 1 |
|---|---|---|
| 2 | 1 | 3 |
| 1 | 3 | 2 |

Fig. 36-3

| 1 | 3 | 2 | 1 |
|---|---|---|---|
| 3 | 2 | 1 | 3 |
| 2 | 1 | 3 | 2 |

Fig. 36-4

| 3 | 2 | 1 | 3 |
|---|---|---|---|
| 1 | 3 | 2 | 1 |
| 2 | 1 | 3 | 2 |

Fig. 36-5

| 1 | 2 | 3 | 1 |
|---|---|---|---|
| 2 | 3 | 1 | 2 |
| 3 | 2 | 3 | 1 |

Fig. 36-6

| 1 | 3 | 1 | 3 | 2 |
|---|---|---|---|---|
| 3 | 2 | 3 | 2 | 1 |
| 2 | 1 | 2 | 1 | 3 |

Fig. 36-7

| 1 | 3 | 2 | 3 | 2 |
|---|---|---|---|---|
| 2 | 1 | 3 | 1 | 3 |
| 3 | 2 | 1 | 2 | 1 |

Fig. 36-8

| 2 | 3 | 1 | 3 | 2 |
|---|---|---|---|---|
| 3 | 1 | 2 | 1 | 3 |
| 1 | 2 | 3 | 2 | 1 |

Fig. 36-9

| 1 | 3 | 4 | 2 |
|---|---|---|---|
| 2 | 1 | 2 | 4 |
| 4 | 3 | 1 | 3 |
| 3 | 4 | 2 | 1 |

Fig. 36-10

| 1 | 3 | 2 | 4 |
|---|---|---|---|
| 4 | 1 | 3 | 2 |
| 2 | 4 | 1 | 3 |
| 3 | 2 | 4 | 1 |

Fig. 36-11

LED dies quantity distribution

LED dies quantity distribution

Emission wavelength

LED dies quantity distribution

Emission wavelength

M: Maximum value of category (wavelength, luminous intensity,...) of LED dies in matrix m: minimum value of category (wavelength, luminous intensity,... ) of LED dies in matrix Difference = |M-m|

Difference between maximum value and minimum value in carrier: 552nm – 539nm=13nm Difference between maximum value and minimum value in matrix 1: 550nm – 541nm=9nm (> 50% of 13nm) →Divergent Difference between maximum value and minimum value in matrix 2: 545nm – 540nm=5nm (< 50% of 13nm) →Not divergent CC: Value of category of center LED die = 543nm CS: Values of category of proximate LED dies
(541nm, 540nm, 550nm, 546nm, 547nm, 548nm, 542nm, and 544nm)

Divergent index = (sum of |CS-CC| ) / N
= ( |541-543|+ |540-543|+ |550-543|+|546-543|
+|547-543|+ |548-543|+ |542-543|+ |544-543| ) / 8
=3.25(nm)  → to be compared with the reference value N : count of proximate LED dies=8

METHOD OF PROCESSING LIGHT-EMITTING ELEMENTS, SYSTEM AND DEVICE USING THE SAME

BACKGROUND OF THE INVENTION

Field of Invention

The present invention relates to a method of processing light-emitting elements, such as light emitting diode ("LED")/laser diode ("LD") dies, especially a method of processing light-emitting elements based on at least one predetermined pattern using a pitching and mixing process.

Description of Related Art

Displays are core components of multiple electronic devices, such as smart phones, tablets, laptops, desktops, TVs, and display modules. Current display technologies range from LCDs, to OLEDs and AMOLEDs. Despite the pursuit of a higher resolution display is there, currently, micro LED technology is still under research and development stage.

Micro LED dies are manufactured by semiconductor processes, and a trivial compositional deviation occurring in manufacturing the micro LED dies can result in noticeable deviation on emission wavelength, luminous intensity level, or chromaticity scale, to human eyes. According to the present invention, mixing LED dies with various emission wavelength, luminous intensity levels, or chromaticity scales, is an effective method provided to obtain uniform distribution on a display.

SUMMARY OF THE INVENTION

In view of the above, an objective of the present invention is to provide a method of processing light-emitting elements with specific arrangements and a light-emitting element device using the method, which can improve fading area or facula on the displays caused by the noticeable deviation in emission wavelength, luminous intensity level, or chromaticity scale of LED dies arranged on conventional displays.

To achieve the foregoing objective, a method of processing light-emitting elements, includes: assigning one of a plurality of categories to each of a plurality of LED groups on at least one wafer, each LED group comprising a plurality of LED dies on the same wafer; placing the LED groups of the same category from the wafer to a substrate; transferring the LED dies from more than one substrate of the same emission color to a first-stage carrier based on a first predetermined pattern with a first horizontal pitch and a first vertical pitch; and transferring the LED dies from the first-stage carriers of at least one emission color to a second-stage carrier based on a second predetermined pattern with a second horizontal pitch and a second vertical pitch. The first predetermined pattern arranges two adjacent LED dies in a first direction on the substrate, to be placed on two non-adjacent positions in the first direction on the first-stage carrier.

In an embodiment, the first predetermined pattern comprises a picking pattern of the light-emitting elements according to a two-dimensional matrix of the light-emitting elements on the first-stage carrier, which is divided into several light-emitting element units each taking a form of a two-dimensional sub-matrix corresponding to a second horizontal pitch and a second vertical pitch of the light-emitting elements on the second-stage carrier. The second predetermined pattern takes a form of an array of the light-emitting elements on the second-stage carrier, the array is divided into two-dimensional sub-arrays, and each of the sub-array is arranged at corresponding position to the two-dimensional sub-matrix. A number of the light-emitting element units in each two-dimensional matrix is a multiple of a number of the first-stage carriers for providing the light-emitting elements transferred to the second-stage carrier.

In an embodiment, if a number of the plurality of light-emitting elements of each category of the same emission color in one matrix is larger than 20% of a largest number of the plurality of light-emitting elements of each category of the same emission color, the number has to be within a quantity deviation of the largest number.

In an embodiment, a first predetermined quantity priority of the plurality of light-emitting elements of each category of the same emission color of a first matrix, is the same as a second predetermined quantity priority of the plurality of light-emitting elements of each category of the same emission color of a second matrix; and when a first number of the plurality of light-emitting elements of one specific category of the same emission color of the first matrix, is within a quantity deviation of a second number of the plurality of light-emitting elements of the same category of the same emission color of the second matrix, the first matrix and the second matrix are considered to have the same predetermined quantity priority.

In a second embodiment, the at least one category includes a first category and a second category. Or, the at least one category includes more categories.

In one embodiment, the LED dies on each wafer have a horizontal wafer pitch and a vertical wafer pitch, the LED dies on the first-stage carrier have a first horizontal pitch and a first vertical pitch, and the LED dies on the second-stage carrier have a second horizontal pitch and a second vertical pitch. The horizontal wafer pitch is smaller than the first horizontal pitch or the second horizontal pitch; or the vertical wafer pitch is smaller than the first vertical pitch or the second vertical pitch In a third embodiment, the present invention provides a method of processing light-emitting elements, which includes: selecting a plurality of pre-mixed LED dies with a plurality of emission colors respectively on a plurality of first-stage carriers; placing the pre-mixed LED dies with each emission color on a second-stage carrier based on a predetermined pattern. The predetermined pattern arranges two adjacent pre-mixed LED dies with each emission color on the first-stage carrier, to be placed on two non-adjacent positions in a first direction on the second-stage carrier.

In a fourth embodiment, the present invention provides an LED supply carrier (for example, the first or second-stage carrier), which includes: at least one carrier; a plurality of LED dies placed on the carrier; wherein the plurality of LED dies are divided into a plurality of LED groups respectively assigned to a plurality of two-dimension square matrices identical in matrix dimension. According to the present invention, more than 60% of the square matrices are divergent. Each divergent matrix has a difference between a maximum value and a minimum value of a category for the LED dies with the same emission color therein, which is greater than 50% of a difference between a maximum value and a minimum value of the category for the LED dies with the same emission color in the carrier.

In a fifth embodiment, the present invention provides an LED supply carrier (for example, the first or second-stage carrier), which includes: at least one carrier; a plurality of LED dies placed on the carrier; wherein more than 60% of the plurality of LED dies are divergent; wherein a divergent LED die has a divergent index greater than a reference value. The divergent index is calculated by a ratio of a sum of |CS-CC| to N, wherein the sum of |CS−CC| is derived by adding all absolute values of a difference between a value of a category (CC) of the divergent LED die and a value of the category (CS) of one of a plurality of the LED dies in the proximity of the divergent LED die with an emission color identical to that of the divergent LED die, and N is a count of the LED dies in the proximity of the divergent LED die with the emission color.

In a sixth embodiment, the present invention provides a light-emitting element device, which includes: a carrier (for example, the first or second-stage carrier) including a circuit; and a plurality of LED dies placed on the carrier and electrically coupled to the circuit for controlling light emission of the plurality of LED dies; wherein the LED dies are divided into a plurality of LED groups respectively assigned to a plurality of two-dimension square matrices identical in matrix dimension, and more than 60% of the square matrices are divergent. Each divergent matrix has a difference between a maximum value and a minimum value of a category for the LED dies with the same emission color therein, which is greater than 50% of a difference between a maximum value and a minimum value of the category for the LED dies with the same emission color in the carrier.

In a seventh embodiment, the present invention provides a light-emitting element device, which includes: a carrier including a circuit; a plurality of LED dies placed on the carrier and electrically coupled to the circuit for controlling light emission of the plurality of LED dies; wherein more than 60% of the plurality of LED dies are divergent; wherein a divergent LED die has a divergent index greater than a reference value and wherein the divergent index is calculated by a ratio of a sum of |CS−CC| to N, wherein the sum of |CS−CC| is derived by adding all absolute values of a difference between a value of a category (CC) of the divergent LED die and a value of the category (CS) of one of a plurality of the LED dies in the proximity of the divergent LED die, N is a count of the LED dies in the proximity of the divergent LED die.

In an eighth embodiment, the present invention provides a method of processing light-emitting elements, which includes: providing a plurality of carriers; selecting one of the plurality of carriers; picking at least one LED group from a first wafer with a first emission color to a substrate, and picking the adjacent LED dies from the LED group on the substrate, to be sequentially placed on one of the selected carriers; picking at least one LED group from a second wafer with a second emission color, and picking the LED dies from the LED group of the second wafer, to be sequentially placed on the selected carriers, wherein each of the LED dies of the second emission color is adjacent to each of the LED dies of the first emission color on the selected carriers; and when all of the carriers are fully arranged with the LED dies, placing the carriers on a light-emitting element device according to a predetermined pattern, wherein the predetermined pattern arranges one carrier and a next carrier based on a sequence of placing the LED dies on the carriers, to be placed on two non-adjacent positions on the light-emitting element device.

In a ninth embodiment, the present invention provides a method of processing light-emitting elements, which includes: providing a plurality of carriers; picking at least one LED group from a first wafer with a first emission color to a substrate, and sequentially picking the adjacent LED dies from the substrate, to be separately placed on different ones of the carriers; picking at least one LED group from a second wafer with a second emission color to another substrate, and sequentially picking the LED dies from the another substrate, to be separately placed on the different ones of the carriers, wherein the LED dies of the second emission color are respectively adjacent to the LED dies of the first emission color on the carriers; and when all of the carriers are fully arranged with the LED dies, placing the carriers on a light-emitting element device according to a predetermined pattern, wherein the predetermined pattern arranges one carrier and a next carrier based on a sequence of transferring the LED dies from the wafers on the carriers, to be placed on two non-adjacent positions on the light-emitting element device.

In a tenth embodiment, the present invention provides a method of processing light-emitting elements, which includes: providing a plurality of carriers; picking a first LED group and a second LED group from a first wafer with a first emission color to a substrate, and picking the LED dies respectively from the first and second LED groups from the substrate, to be separately placed on different ones of the carriers, wherein a percentage of the LED dies from the first and second LED groups are placed on at least same one of the carriers; picking a third LED group from a second wafer with a second emission color to another substrate, and picking the LED dies from the another substrate, to be separately placed on different ones of the carriers, wherein the LED dies of the second emission color are respectively adjacent to the LED dies of the first emission color on the carriers; and when all of the carriers are fully arranged with the LED dies, placing the plurality of carriers on a light-emitting element device according to a predetermined pattern, wherein the predetermined pattern arranges one carrier and a next carrier based on a sequence of transferring the LED dies from the wafers on the carriers, to be placed on two non-adjacent positions on the light-emitting element device.

In an eleventh embodiment, the present invention provides a method of processing light-emitting elements, which includes: assigning a first category to a plurality of LED dies on two first-color wafers with a first emission color, and assigning a second category to a plurality of LED dies on two second-color wafers with a second emission color; picking two LED groups of the first category respectively from the two first-color wafers; sequentially placing the two LED groups of the first category, to be respectively on two first-color carriers, (or, sequentially picking the LED dies from one LED group of the first category, sequentially placing the LED dies of the one LED group of the first category on a plurality of first-color carriers, sequentially picking the LED dies from the other LED group of the first category, and sequentially placing the LED dies of the other LED group of the first category on the plurality of first-color carriers); picking two LED groups of the second category respectively from the two second-color wafers; sequentially placing the two LED groups of the second category, to be separately on two second-color carriers (or, sequentially picking the LED dies from one LED group of the second category, sequentially placing the LED dies of the one LED group of the second category on the two second-color carriers, sequentially picking the LED dies from the other LED group of the second category, and sequentially placing the LED dies of the other LED group of the second category on the second-color carriers); sequentially picking the LED dies in a plurality of groups from the first-color and second-color carriers, to be respectively placed on a plurality of pixel carriers, wherein each of the groups includes two LED dies of the first and second categories, and the LED dies of the second category are respectively adjacent to the LED dies of the first category on the pixel carriers; when all of the pixel carriers are fully arranged with the LED dies, placing the pixel carriers on a light-emitting element device according to a predetermined pattern, wherein the predetermined pattern arranges one pixel carrier and a next pixel carrier based on a sequence of placing the LED dies on the pixel carriers, to be placed on two non-adjacent positions on the light-emitting element device.

BRIEF DESCRIPTION OF THE DRAWINGS

FIGS. 36-1 to 36-11 are schematic diagrams showing options of a unit-mapping table according to the present invention.

FIGS. 37 to 37-2 are schematic diagrams showing two flow charts of mixing the LED dies based on a unit-mapping table according to two embodiments of according to the present invention.

FIGS. 38 to 39-4 are schematic diagrams showing LED dies quantity distribution according to the present invention.

FIGS. 39-5 to 39-7 are schematic diagrams showing LED dies quantity distribution according to prior art.

FIGS. 45 to 46-1 are schematic diagrams showing options of category combinations according to the present invention.

DESCRIPTION OF THE PREFERRED EMBODIMENTS

The objectives, technical details, features, and effects of the present invention will be better understood with regard to the detailed description of the embodiments below, with reference to the drawings.

The present invention provides a method of processing light-emitting elements with multiple mixing stages. In the specification, the wording "LED die" means one example of the light-emitting elements from wafers. When the embodiments are applied to LD dies, the "LED die" in the embodiment descriptions can be understood to be modified by "LD dies". Similarly, the wording "LED group" can be understood to be modified by "LD group" when the embodiments are applied to LD dies; the "LED unit" can be understood to be modified by "LD unit" when the embodiments are applied to LD dies, and the same as other wordings with "LED" in the specification. Besides, the wording "first-stage carrier" means a substrate, a carrier, or a container for accommodating the LED dies from wafers, the wording "second-stage carrier" means a next substrate, a next carrier, or a next container for placing the mixed LED dies picked from the first-stage carrier, the wording "first predetermined pattern" means a disposition pattern of transferring the LED dies picked from the substrates (or, wafers) to the first-stage carrier, the wording "second predetermined pattern" means a disposition pattern of transferring the LED dies picked from the first-stage carrier to the second-stage carrier, the wording "LED supply carrier" means a kind of delivery kit with the LED dies which are supplied to an user as an LED die component delivery kit, the wordings "first direction" and "second direction" are referred to two reference directions for assisting in explaining the mixing processes of the LED dies, the wording "LED group" means a set of selected LED dies arranged on a wafer, a substrate or a carrier, and the wording "light-emitting element device" is a kind of device, such as display, and so on. The substrate, carrier and container above can be a blue tape, a glass fiber substrate, a BT resin (Bismaleimide Triazine Resin) substrate, an epoxy substrate, a phenolic resin substrate, or a PCB substrate. In the present invention, the materials of the substrate, the first-stage carrier, and the second-stage carrier can be but not limited to the same. The user can decide the material according to requirements.

In the present invention, an LED die transfer process between different conveyance elements (e.g. carrier, module, and substrate) can be performed by a transfer tool. The transfer tool can optionally have picking members for picking up the LED dies, a laser for improving or forming an adhesive layer, and the aforementioned carrier for accommodating the LED dies. Besides, the transfer tool can further have a tip, a clip, a robotic conveyance apparatus, a needle ejector, or a wafer table to move the wafer.

First Embodiment

Figure 1:
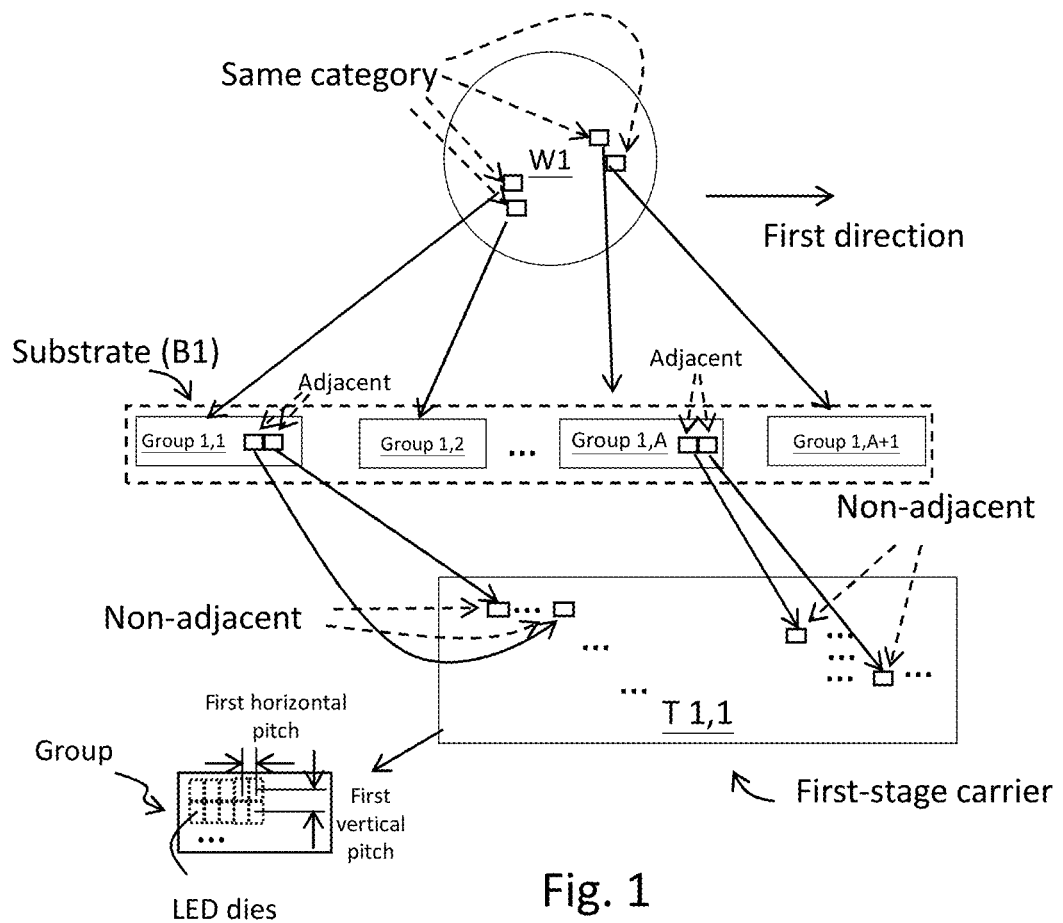
FIGS. 1-3 are operational schematic diagrams showing a method of processing light-emitting elements according to a first embodiment of the present invention.
Figure 2:
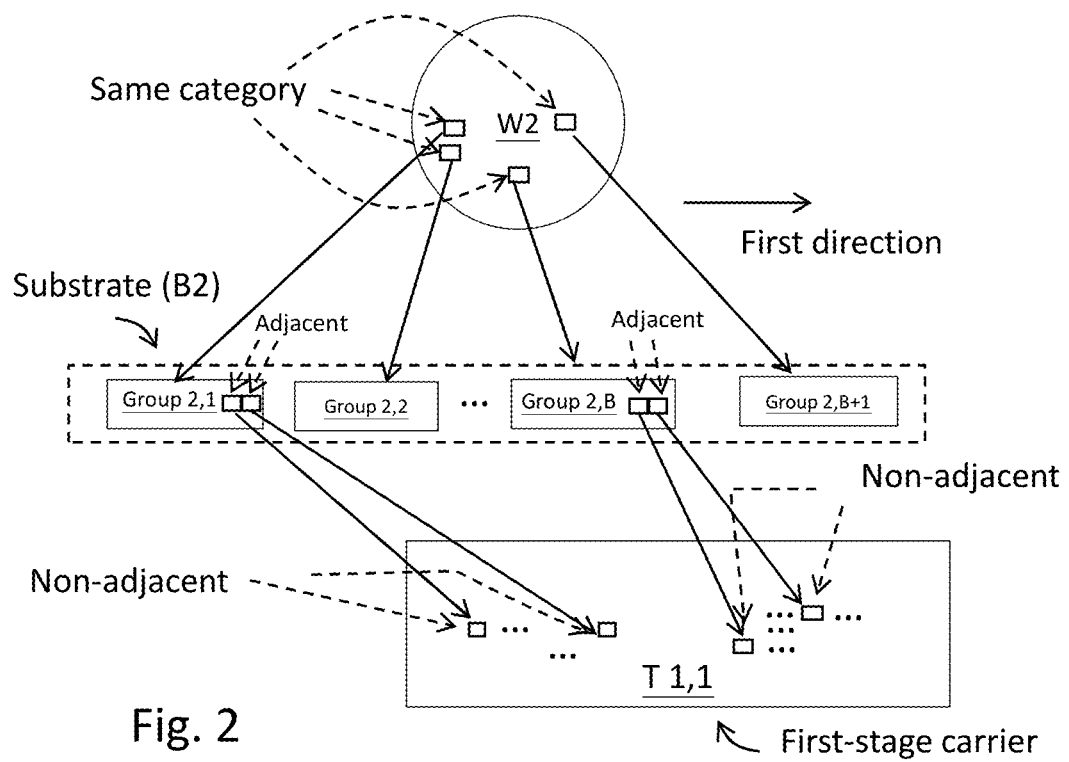
Figure 3:
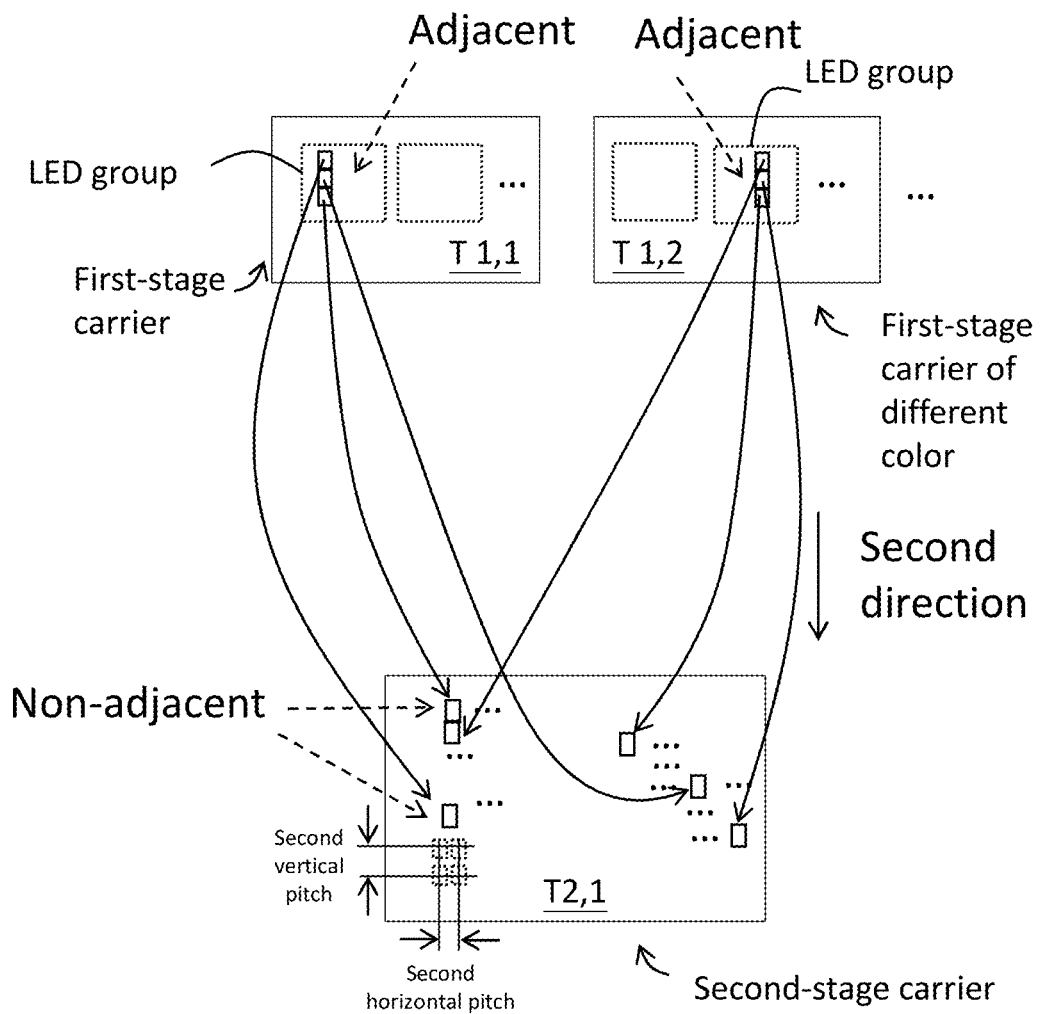

With reference to FIGS. 1, 2, and 3, the present invention provides a method of processing LED dies involved with picking LED groups from wafers and two LED mixing dies stages. The method includes: assigning one of a plurality of categories to each of a plurality of LED groups on at least one wafer, each LED group comprising a plurality of LED dies on one of the at least one wafer of the same emission color (for example, wafer W1 in FIG. 1, and wafer W2 in FIG. 2, belong to the same emission color), wherein the LED dies in each LED group belong to the same category; transferring the LED groups of the same category from each of the at least one wafer to a substrate (for example, LED groups (1,1), (1,2), (1,A), and (1, A+1)), transferring the LED groups (1,1), (1,2), (1,A), and (1, A+1) of the same category from the wafer to an identical substrate); transferring a plurality of LED groups (each LED group includes a plurality of LED dies) from more than one substrates (for example, different substrates in FIGS. 1 and 2) to the same first-stage carriers (for example, T1,1) based on a first predetermined pattern (in FIGS. 1 and 2, the first predetermined pattern arranges two adjacent LED groups in a first direction on each of the substrates B1 and B2 are placed on two non-adjacent positions in the first direction (may be different from what FIG. 1 shows) on one of a plurality of first-stage carriers (T1,1)); and transferring the LED dies from the plurality of first-stage carriers (the LED dies on the two first-stage carriers T1,1 may belong to two different emission colors, or the same emission color) to a second-stage carrier (in FIG. 3, one second-stage carrier T2,1 shown as one example of the second-stage carrier) based on a second predetermined pattern. In FIGS. 1, 2, the LED dies on each first-stage carrier (T1,1) a count of LED dies on each LED group may be decided according to functional need. For example, each LED group includes more than 50, 100, 500, or 1000 LED dies, which depend on the group design of the transfer tool. The groups are picked from predetermined regions on a wafer, and the optical properties of the LED dies in the groups are similar. The optical property can be emission wavelength, luminous intensity level, or chromaticity scale. In an embodiment, the LED dies from substrates can be classified by the same category (or, in one embodiment, assigning the LED groups on the wafer to a plurality of categories by identifying emission wavelengths, luminous intensity levels, and chromaticity scales of LED dies on the wafer), and the LED dies of the same category from different LED wafers are arranged on the same substrates. The substrate can be a temporary substrate, such as a blue tape, a glass substrate, or other substrates. The groups 1,1 and 1,2 can be classified as the same category. The groups 2,1 and group 2,2 can be also classified as the same category. That is, the groups transferred from the wafers W1 and W2 to the same carrier T1,1, belong to the same category.

However, the groups from different substrates to the identical first-stage carrier, are not limited to the same category. In one embodiment, the groups on the substrates B1 and B2 can belong to different categories. That is, the LED dies of the same emission color on the first-stage carrier, can belong to only one category, or different categories.

In the case of the LED dies on the first-stage carrier belonging to different categories, the steps of the method of processing LED dies according to the present invention, include: assigning a plurality of categories to a plurality of LED groups on each of at least one wafer; transferring the LED groups of the same category from each of the at least one wafer to a substrate; transferring the LED dies from the substrates of at least one category of emission color to a first-stage carrier based on a first predetermined pattern (for mixing the LED dies of the same emission color; or mixing and pitching the LED dies of the same emission color); and transferring the LED dies from the first-stage carriers of at least one emission color to a second-stage carrier based on a second predetermined pattern (for mixing the LED dies of different emission colors, or mixing and pitching the LED dies of different emission colors). The first predetermined pattern arranges two adjacent LED dies in a first direction on the substrate, to be placed on two non-adjacent positions in the first direction on the first-stage carrier.

In one embodiment, the first predetermined pattern can include a LED mixing function (mixing LED dies of a same emission color), or a LED pitching and mixing function (pitching and mixing LED dies of a same emission color). The second predetermined pattern can include another mixing function (mixing LED dies of different emission colors), or another LED pitching and mixing function (pitching and mixing LED dies of different emission colors). These functions are detailed in later description.

In FIG. 3, the LED dies on each second-stage carrier, have a second horizontal pitch and a second vertical pitch. The second horizontal pitch is equal to or greater than the first horizontal pitch, or the second vertical pitch is equal to or greater than the first vertical pitch. The first and second horizontal pitches and the first and second vertical pitches are distances measured between two reference centers of two adjacent LED dies on the same surface in horizontal and vertical directions, or distances measured between two corresponding edges of two adjacent LED dies in horizontal and vertical directions. The reference centers of the adjacent LED dies may be centroids of the LED dies, or centroids of active regions in the LED dies, wherein the user can decide the location of the reference center according to an implementation requirement.

In FIGS. 1, 2, and 3, the first direction is shown as a horizontal direction, and the second direction is shown as a vertical direction, wherein the directions shown in figures are for illustrative purpose but not to limit the practical implementation of the present invention. In this embodiment, the first direction and the second direction form a right angle. However, the directions of the first and second directions shown in FIGS. 1, 2, and 3 are given as one example. If necessary, the directions of the first and second directions may be the same. For example, both of the first and second directions may be both horizontal, vertical, or other directions. The details of the directions are elaborated in subsequent embodiments.

Please refer to FIG. 3, the second predetermined pattern arranges two adjacent LED dies in the second direction on the first-stage carriers, to be placed on two non-adjacent positions in the second direction on a corresponding second-stage carrier (for example, T2,1).

In one embodiment, a count of wafers for processing LED dies may be decided according to functional need. For example, the count of wafers includes at least 2, 3, 4, or 5 wafers. Usually, the count of wafers can be decided according to the diversity requirement of the LED dies on the carriers. For example, more wafers of the LED dies can provide more choices of emission wavelengths, luminous intensity levels, or chromaticity scales, and higher divergent distribution due to the diversity of the LED dies on the carriers. The emission wavelength can be a peak wavelength or a dominant wavelength.

Figure 4:
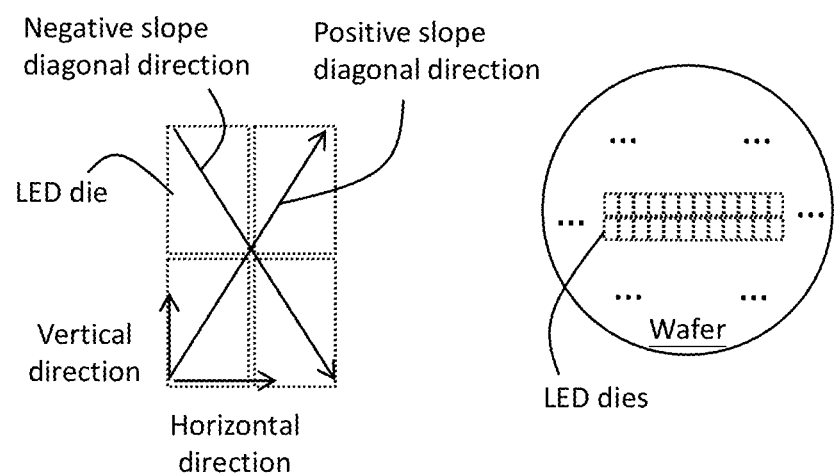
FIGS. 4-5 are operational schematic diagrams showing options of directions from and to which LED dies are picked and placed according to the present invention.
Figure 5:
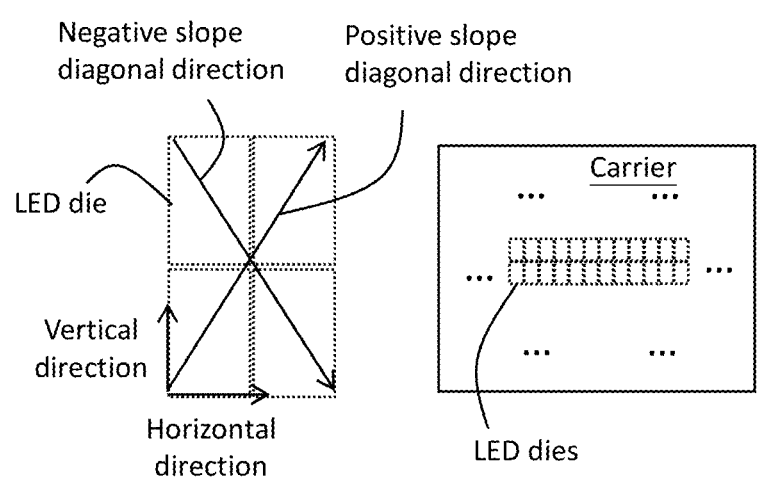

Please refer to FIGS. 4 and 5, wherein a horizontal direction, a vertical direction, a positive slope diagonal direction, and a negative slope diagonal direction with reference to the disposition of the LED dies on the wafer, substrate, or carrier are shown therein. For example, the positive and negative slope diagonal directions are referred to two directions in which the LED dies are aligned diagonally. Further, the horizontal direction and the vertical direction are referred to the directions in which the LED dies are aligned horizontally and vertically on the wafer, substrate, or carrier. In one embodiment, each of the first direction and the second direction is selectively aligned in one of the horizontal direction, the vertical direction, the positive slope diagonal direction, and the negative slope diagonal direction. In one example, the first and second directions may be respectively the positive slope diagonal direction, and the negative slope diagonal direction. Alternatively, in one example, the first and second directions may be respectively the positive slope diagonal direction, and the horizontal direction.

In one embodiment, the first direction (or the second direction) may be not limited to one of the directions shown in figures, but a combination of two of the directions which are not parallel to each other. Or, the first direction (or the second direction) is selectively aligned in at least one of the horizontal direction, the vertical direction, the positive slope diagonal direction, and the negative slope diagonal direction. For example, the first direction and the second direction) may be a combination of the horizontal direction and the vertical direction, the positive slope diagonal direction and the negative slope diagonal direction, or the like. For example, there is an angle between the first and second directions.

In one embodiment, the first direction and the second direction form a right angle; for example, the first direction and the second direction are respectively the horizontal direction and the vertical direction; or the first direction and the second direction are respectively the positive and negative slope diagonal directions. In one embodiment, the first direction and the second direction are the same ones. For example, the first direction and the second direction are both aligned in the horizontal direction; or, in the first direction and the second direction are both aligned in the vertical direction.

Figure 6:
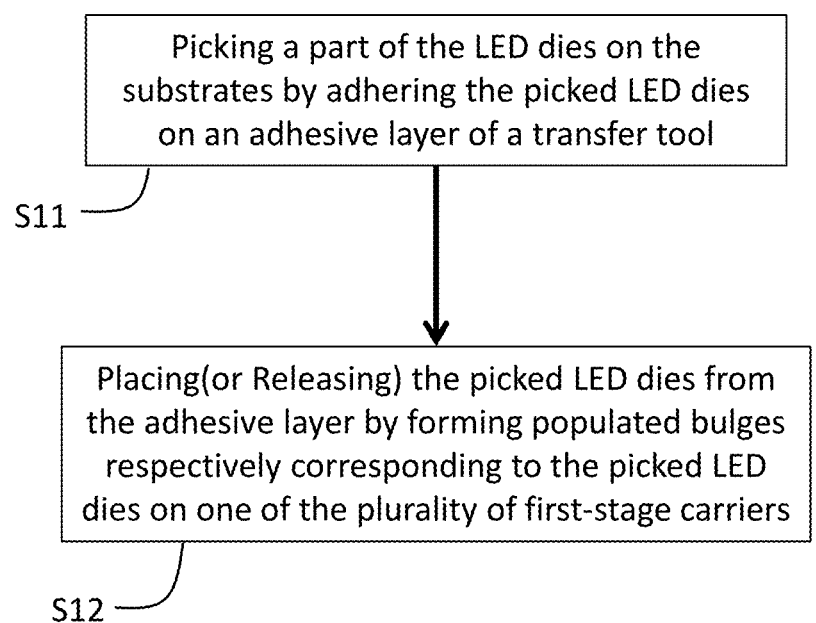
FIG. 6 is a flow diagram showing a transfer printing process according to the present invention.

In the first embodiment, the plurality of LED groups may be placed on each first-stage carrier by a transfer printing process. With reference to FIG. 6, the transfer printing process includes: picking a part of the LED dies on the substrates by adhering the picked LED dies on an adhesive layer of a transfer tool (S11); and placing (or, releasing) the picked LED dies from the adhesive layer by forming populated bulges respectively corresponding to the picked LED dies on one of the first-stage carriers (S12).

Figure 7:
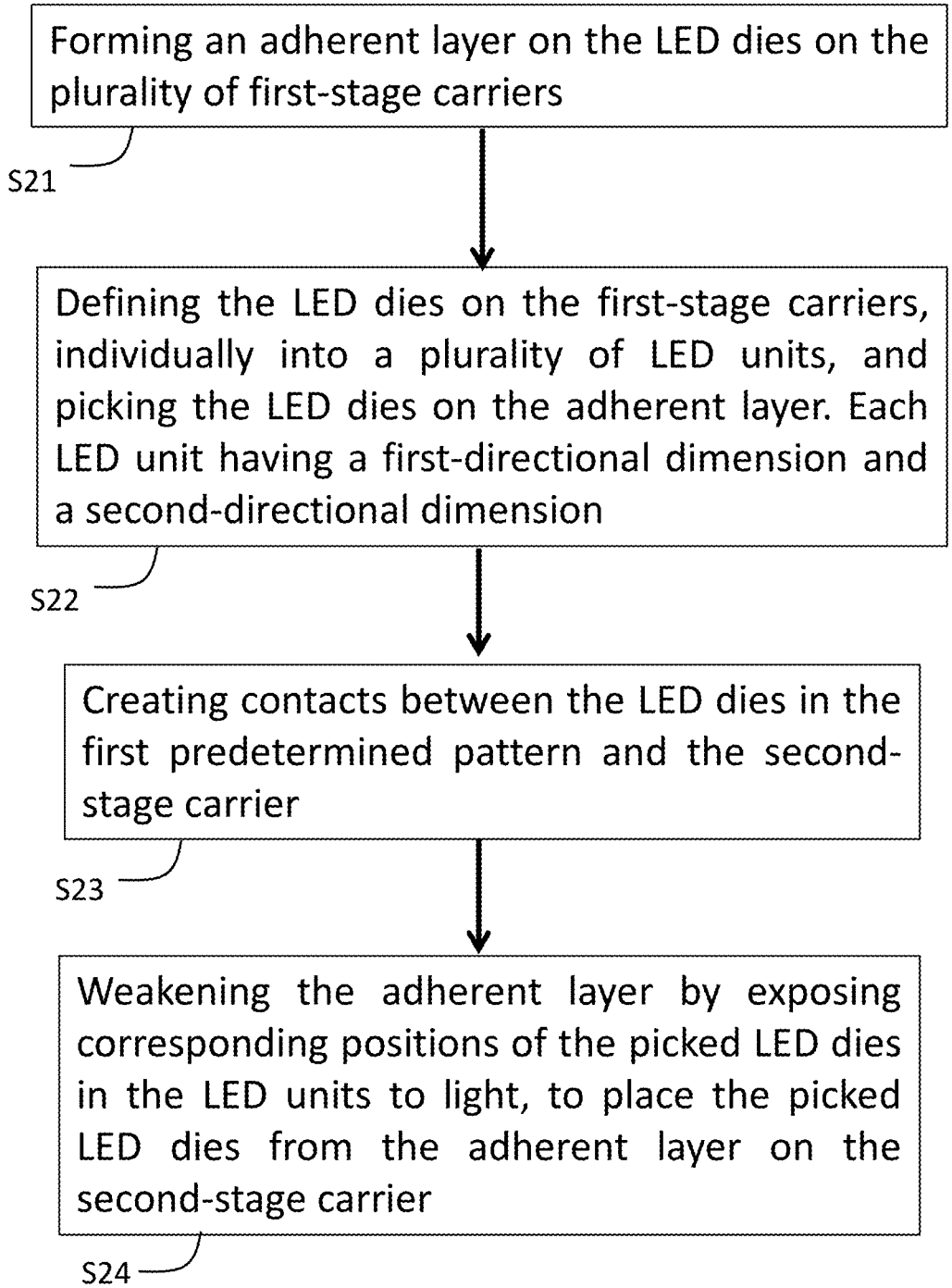
FIG. 7 is a flow diagram showing an embodiment of a direct release layer process according to the present invention.

In one embodiment, the LED dies from the plurality of first-stage carriers are placed on each second-stage carrier by a direct release layer process. Please refer to FIG. 7, in one embodiment, the process includes: forming an adherent layer on the LED dies on the plurality of first-stage carriers (S21); defining the LED dies on the first-stage carriers individually into a plurality of LED units, and picking the LED dies on the adherent layer from the first-stage carriers, with each LED unit having a first-directional dimension and a second-directional dimension (S22), wherein the first-directional dimension corresponds to the second horizontal pitch, and the second-directional dimension corresponds to the second vertical pitch; creating contacts between the LED dies in the first predetermined pattern and the second-stage carrier (S23); and weakening the adherent layer, by exposing corresponding positions of the picked LED dies in the LED units to light, to place the picked LED dies from the adherent layer on the second-stage carrier (S24).

In FIG. 3, the second predetermined pattern may arrange two adjacent LED dies in the second direction on each first-stage carrier (T1,1 and T1,2) to be placed on two non-adjacent positions in the second direction on a corresponding second-stage carrier (T2,1) of the second-stage carrier. However, the second predetermined pattern is not limited to the embodiment shown in FIG. 3.

Figure 8:
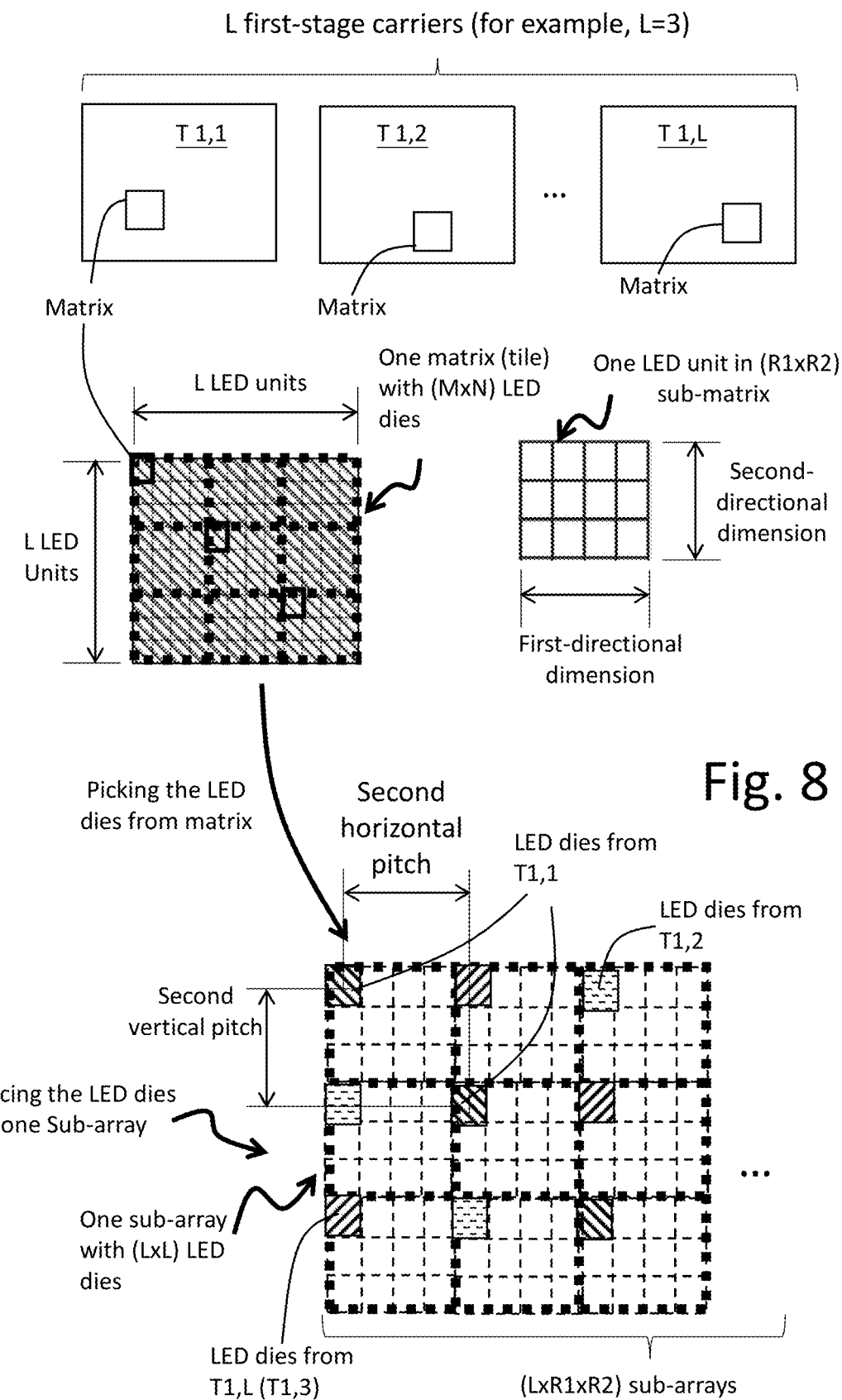
FIGS. 8 to 23 are operational schematic diagrams showing an embodiment of a changing LED die pitch and mixing process according to the present invention.

Examples associated with the first predetermined pattern, the second predetermined pattern, and an LED dies transferring step between them are given as follows. With reference to FIG. 8, a die-transferring process is shown to allocate the LED dies arranged on each of the first-stage carriers (T1,1, T1,2, . . . T1,L) according to the first predetermined pattern, which is represented by an intermediate two-dimensional array, for placing the LED dies to the second-stage carrier according to the second predetermined pattern taking the form of multiple two-dimensional sub-arrays each of which is shown at the bottom of FIG. 8. Each of the two-dimensional sub-arrays is a part sequentially arranged in the second predetermined pattern and has the LED dies therein allocated from the first-stage carriers. The second predetermined pattern includes a picking pattern and a placing pattern, the picking pattern arranging the LED dies therein in the form of the two-dimensional (M×N) matrix of the LED dies. The two-dimensional (M×N) matrix can be divided into the (L×L) LED units. In FIG. 8, M=L×R1, N=L×R2. Each of the LED units is arranged in a form of the two-dimensional (R1×R2) sub-matrix of the LED dies. The placing pattern arranges a form of an array of the LED dies on the second-stage carrier, which is divided into (L×R1×R2) two-dimensional (L×L) sub-arrays of the placed LED dies for arranging the LED dies from the first-stage carrier. In the embodiment of FIG. 8, the number of the sub-arrays is the product of L(=3), R1(=4), and R2(=3), and the product (L×R1×R2) is equal to 36. Importantly, the integers R1 and R2 are decided according to the second horizontal and vertical pitches. The integers R1 and R2 can be independent from the integer L. In one embodiment, a plurality of the units are grouped into a tile (matrix); each tile contains m×L number of the units; and m is an integer larger than 2.

To depict the die-transferring process, horizontal and vertical pitch ratios between the second predetermined pattern and the first predetermined pattern and corresponding layouts of the LED dies in the first predetermined pattern and the second predetermined pattern are elaborated next. In the first predetermined pattern, the first horizontal pitch and the first vertical pitch are defined between centers on the same surface of adjacent two of the LED dies in the first predetermined pattern in the horizontal and vertical directions respectively in analogy to the adjacent LED dies shown in FIG. 1. In the second predetermined pattern, the second horizontal pitch and the second vertical pitch are defined between centers of adjacent two of the LED dies in the second predetermined pattern in the horizontal and vertical direction respectively. The reference centers of the adjacent LED dies may be centroids of the LED dies, or centroids of active regions in the LED dies, wherein the user can decide the location of the reference center according to an implementation requirement. Supposing that a horizontal pitch ratio of the second horizontal pitch to the first horizontal pitch is defined to be, for example but not limited to, R1 (for example, 4), and a vertical pitch ratio of the second vertical pitch to the first vertical pitch is defined to, for example but not limited to, R2 (for example, 3), configuration of those horizontal and vertical pitch ratios may be fulfilled by corresponding layouts of the LED dies in the first predetermined pattern and the second predetermined pattern as described below. With further reference to FIG. 8, there are L first-stage carriers on top of FIG. 8, in which L is equal to, for example but not limited to, 3. Furthermore, an array with LED dies located at corresponding rows and columns thereof, which is used to represent the first predetermined pattern shown in the middle of FIG. 8, has L (for example, 3) rows and L (for example, 3) columns and is divided into multiple sub-arrays each of which is located at a corresponding first row and a corresponding column, and named as an LED unit. Each LED unit takes the form of a two-dimensional (R1×R2; for example, 4×3) sub-matrix in the matrix of the first predetermined pattern. The matrix representative of the first predetermined pattern has M rows and N columns with the LED dies located at corresponding rows and columns of the matrix where M is equal to L×R1 (for example, 12) and N is equal to L×R2 (for example, 9). On the other hand, the second predetermined pattern takes the form of an array with a plurality of (L×R1×R2; for example, 36) sub-arrays therein, and each sub-array in the second predetermined pattern shown at the bottom of FIG. 8 has L×L (for example, 9) blocks at L (for example, 3) rows and L (for example, 3) columns respectively and L×L (for example, 9) LED dies arranged at positions of the respective blocks specified by corresponding rows and columns of the sub-array. A first-directional dimension of an LED unit, which is a length measurement in the horizontal direction of the LED unit, is set to be equal to the second horizontal pitch, and a second-directional dimension of the LED unit, which is a length measurement in the vertical direction of the LED unit, is set to be equal to the second vertical pitch. Besides, when the top left positions of the respective blocks in the second predetermined pattern are occupied by LED dies, the horizontal pitch ratio of the second horizontal pitch to the first horizontal pitch is equal to R1 and the vertical pitch ratio of the second vertical pitch to the first vertical pitch is equal to R2 accordingly. The consideration that the second horizontal pitch is greater than the first horizontal pitch and the second vertical pitch is greater than the first vertical pitch mainly facilitates fetch of the LED dies in the second-stage carrier for subsequent manufacturing process.

Figure 9:
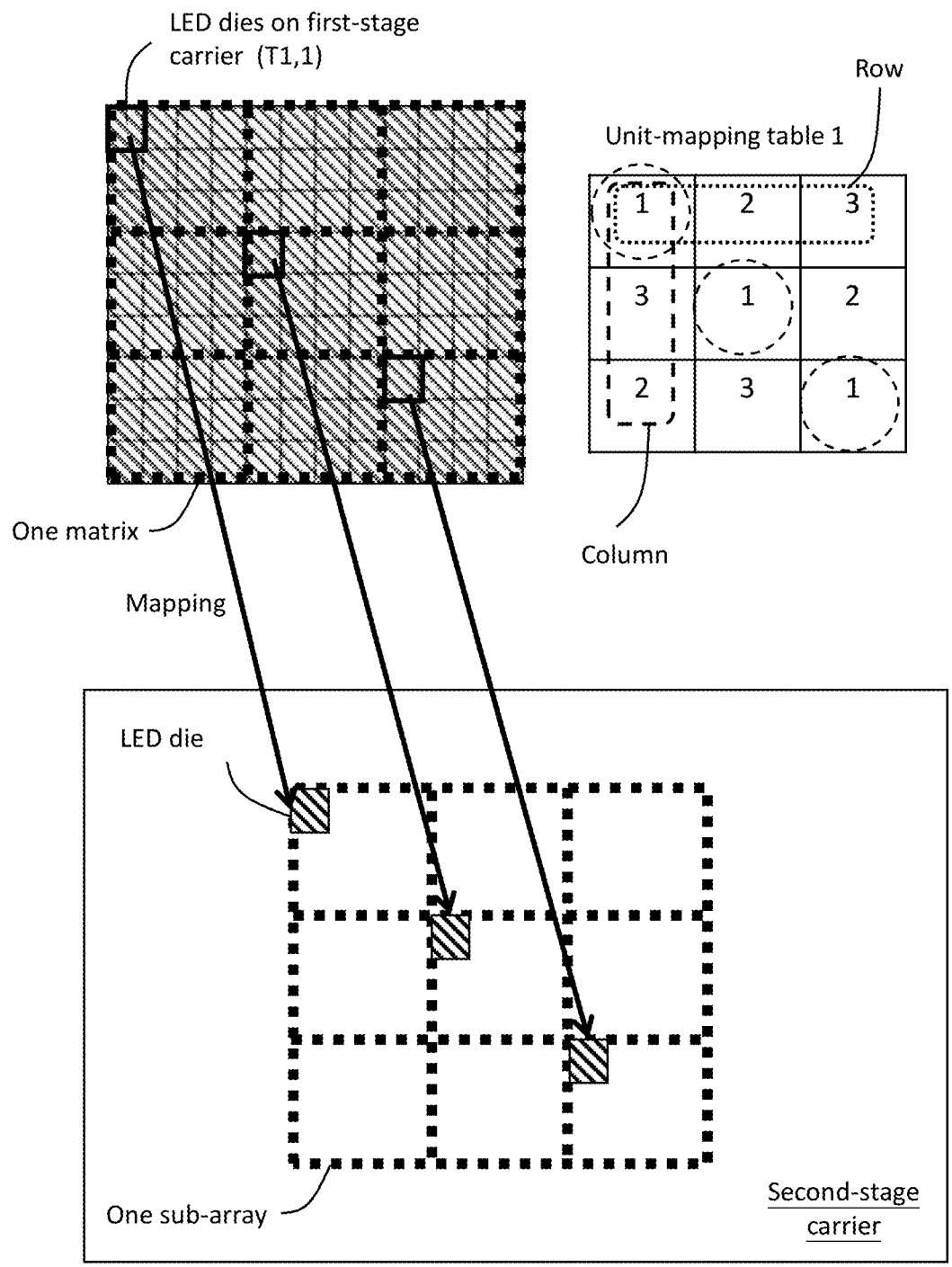

Meanwhile, as the die-transferring process heavily depends on sequences about how to transfer the LED dies from the first-stage carriers to the second-stage carrier, a unit-mapping table and a unit-picking sequence correlating to the die-transferring sequences are introduced here. With reference to FIG. 9, the unit-mapping table on a top right portion contains L or 3 rows and L or 3 columns and a plurality of consecutive integers from 1 to L (for example, 3) arranged at corresponding rows and columns of the unit-mapping table, and the numbers included in each row and the numbers included in each column of the unit-mapping table are not repeated, the column and the row of each number in the unit-mapping table are used to map one of the LED units at the row and column in the matrix of the first predetermined pattern identical to the respective column and row of the number. As implied by itself, the unit-mapping table serves to map or select the LED units in the first predetermined pattern of the first-stage carriers according to distribution of the numbers in the unit-mapping table and transfer the LED dies of the selected LED units to corresponding positions at the second predetermined pattern of the second-stage carrier. Furthermore, the unit-picking sequence serves to keep track of a sequence of the LED units to be selected from a currently selected first-stage carrier, which is initialized with a plurality of numbers from 1 to L (for example, 3) orderly arranged therein. A sequence-shifting scheme is applied to the unit-picking sequence. Upon each shift, the unit-picking sequence is rearranged with a leading number therein trailing to the end and each of the remaining numbers therein moved ahead by one position in the unit-picking sequence. The plurality of numbers correspond to the respective numbers in the unit-mapping table whose rows and columns are mapped to the respective LED units in the matrix of the first predetermined pattern. In other words, the LED units mapped by the numbers in the unit-mapping table are to be selected according to a sequence of the numbers in the unit-picking sequence.

Figure 10:
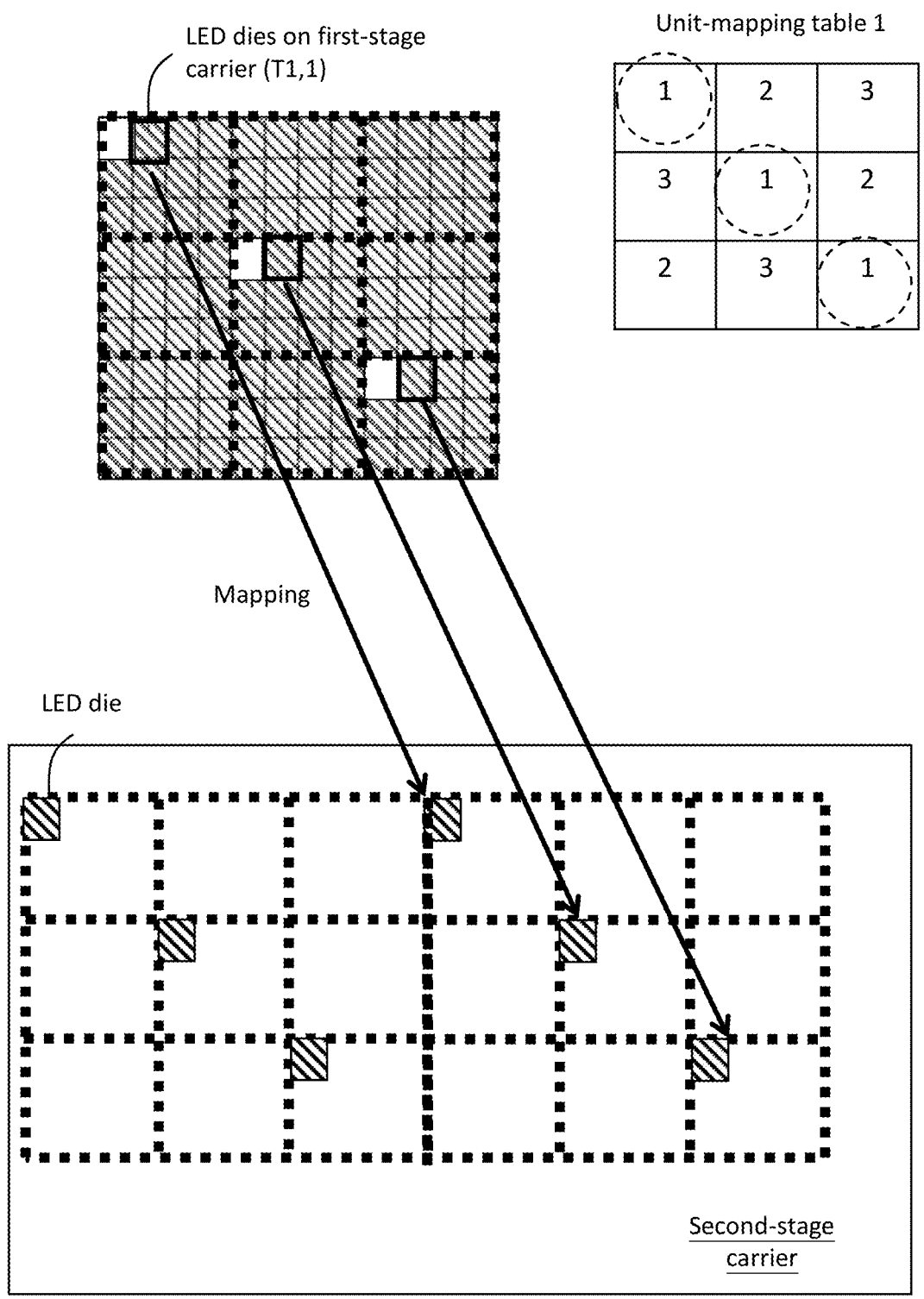
Figure 12:
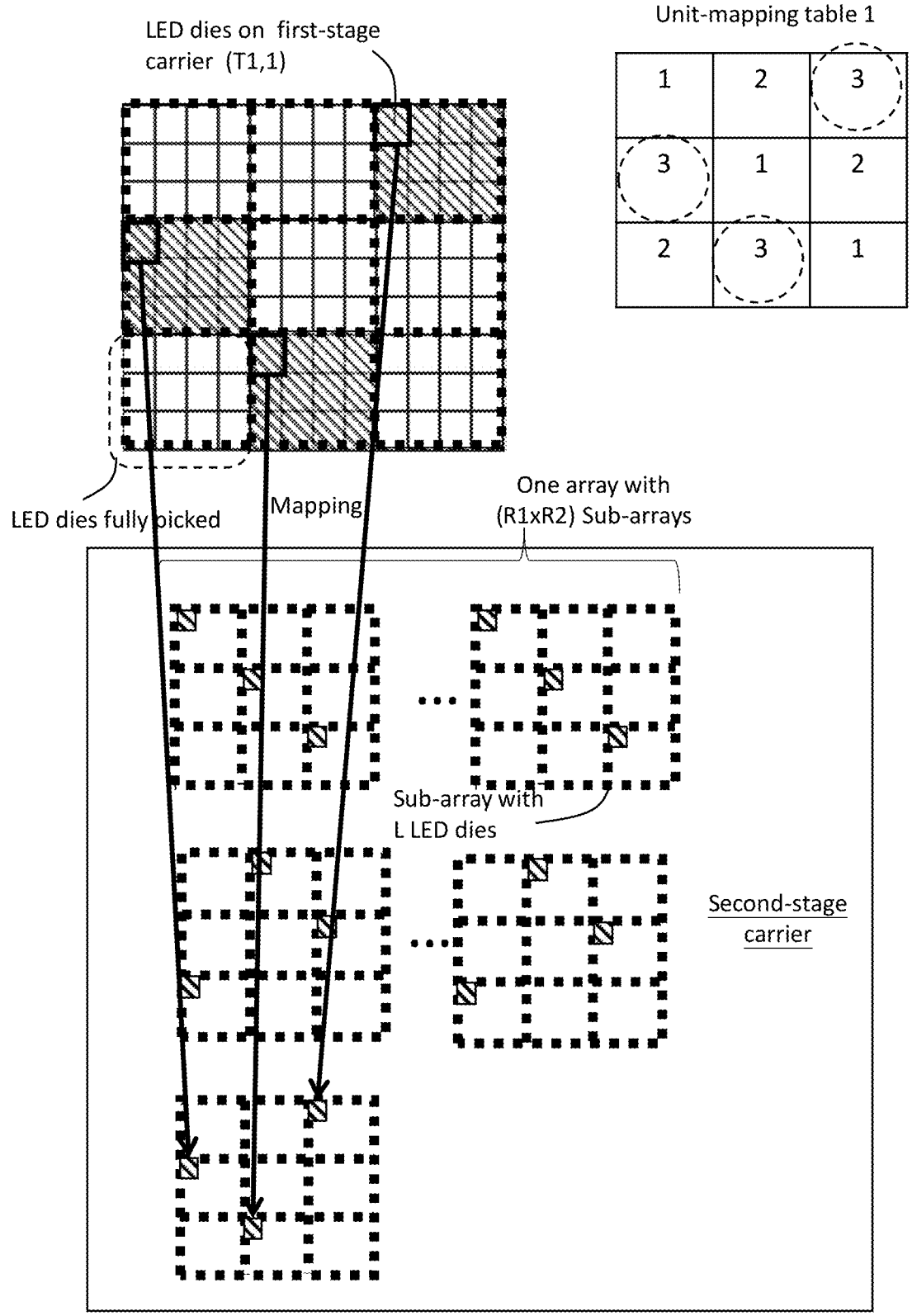
Figure 13:
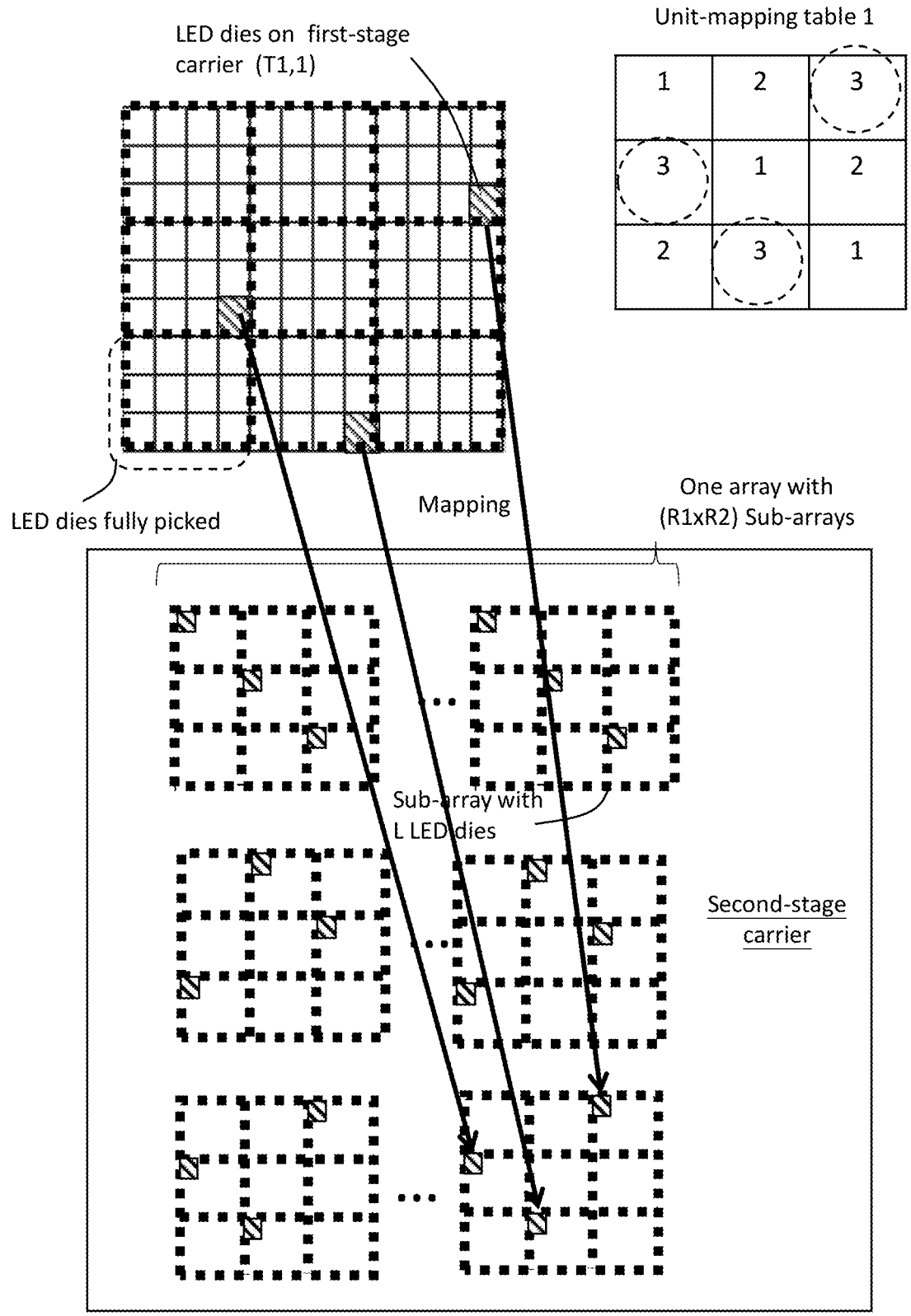
Figure 37:
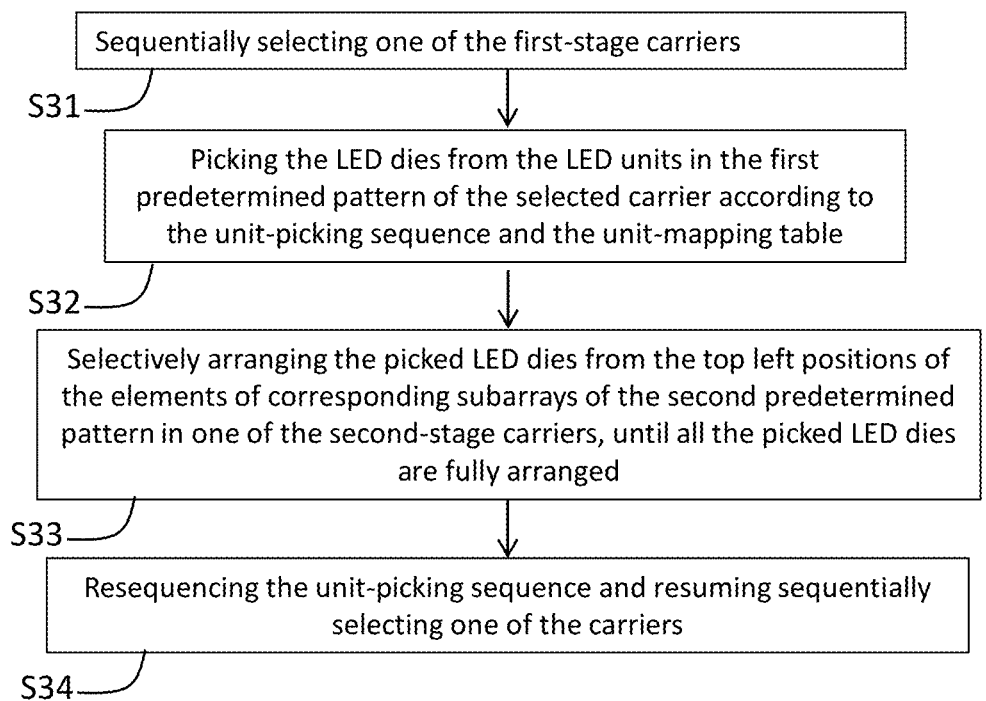
Figures 1, 37:
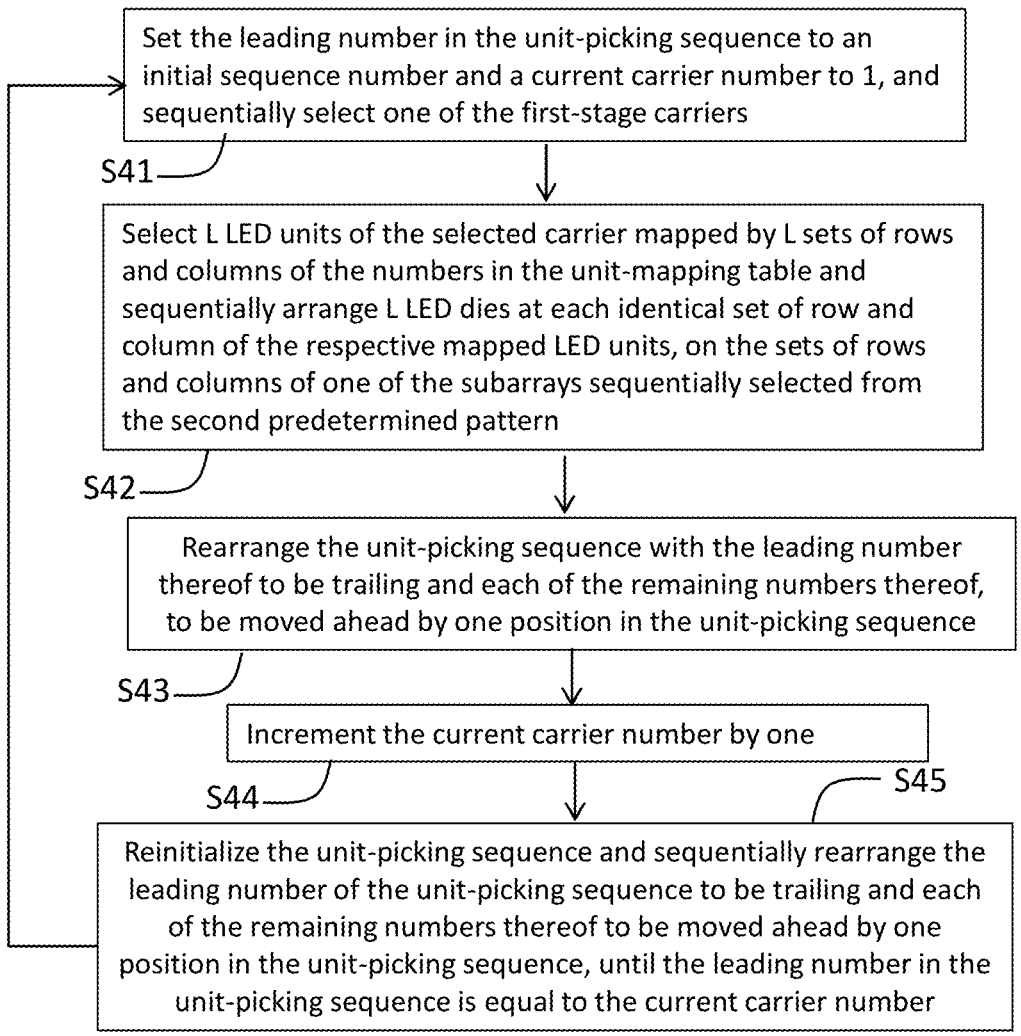
Figures 2, 37:
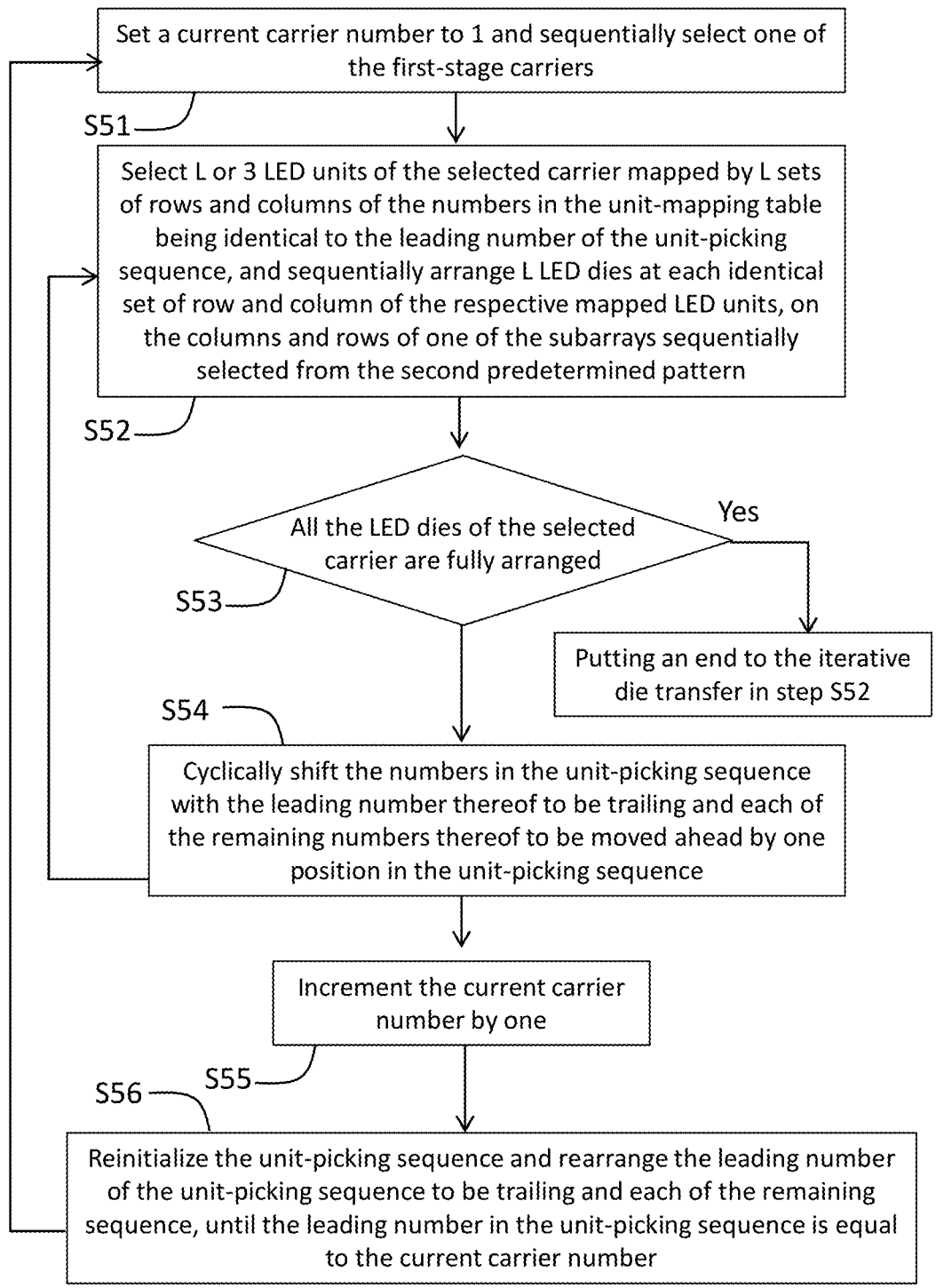

For the second predetermined pattern formed by the die-transferring process shown in FIGS. 9 to 13, 14 to 18, and 19 to 23, FIG. 37 shows another perspective of the die-transferring process. In FIG. 37, the die-transferring process may generally include: sequentially selecting one of the first-stage carriers (S31), for example, the first-stage carrier T(1,1) is selected as shown in FIGS. 9 to 13, the first-stage carrier T(1,2) is selected as shown in FIGS. 14 to 18, and the first-stage carrier (T1,3) is selected as shown in FIGS. 19 to 23; picking the LED dies from the LED units in the first predetermined pattern of the selected first-stage carrier according to the unit-picking sequence and the unit-mapping table (S32), for example, the LED units of the first-stage carrier T(1,1) mapped and selected by the rows and columns of the number 1's in the unit-mapping table identical to the leading number 1 in the unit-picking sequence as shown in FIGS. 9 and 10;

selectively arranging the picked LED dies on the top left positions of the elements of corresponding sub-arrays of the second predetermined pattern in one of the second-stage carrier until all the LED dies on the first-stage carrier are fully arranged (S33), for example, the LED dies of the first-stage carrier T(1,1) picked according to the number in the unit-picking sequence and in the unit-mapping table are arranged on corresponding sub-arrays of the second predetermined pattern as shown in FIGS. 12 and 13; and resequencing the unit-picking sequence and resuming sequentially selecting one of the carriers (S34).

The foregoing steps (S31-S34) only outline general rules about how LED dies in the sub-arrays of the second predetermined pattern are arranged according to the foregoing die-transferring process. The die-transferring process may be implemented by two embodiments. One of the embodiments pertinent to the die-transferring process with reference to FIG. 37-1, includes the following steps:

Step S41: in the unit-picking sequence to an initial sequence number and a current carrier number to 1, and sequentially select one of the first-stage carriers. As shown in FIG. 9, according to a leading number initially in the unit-picking sequence which is equal to 1, the initial sequence number is set to be 1 and the currently selected carrier is T1,1.

Figure 11:
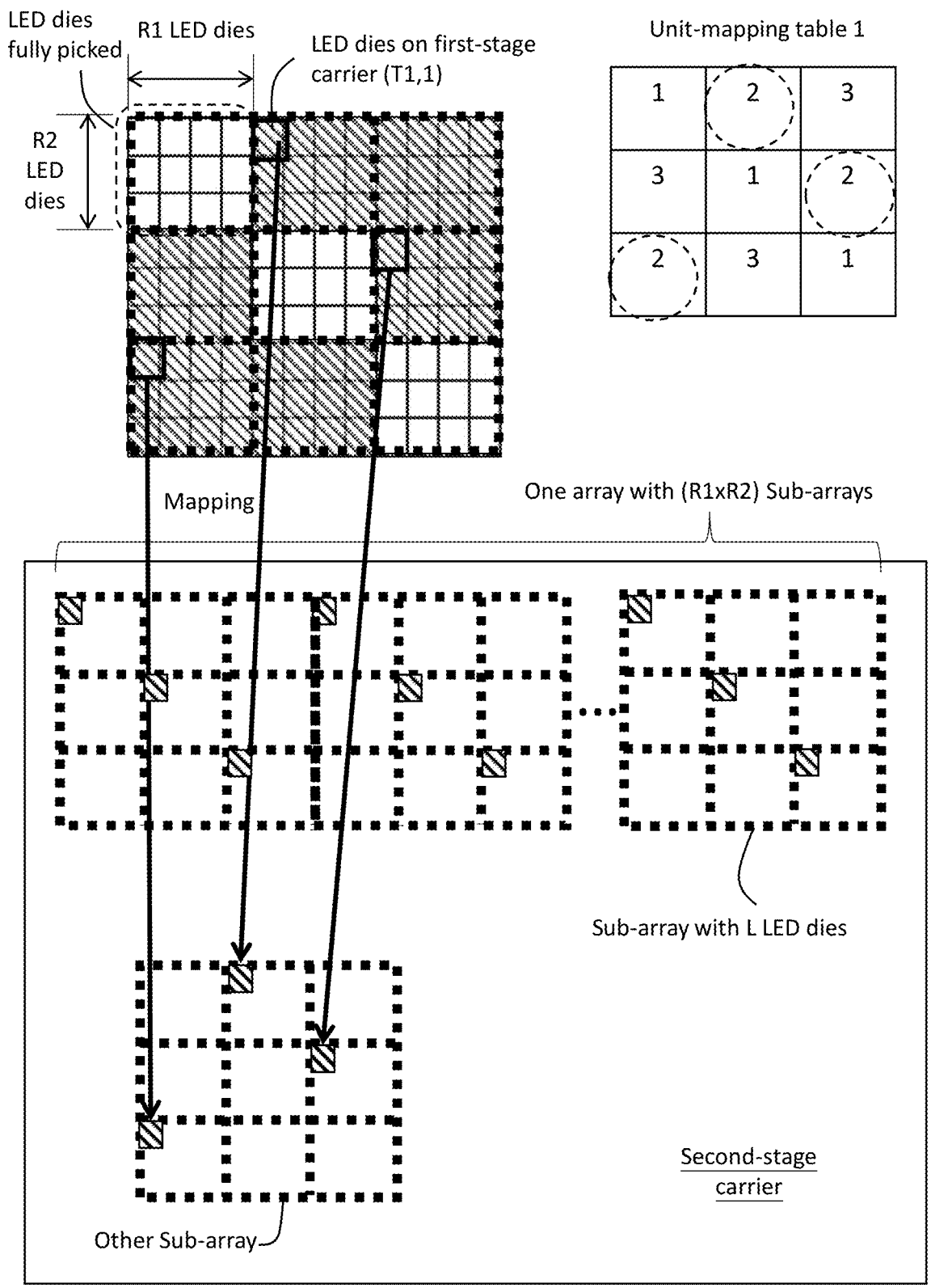

Step S42: Select L LED units of the selected carrier mapped by L sets of rows and columns of the numbers in the unit-mapping table. Sequentially arrange L LED dies in each identical set of row and column of the LED units, on the sets of rows and columns of sub-arrays on the second-stage carrier in a form of the second predetermined pattern, as shown in FIGS. 10-13. On the selected first-stage carrier (T1,1), picking the LED dies corresponding to the first sequence integer in the unit-mapping table and placing the picked pre-mixed LED dies on different sub-arrays on second-stage carriers as shown in FIGS. 9 and 10, until the (R1×R2) LED dies on the LED units corresponding to the leading number (1) in the unit-mapping table are fully picked. Then, assigning a second sequence integer in the unit-mapping table, which is 2 in the unit-mapping table 1 as shown in FIG. 11, for the selected first-stage carrier (T1,1). Next, on the selected carrier (T1,1) of the first-stage carrier, sequentially picking the LED dies corresponding to the second sequence integer in unit-mapping table, and placing the picked pre-mixed LED dies on other sub-arrays on the second-stage carriers until the LED dies in the LED units corresponding to the second sequence integer in the unit-mapping table are fully picked as shown in FIG. 12. The leading number of the unit-picking sequence can take turns corresponding to the L numbers in the unit-mapping table. The sets of rows and columns of the selected sub-array are identical to the L sets of rows and columns of the mapped LED units in the matrix of the first predetermined pattern, while all the LED dies of the mapped LED units are fully arranged. For example, referring to FIGS. 12 and 13, L or 3 corresponding LED units in the matrix of the first predetermined pattern are mapped by the rows and columns of the number 3's in the unit-mapping table corresponding to the leading number 3 in the unit-picking sequence. Then, L or 3 LED dies located at each identical set of row and column of the mapped LED units are sequentially arranged on each one of three R1×R2 (or 12) sub-arrays in the second predetermined pattern of the second-stage carrier until all the LED dies of the mapped LED units are fully arranged on the three sub-arrays sequentially selected from the second predetermined pattern. It is noted that each L or 3 LED dies are arranged on the top left positions of corresponding elements in each sub-array in the second predetermined pattern and the rows and columns of the elements correspond to the sets of rows and columns of the mapped LED units of the first predetermined pattern.

Figure 14:
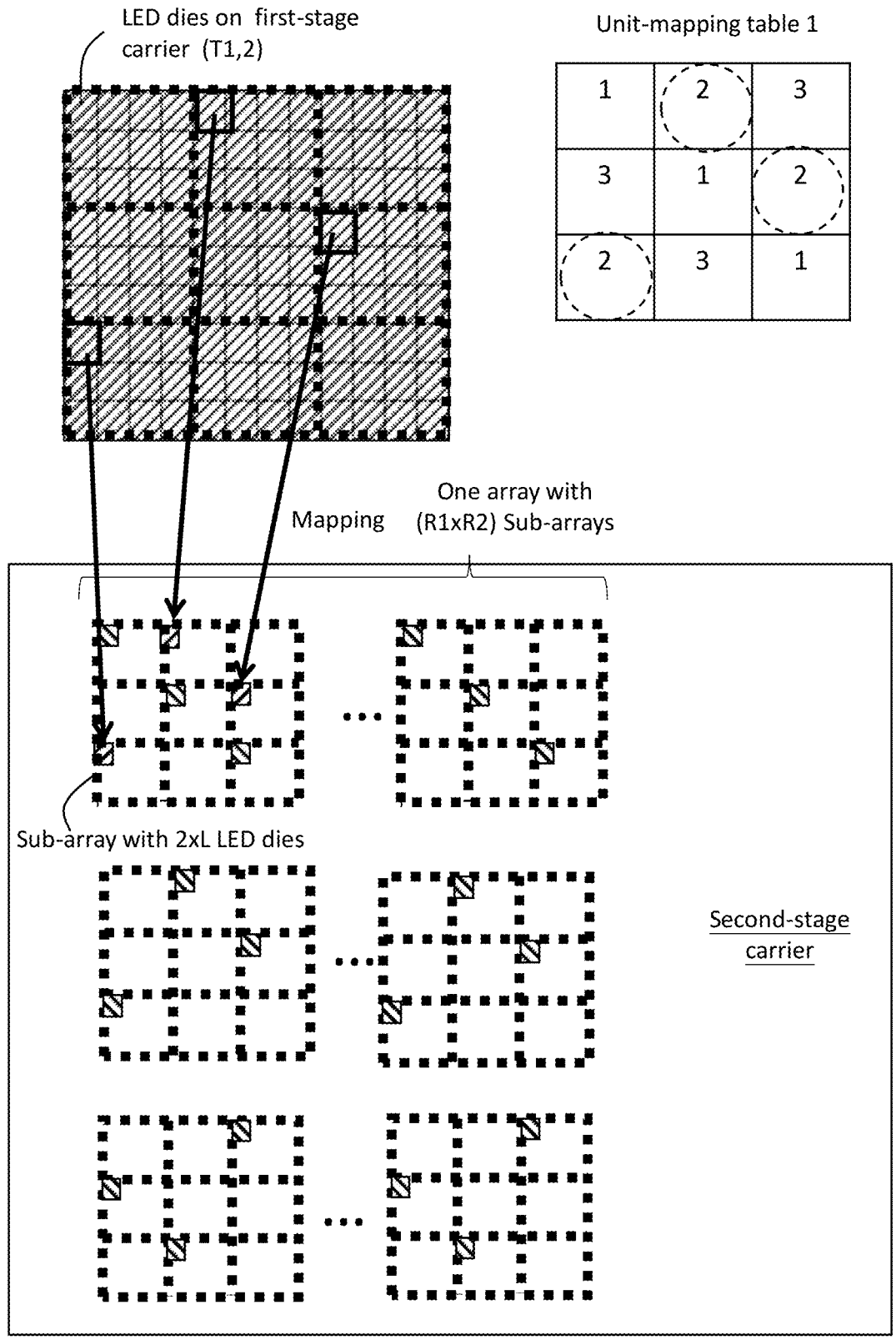
Figure 15:
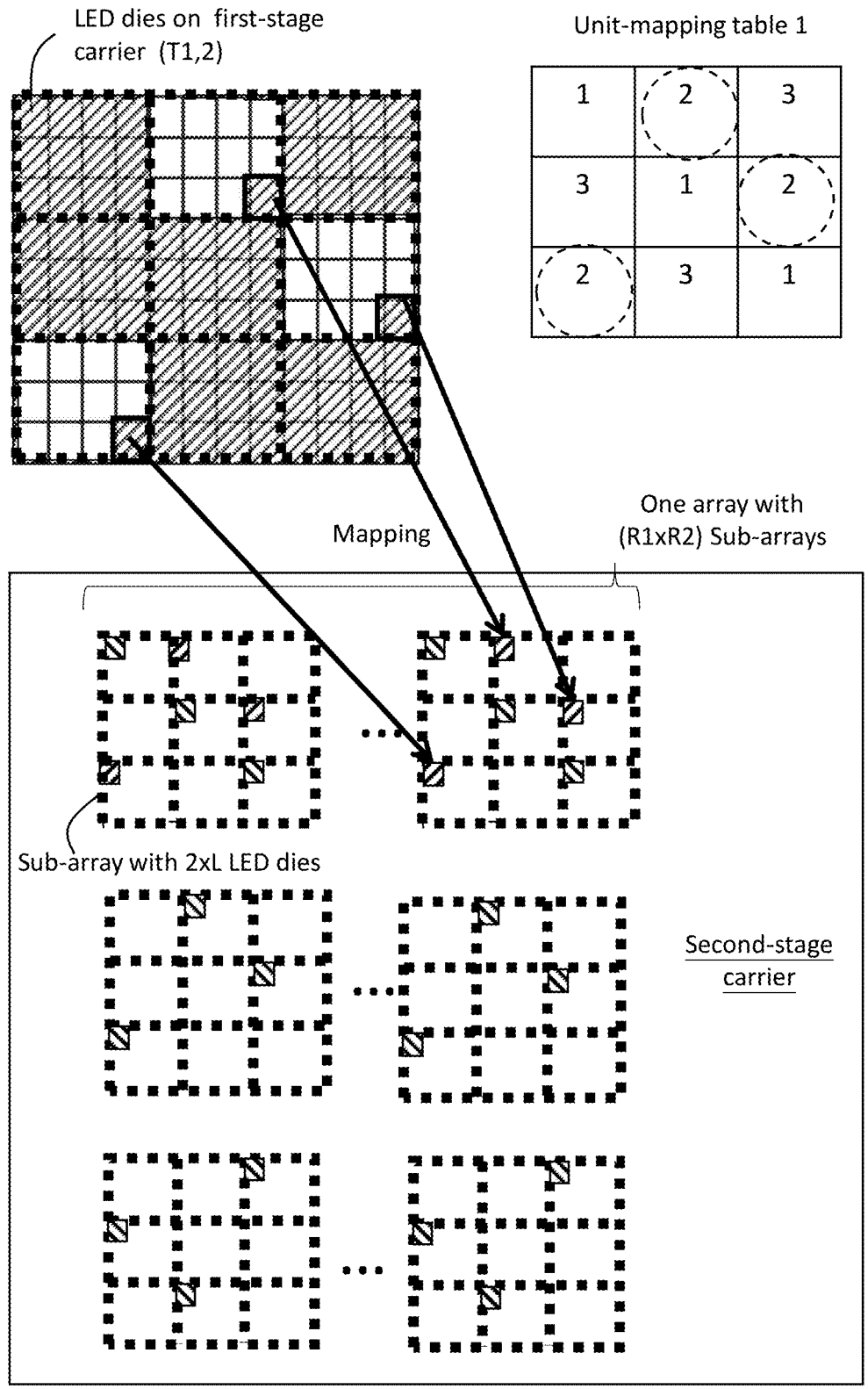
Figure 16:
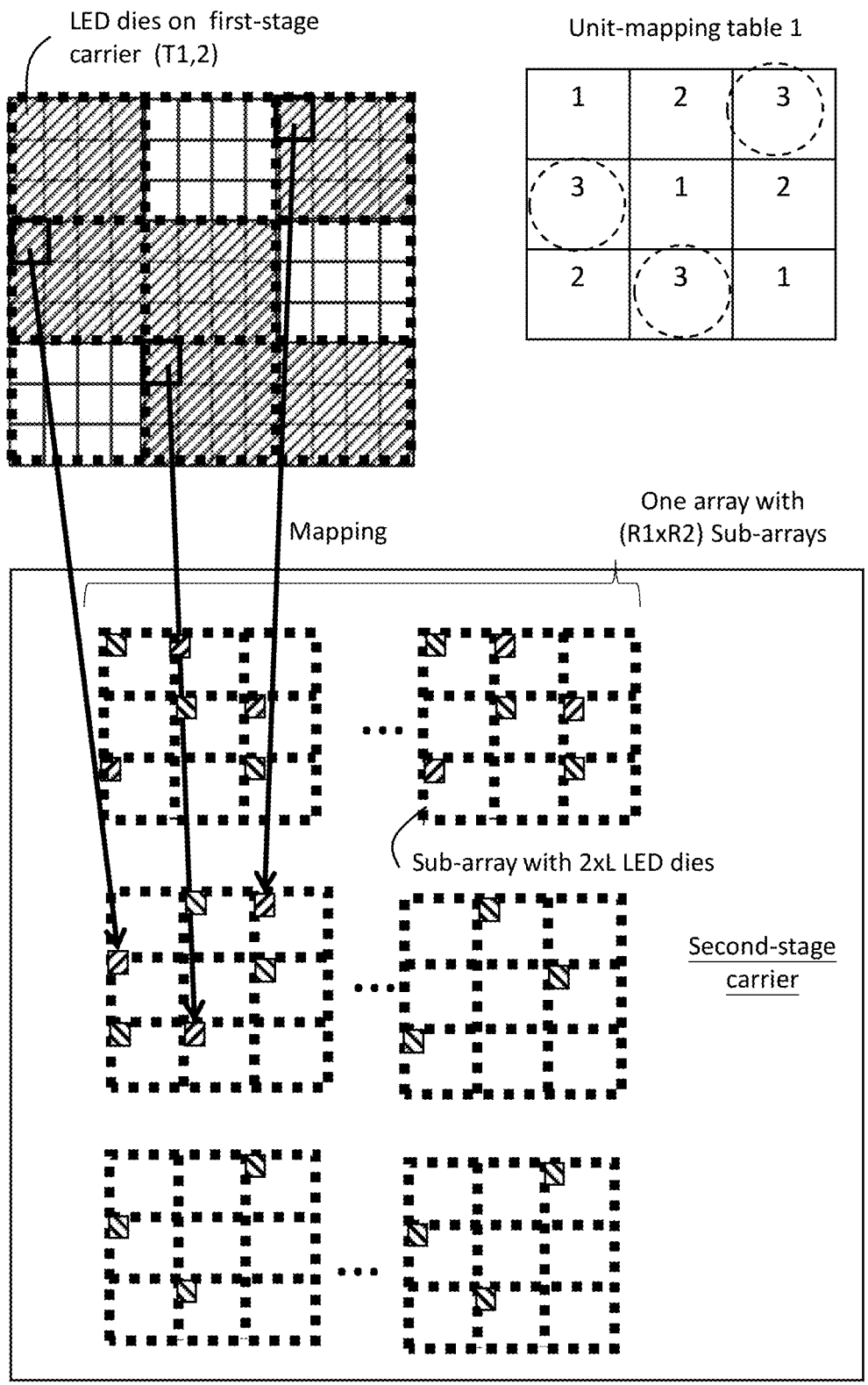
Figure 17:
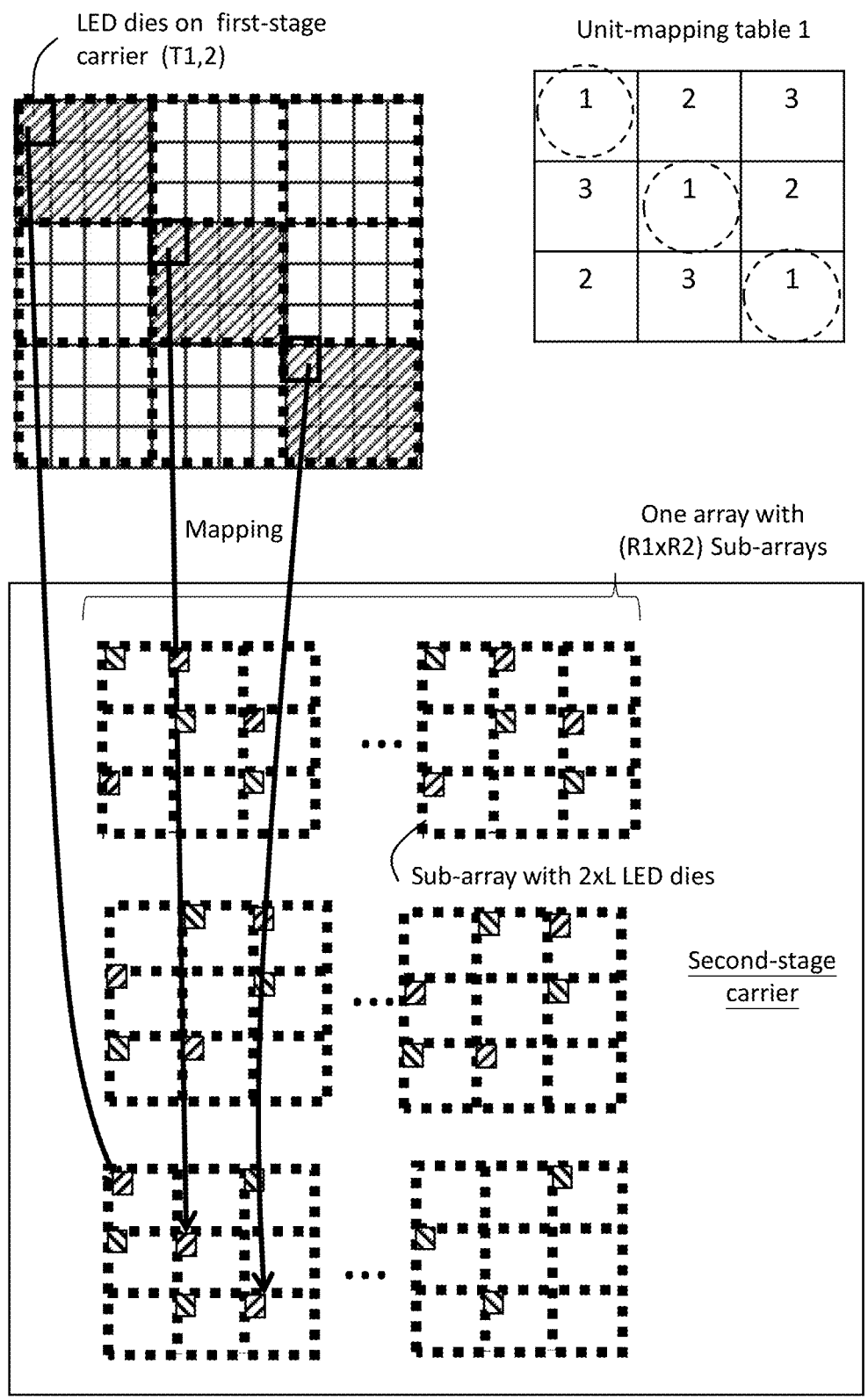
Figure 18:
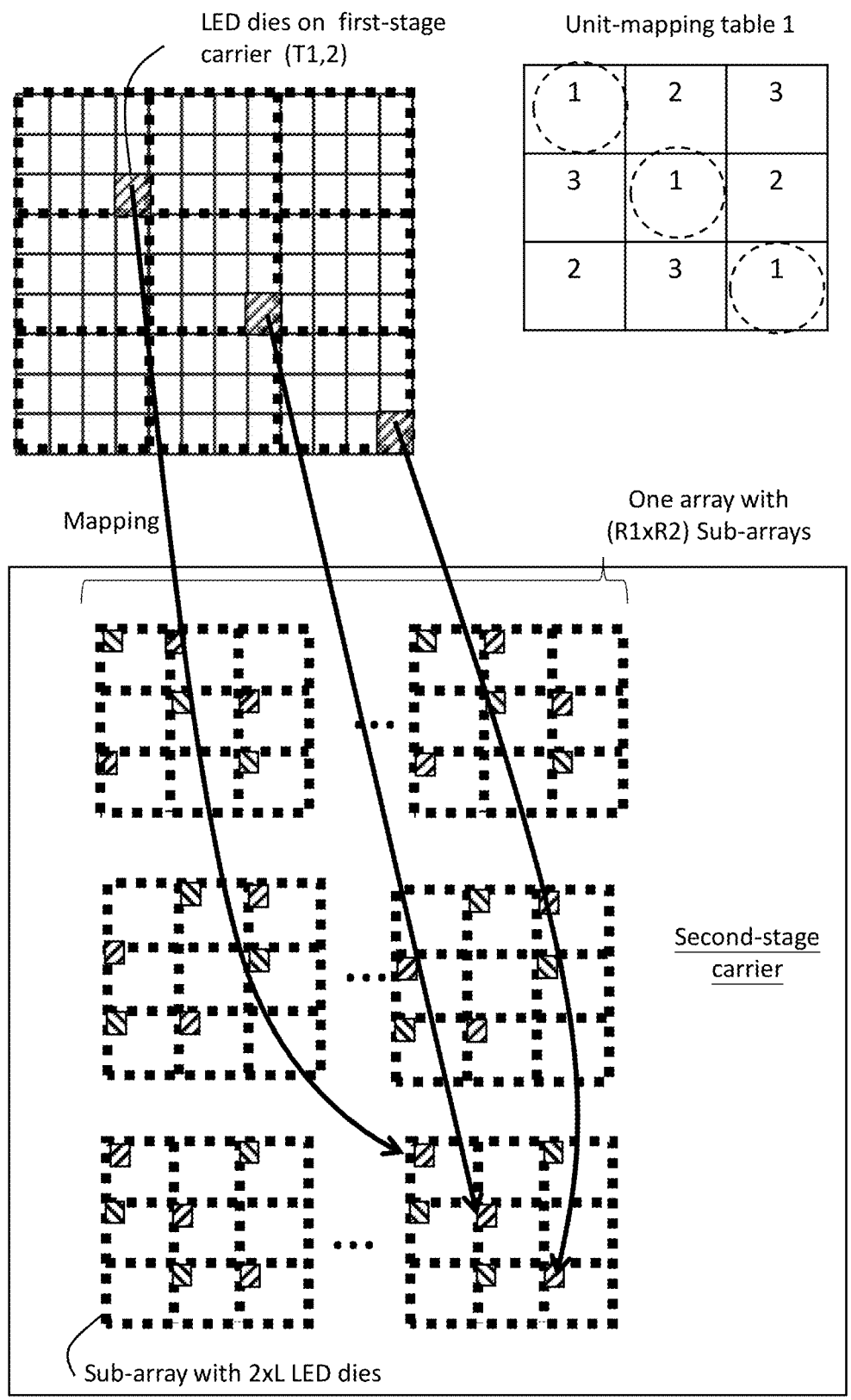

Step S43: Rearrange the unit-picking sequence with a new leading number thereof to be trailing and each of the remaining numbers thereof to be moved ahead by one position in the unit-picking sequence. For example, the unit-picking sequence is initialized as (1, 2, 3), after being arranged for the first time, the unit-picking sequence become (2, 3, 1) as shown in FIG. 14.

Figure 19:
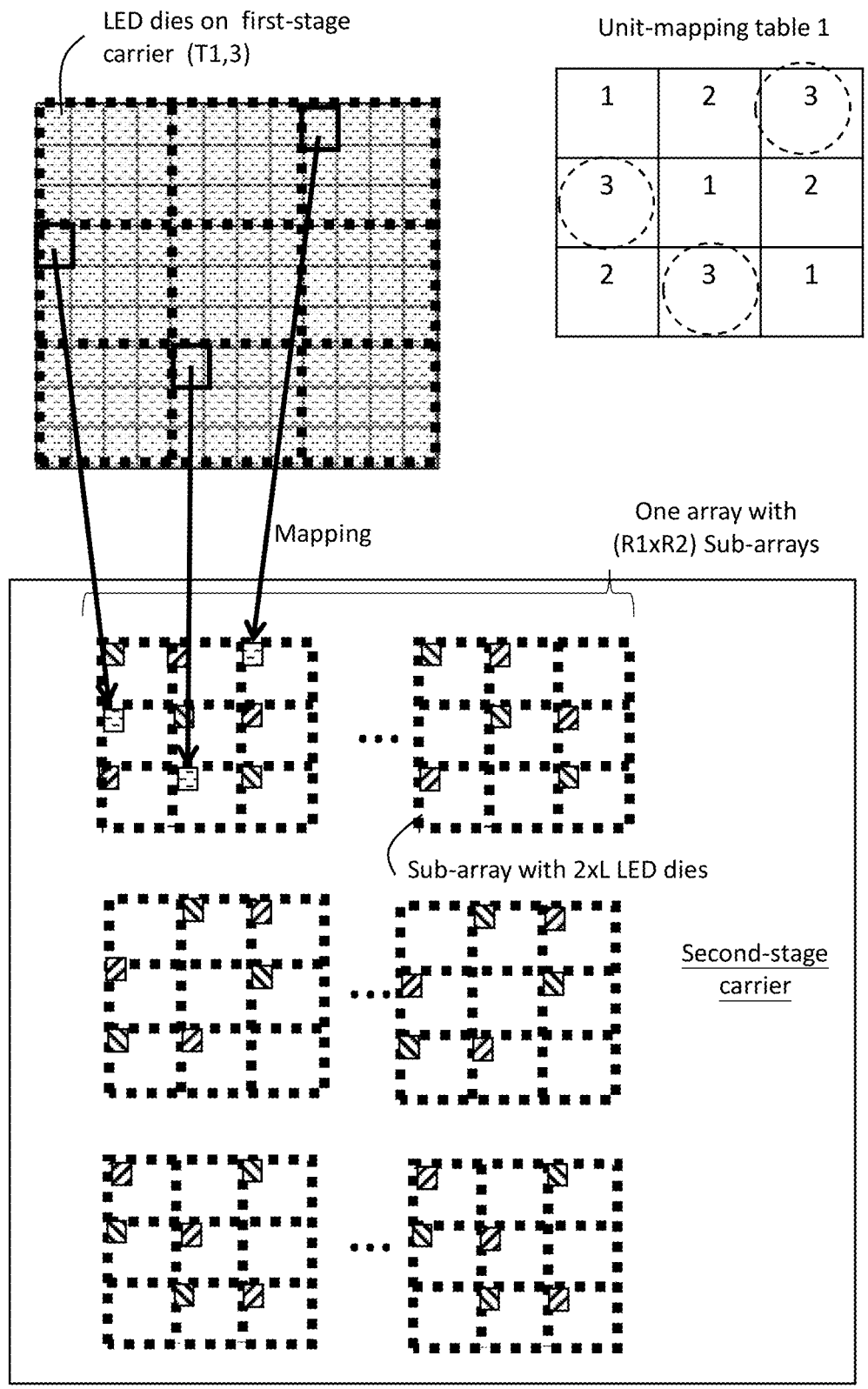
Figure 20:
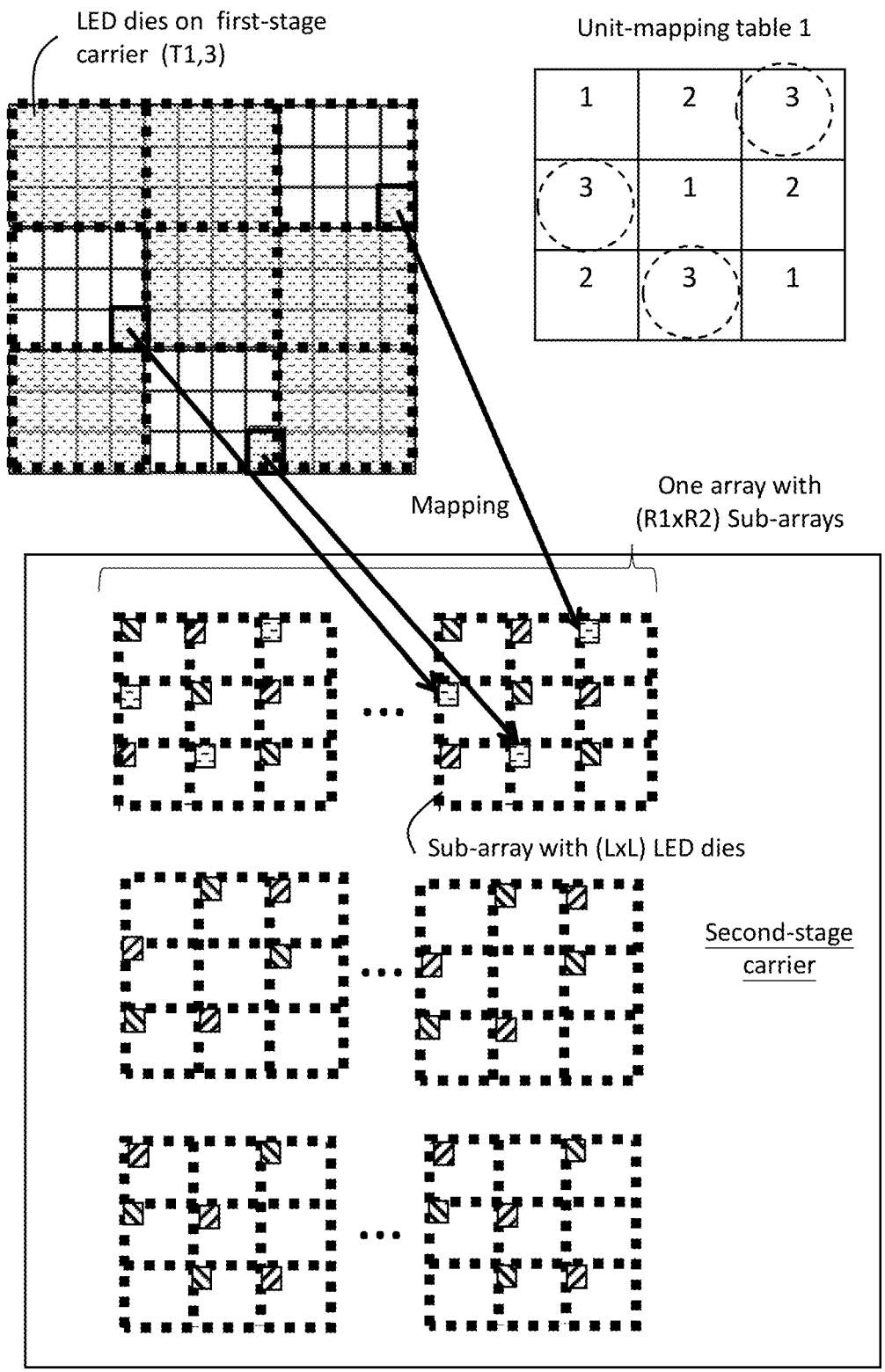
Figure 21:
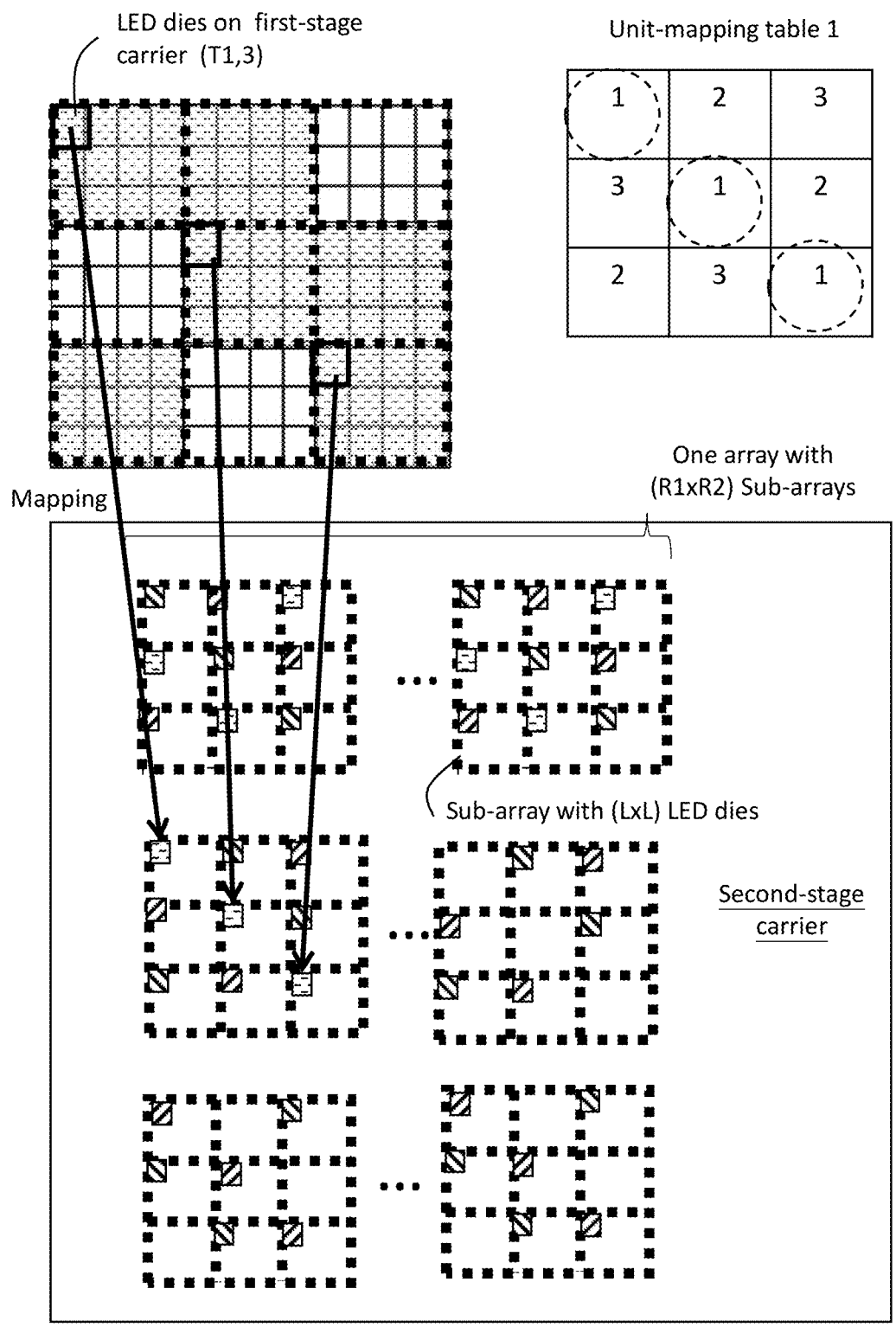
Figure 22:
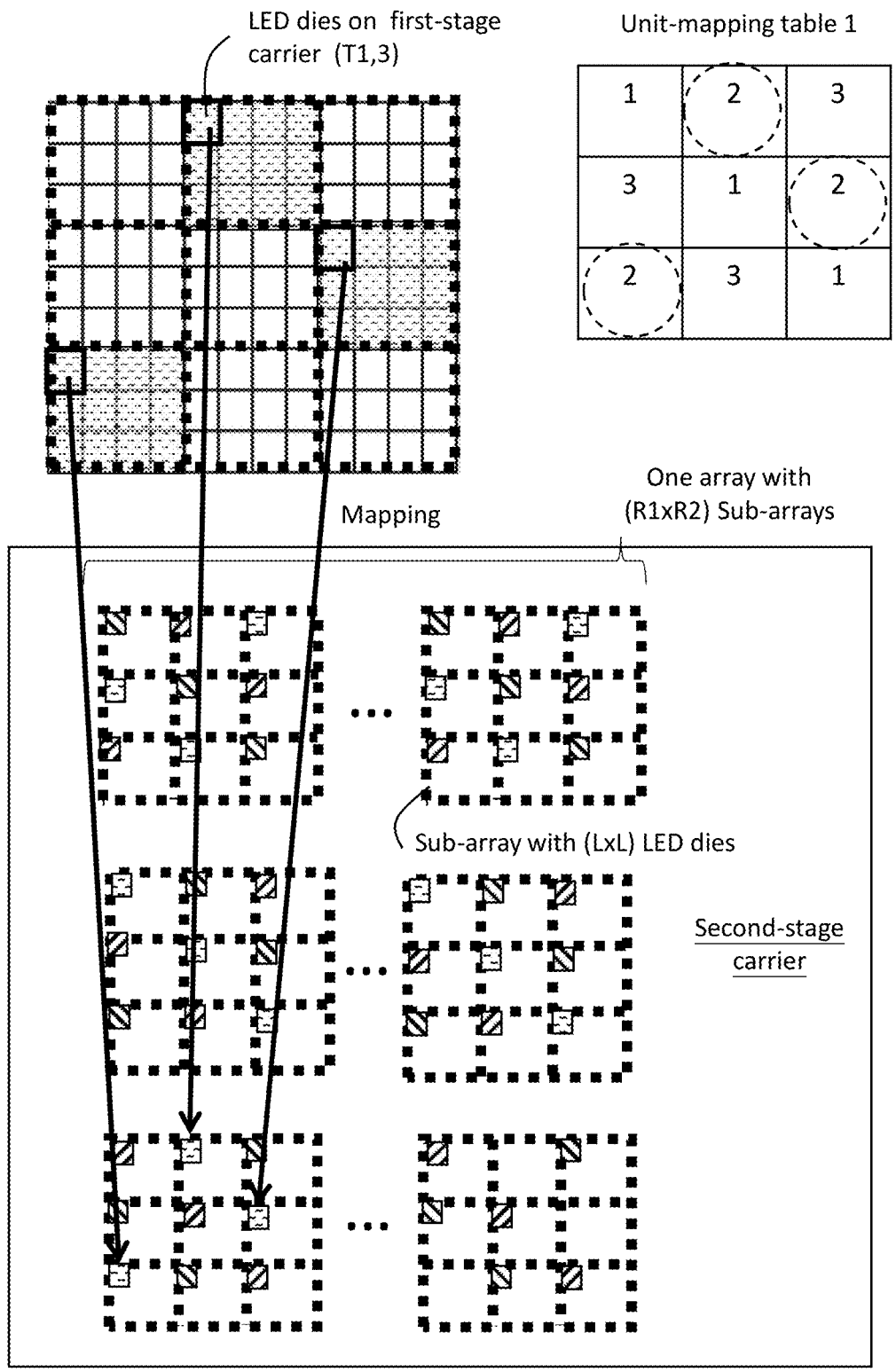
Figure 23:
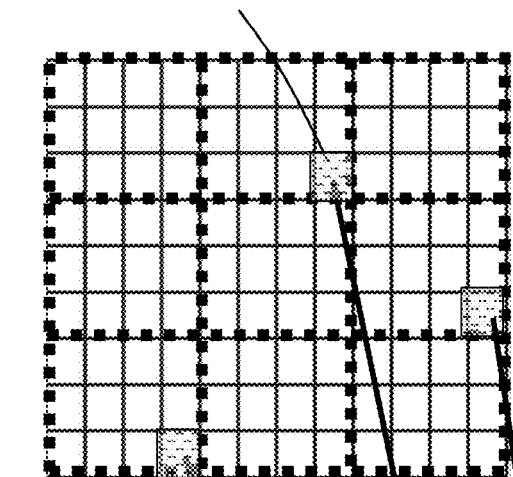
Figure 23:
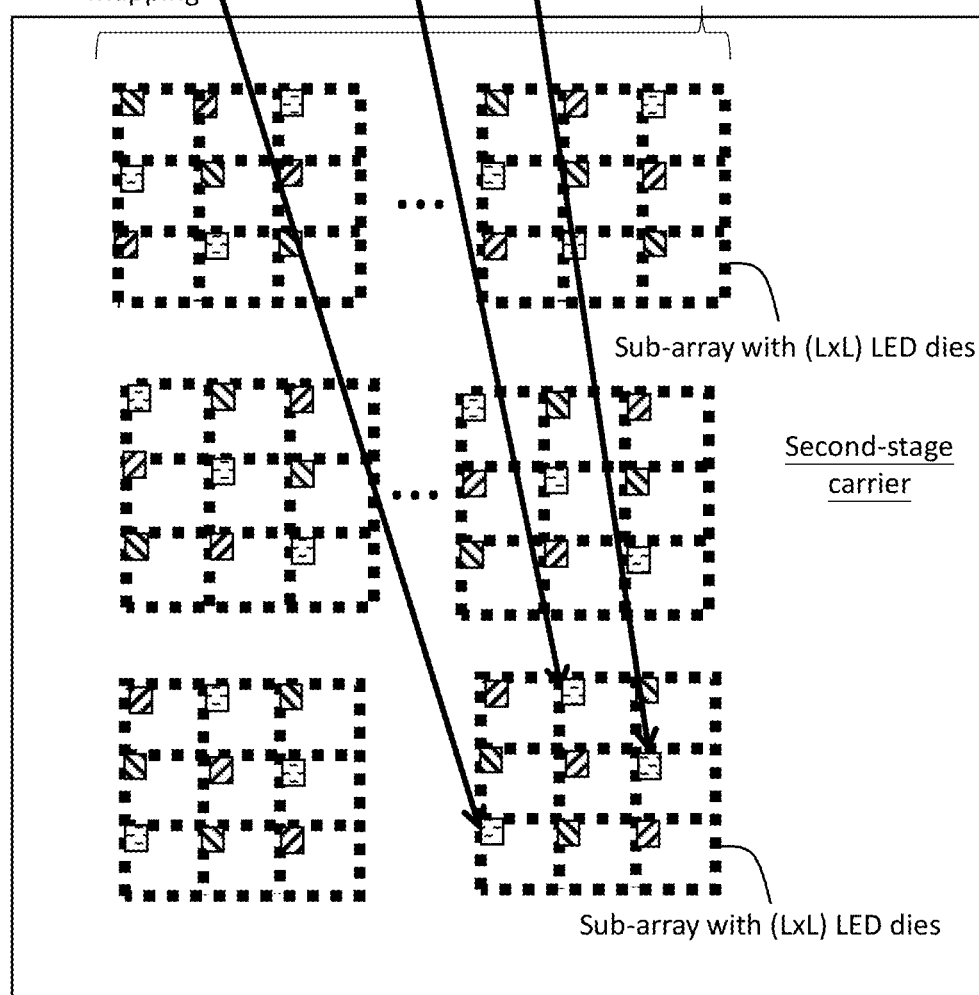

Step S44: Increment the current carrier number by one. It means that a next carrier of the first-stage carrier is ready to be selected as shown in FIGS. 14 and 19.

Step S45: reinitialize the unit-picking sequence and sequentially rearrange the leading number of the unit-picking sequence to be trailing and each of the remaining numbers thereof, to be moved ahead by one position in the unit-picking sequence until the leading number in the unit-picking sequence is equal to the current carrier number, and resuming step S41. It is to rearrange the unit-picking sequence according to the current carrier number.

The present embodiment of the die-transferring process puts on an emphasis on transfer of all LED dies of the LED units in the first predetermined pattern of a selected first-stage carrier mapped according to each number in the unit-picking sequence and identical numbers in the unit-mapping table, such as 1, 2 or 3, to R1×R2 or 12 sub-arrays in the second predetermined pattern of the second-stage carrier before arranging all the LED dies of the mapped LED units of the selected carrier according to a next number in the unit-picking sequence and identical number in the unit-mapping table on subsequent R1×R2 or 12 sub-arrays in the second predetermined pattern. According to the aforementioned embodiment of picking and placing the LED die, a spatial relationship between the LED dies on the substrates and on the first-stage carriers remains the same. That is, a spatial relationship of the LED dies on any substrate and any first-stage carrier is substantially the same. For example, the neighboring LED dies on the substrate, are the neighboring LED dies on the first-stage carrier. Second, a spatial relationship between the LED dies on the first-stage carrier and on the second-stage carrier is substantially the same, which means when the picked LED dies are on "top left corners" of the sub-matrices, the placed LED dies are on "top left corners" of the sub-sub-arrays. That is, the spatial relationship between the LED die dispositions in the sub-matrices (first predetermined pattern) and in the sub-arrays (second predetermined pattern), are the same. Similarly, the spatial relationship between the LED die dispositions in the matrices and in the arrays, is the same.

Figure 24:
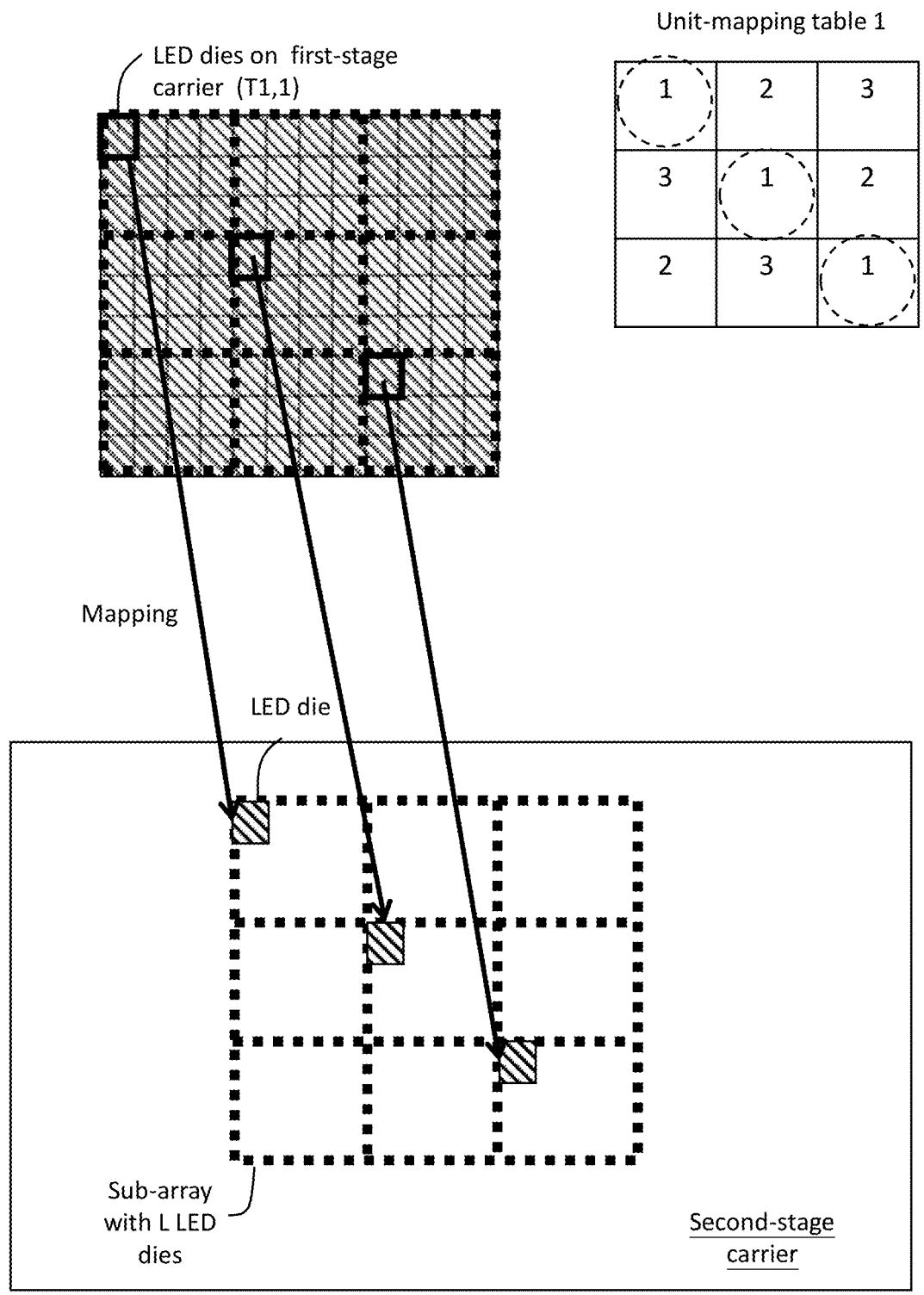
FIGS. 24 to 35 are operational schematic diagrams showing another embodiment of a changing LED die pitch and mixing process according to the present invention.

The other embodiment pertinent to the die-transferring process with reference to FIG. 37-2, includes the following steps:

Step S51: Set a current carrier number to 1 and sequentially select one of the first-stage carriers. As shown in FIG. 24, the current carrier number is set to be 1 and the first-stage carrier currently selected is T1,1.

Figure 25:
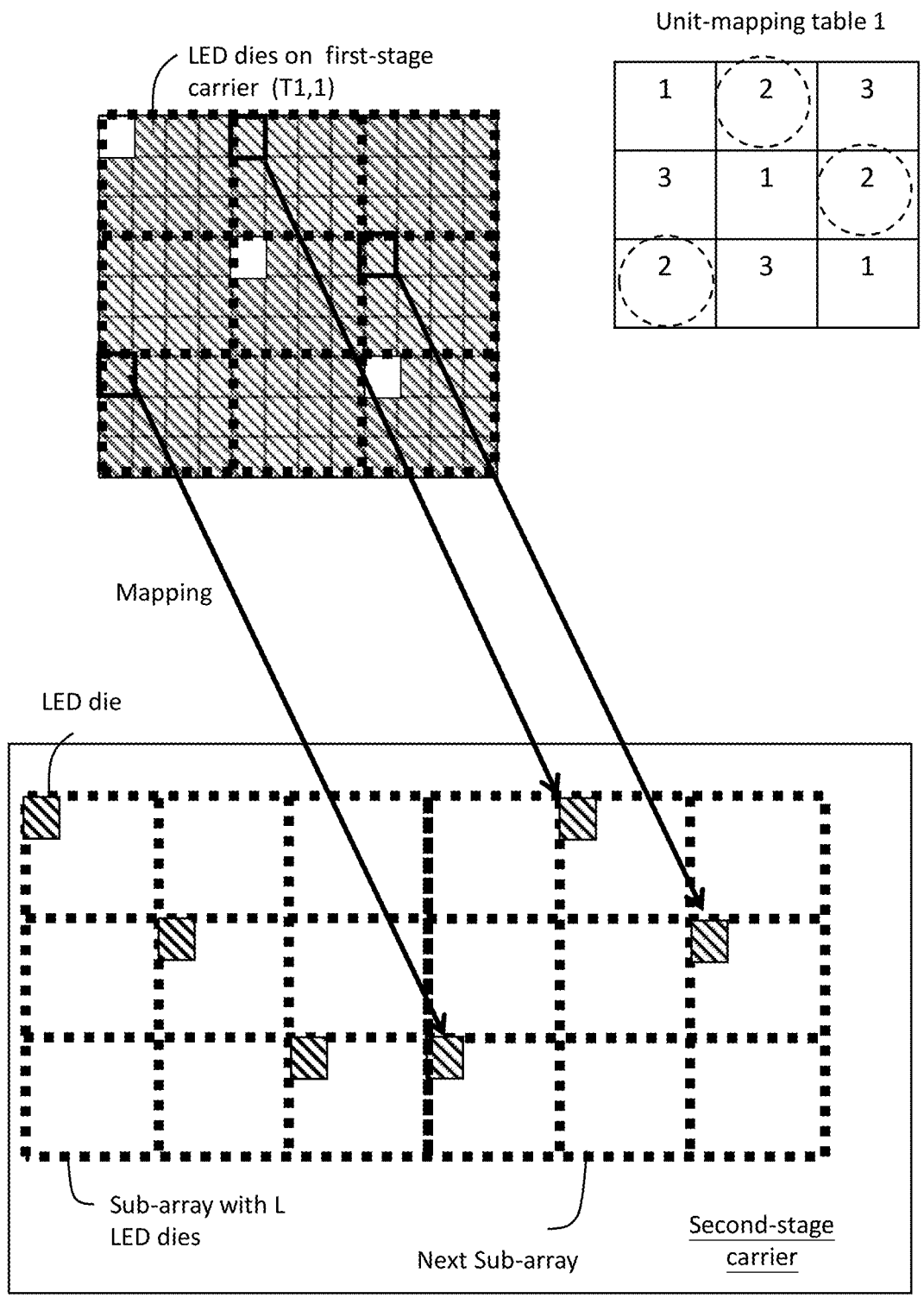
Figure 26:
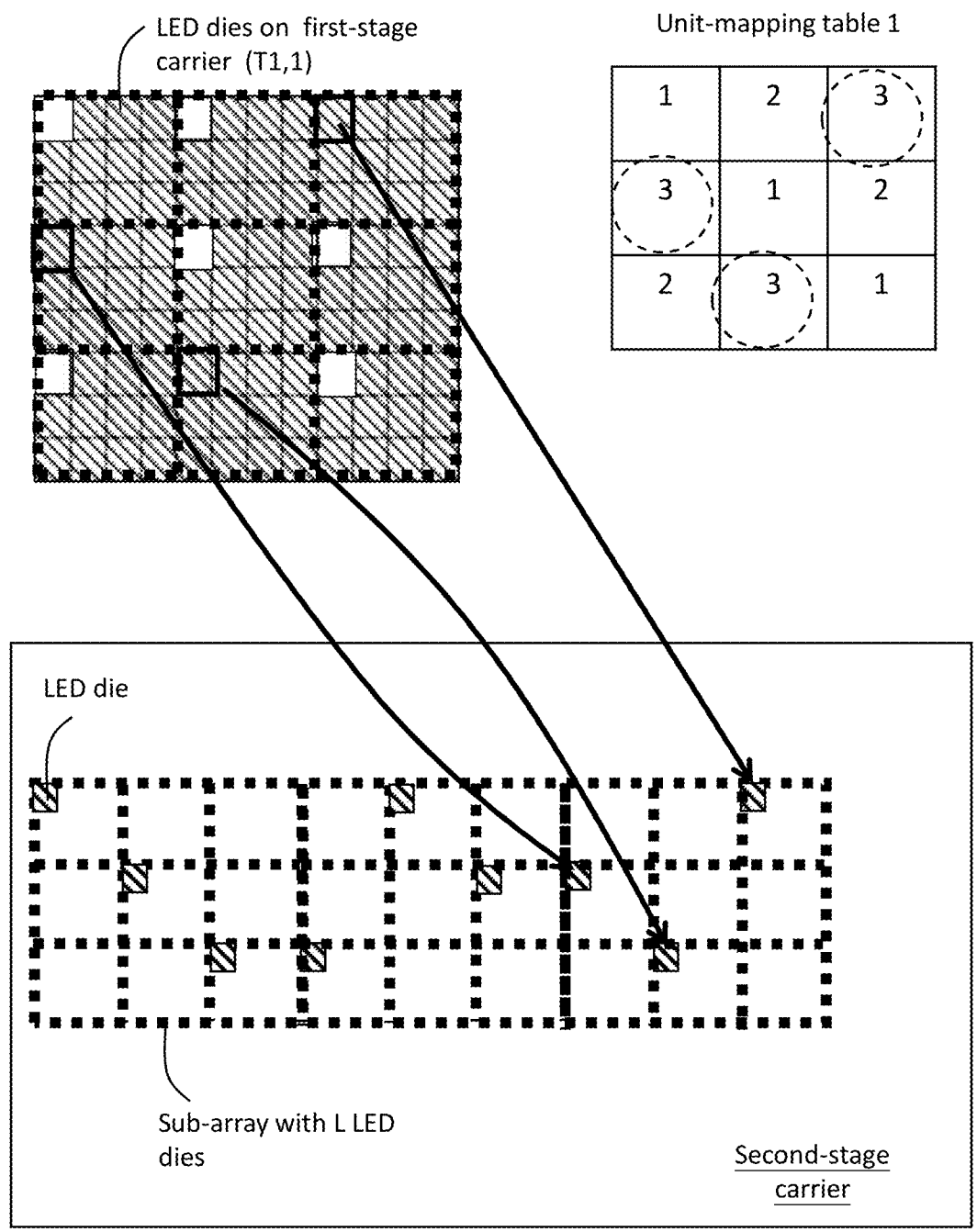
Figure 27:
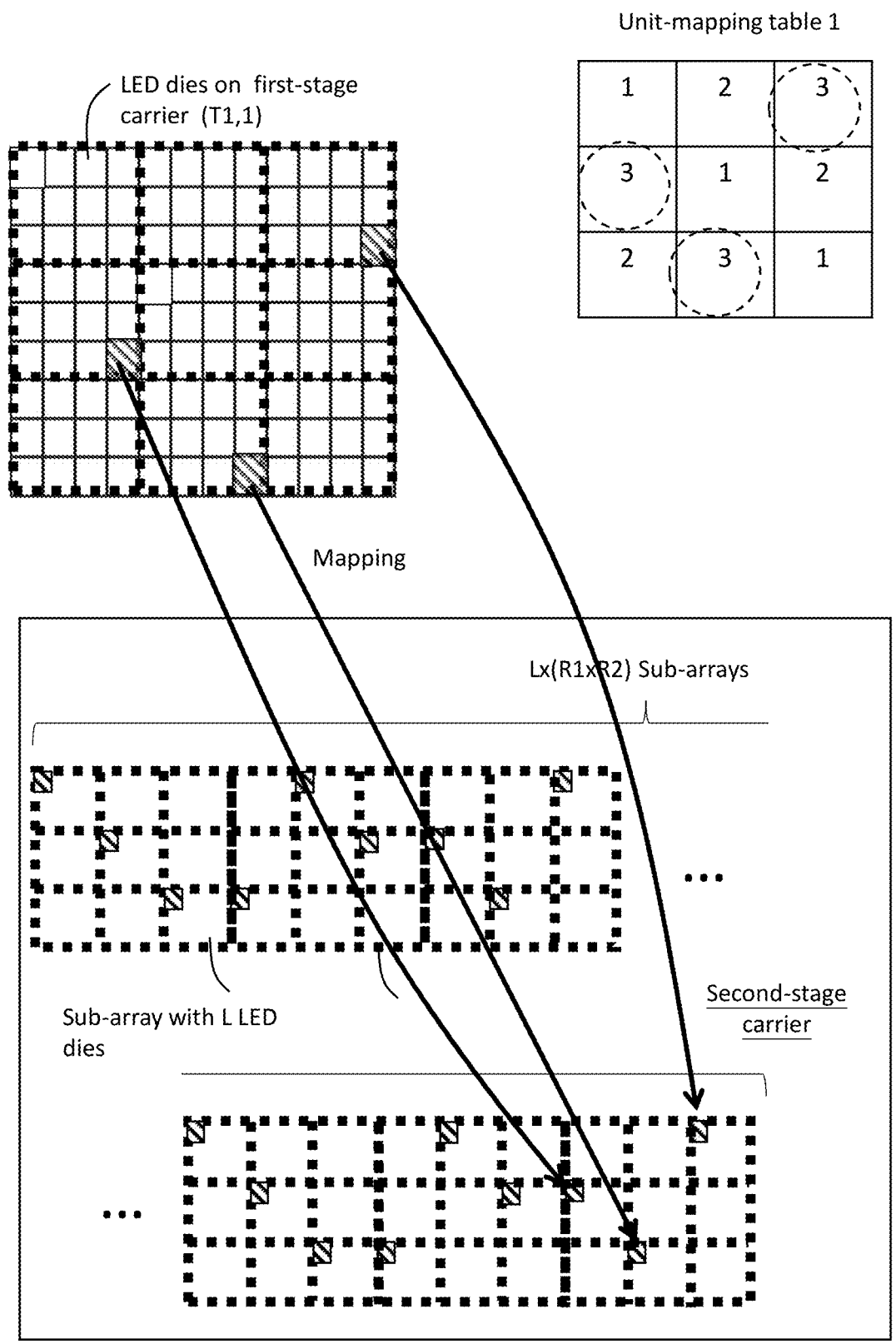

Step S52: Select L or 3 LED units of the selected carrier mapped in the unit-mapping table with respect to the leading number of the unit-picking sequence, and sequentially arrange L LED dies at each identical set of row and column of the respective mapped LED units, on the columns and rows of one of the sub-arrays of the second predetermined pattern, wherein the rows and columns of the selected sub-array of the second-stage carrier are identical to the rows and columns of the mapped LED units in the matrix of the first predetermined pattern. As shown in FIG. 24 to 26, L or 3 corresponding LED units in the matrix of the first predetermined pattern are mapped by the rows and columns of the number 1's, 2's or 3's in the unit-mapping table corresponding to the leading number 1, 2 or 3 cyclically shifted in the unit-picking sequence in step S54. Then, L or 3 LED dies located at each identical set of row and column of the mapped LED units are arranged on one sequentially sub-array selected from the L×R1×R2 or 36 sub-arrays in the second predetermined pattern of the second-stage carrier. In contrast to the foregoing embodiment of the die-transferring process, the current step repeatedly transfers L or 3 LED dies each time from L or 3 respective LED units mapped by one common number in the unit-mapping table and in the unit-picking sequence from the first predetermined pattern of a selected carrier to one sub-array sequentially selected from the second predetermined pattern instead of transferring L×R1×R2 or 36 LED dies of same number on the unit-mapping table to sub-arrays according to the second predetermined pattern as shown in the foregoing embodiment.

The transferring process is described as below. First, electing one carrier (T1,1) of the first-stage carrier and assigning a first sequence integer and a second sequence integer in the unit-mapping table, as the first sequence integer=1 in the unit-mapping table 1 in FIG. 24, second sequence integer=2 in the unit-mapping table 1 in FIG. 24. Then, picking the LED dies from the LED units corresponding to the first sequence integers in the unit-mapping table and placing the LED dies on the column and row of one sub-array corresponding to the first sequence integers in the unit-mapping table as shown in FIG. 24. Then, picking the LED dies from the LED units in the matrix corresponding to the second sequence integers in the unit-mapping table and placing the LED dies on the column and row of another sub-array (next to the one sub-array) corresponding to the second sequence integers in the unit-mapping table as shown in FIG. 25 until the (R1×R2) pre-mixed LED dies in the LED units corresponding to the first sequence integer and the second sequence integer in the unit-mapping table are fully picked. The steps above are repeated for the next sequence integer as shown in FIG. 26, 27.

Step S53: Determine if all the LED dies of the selected carrier are fully arranged to the second-stage carrier. The current step puts an end to the iterative die transfer in step S52 when there is no more LED dies left in the selected carrier.

Step S54: When all the LED dies of the selected carrier are not fully arranged, cyclically shift the numbers in the unit-picking sequence with the leading number thereof to be trailing and each of the remaining numbers thereof to be moved ahead by one position in the unit-picking sequence and resume step S52. The current step is mainly to cyclically shift the numbers in the unit-picking sequence once when the LED dies of the selected carrier are not fully arranged to the second-stage carrier.

Figure 28:
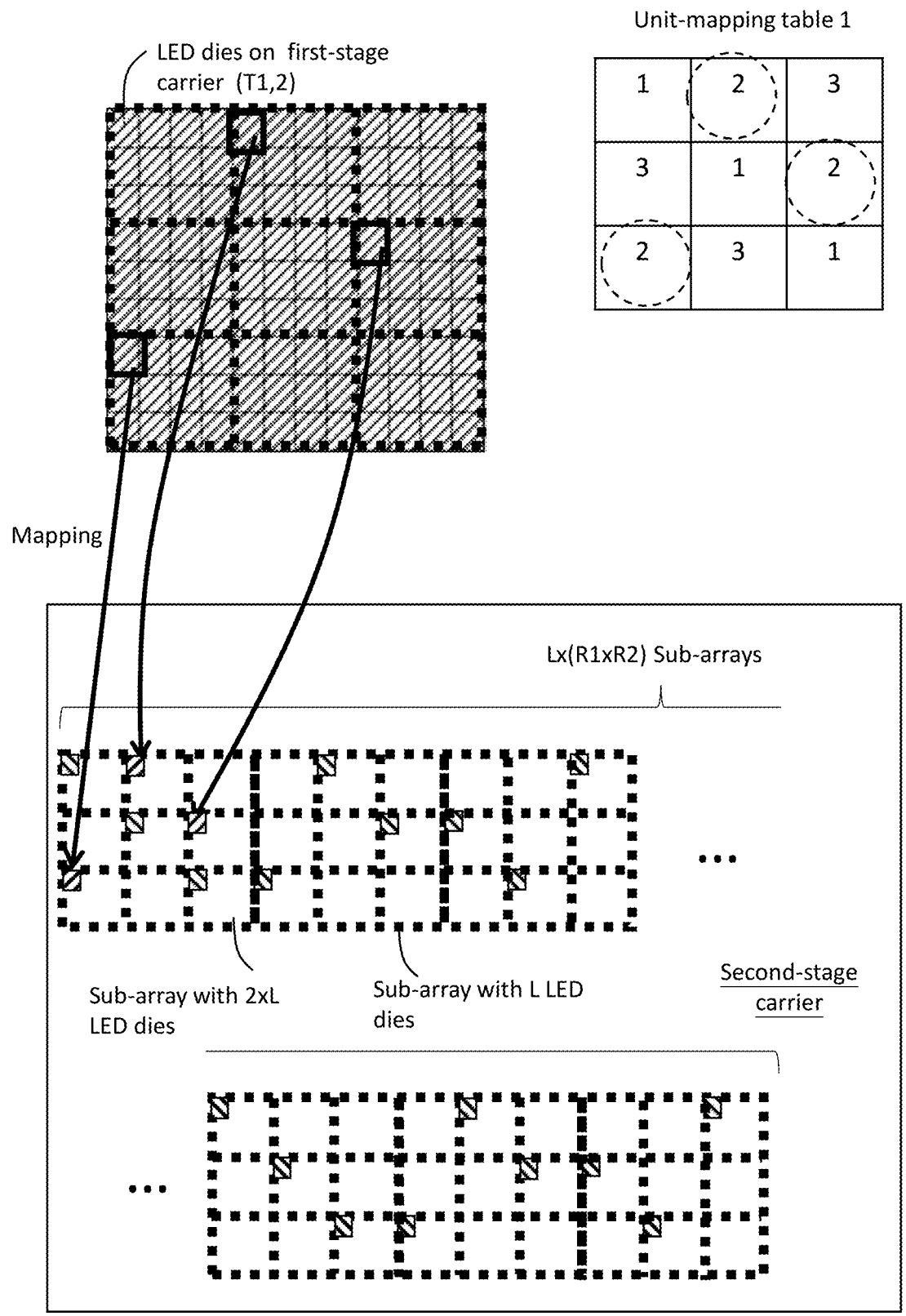
Figure 29:
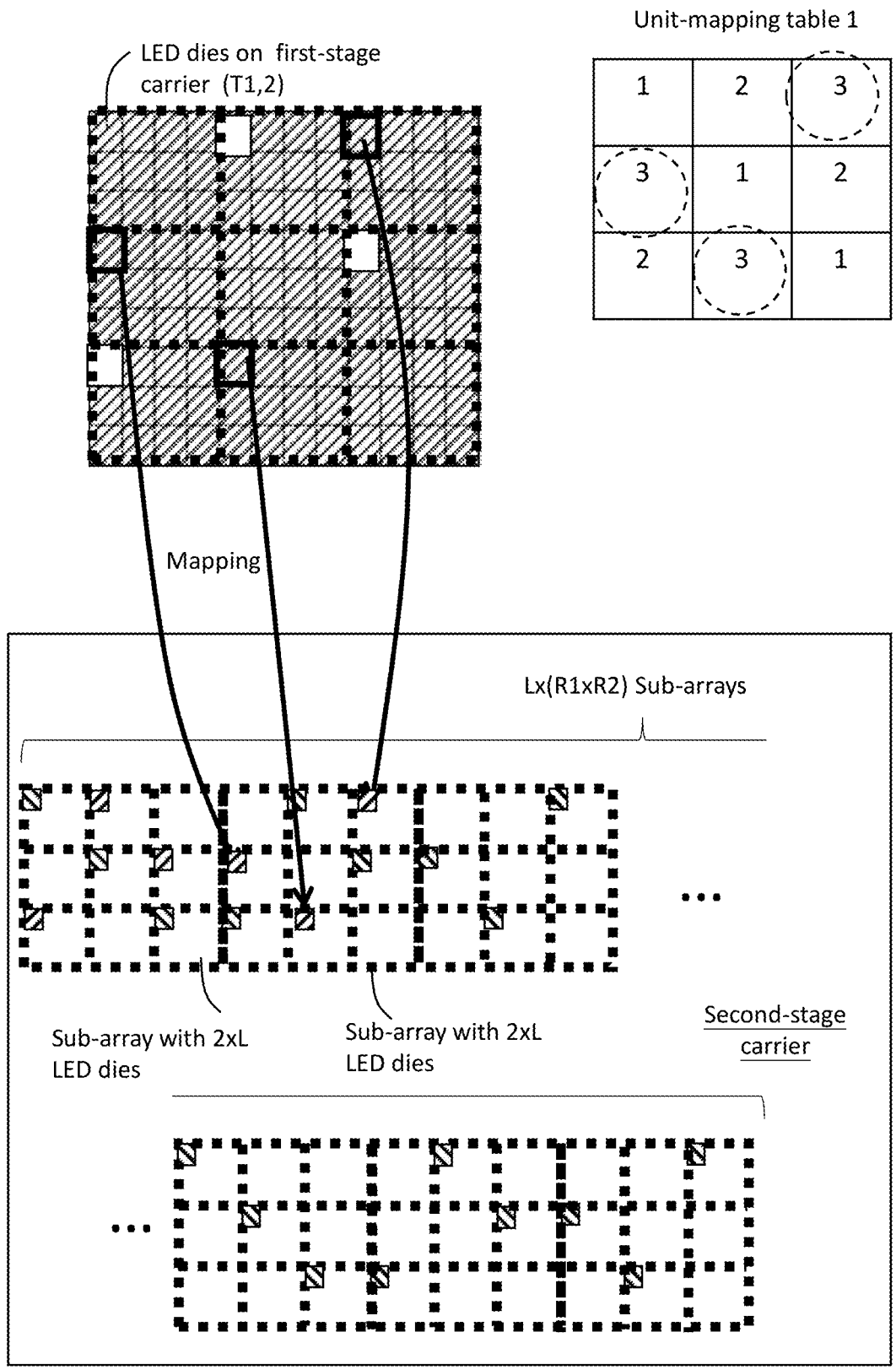
Figure 30:
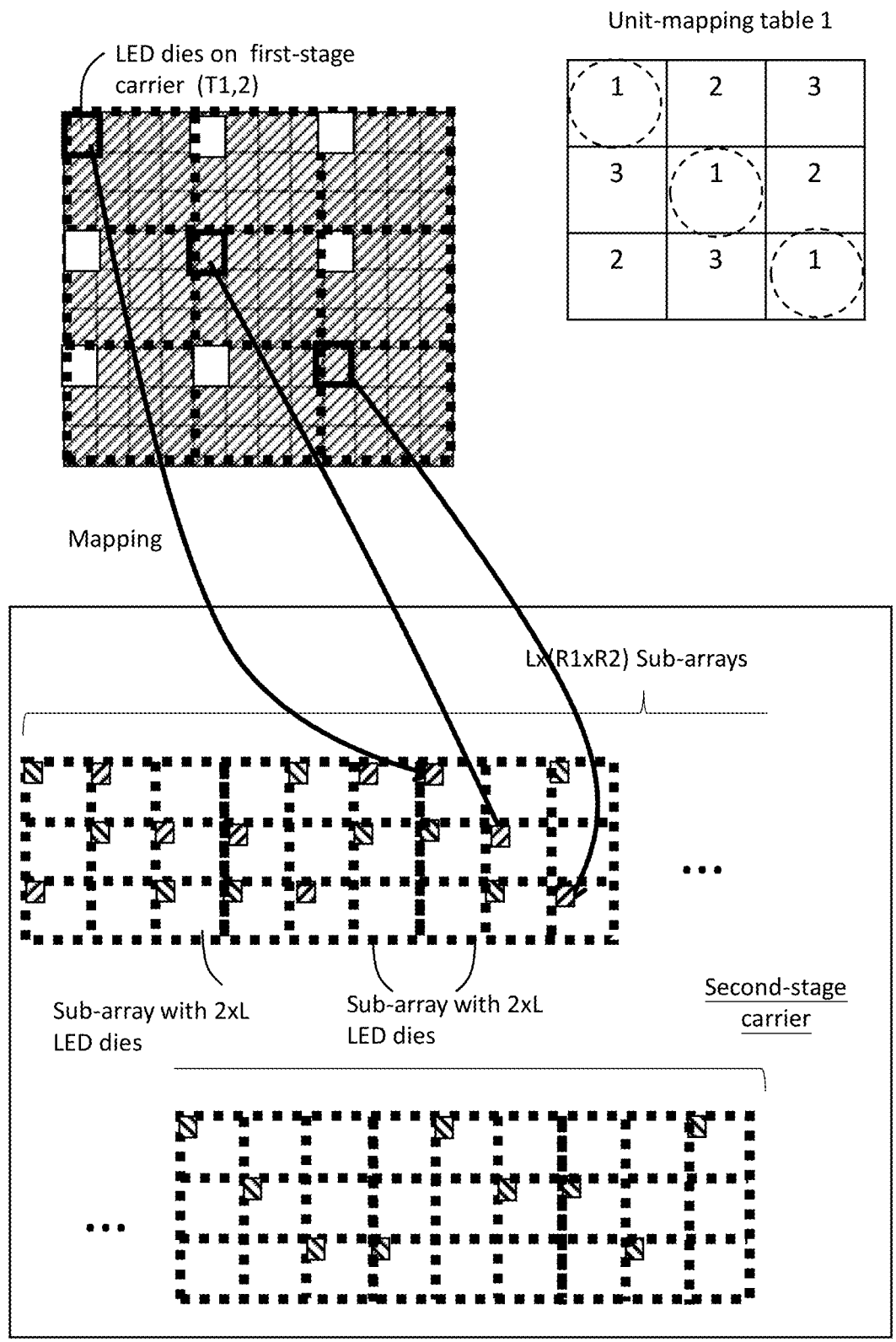
Figure 31:
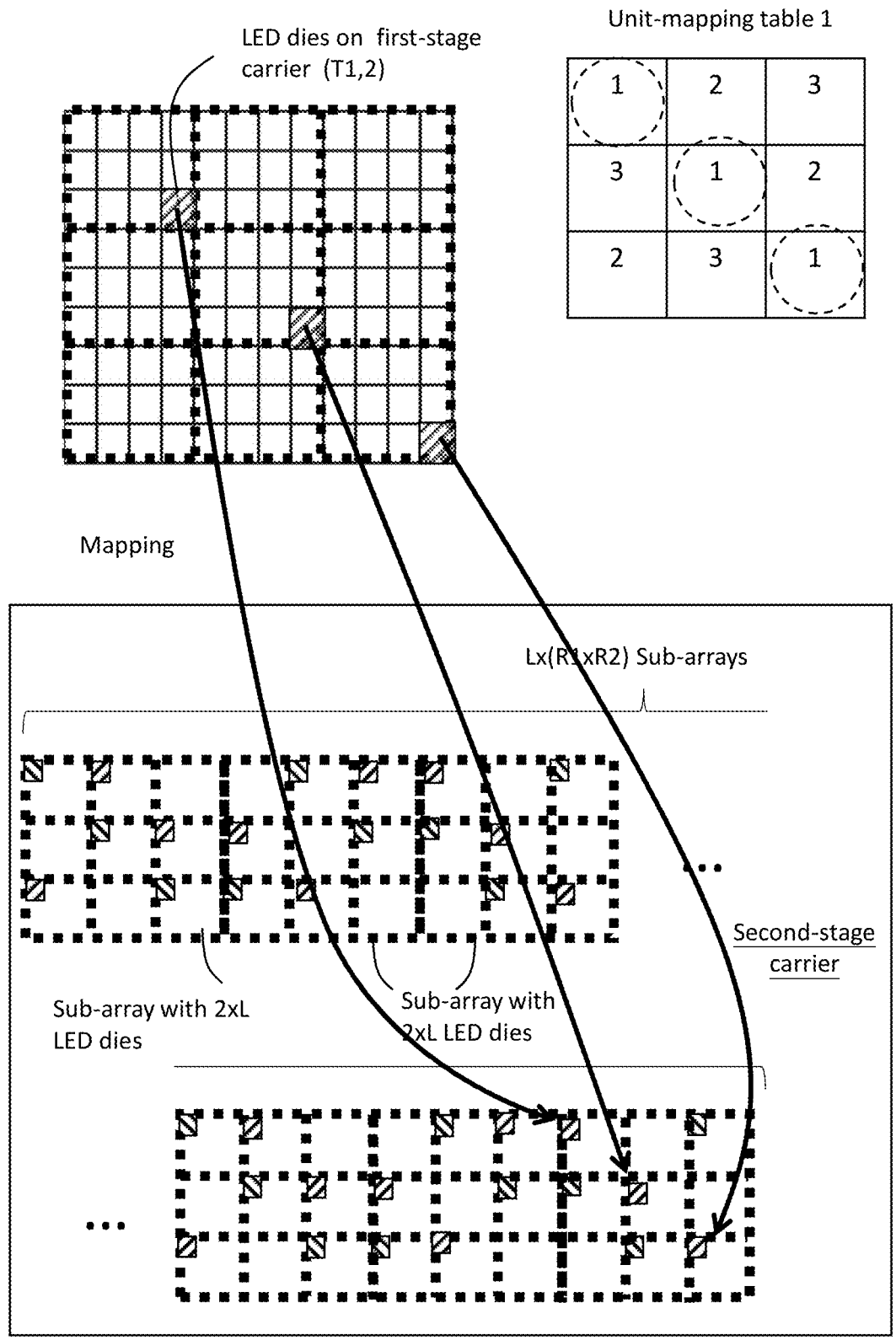
Figure 32:
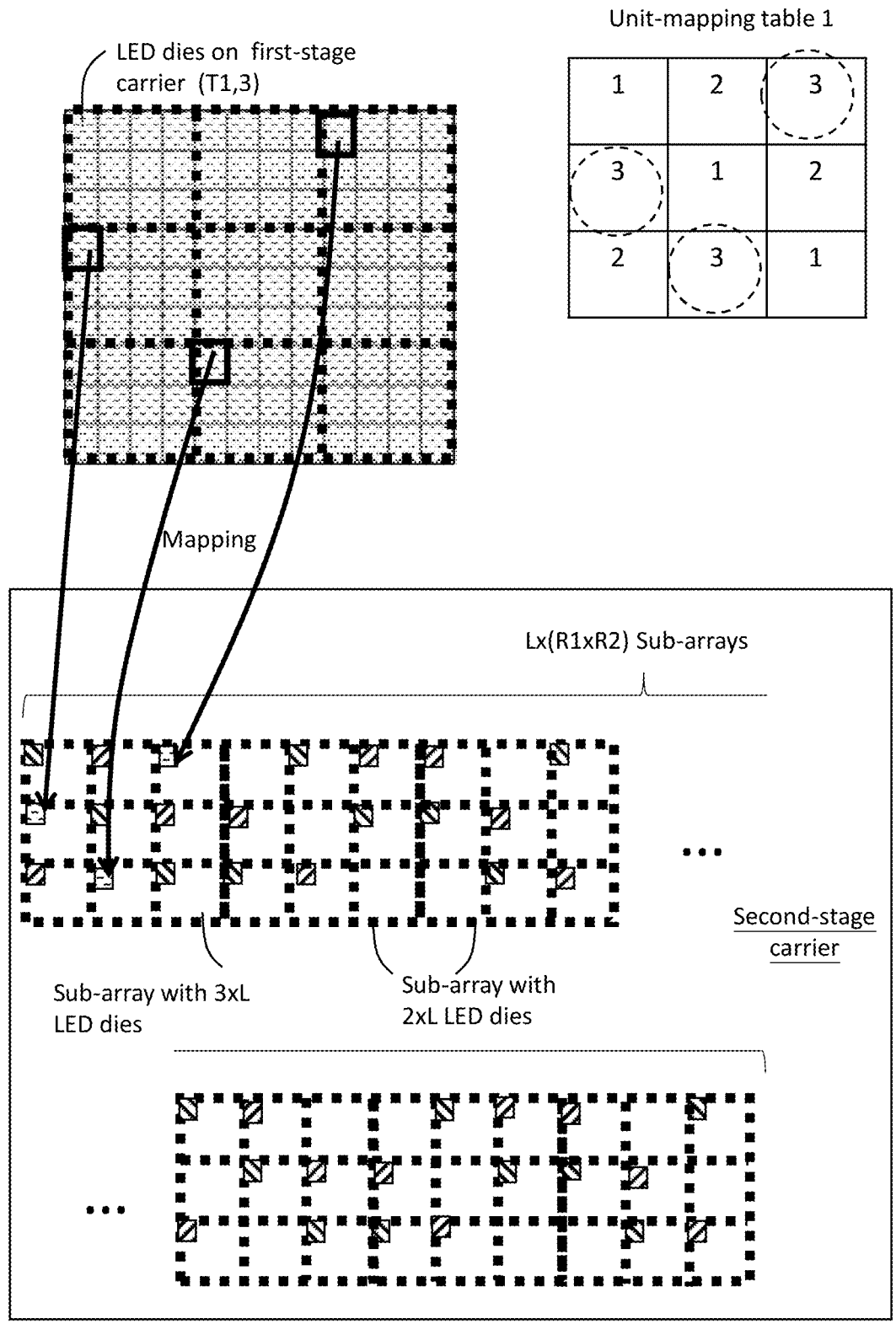
Figure 33:
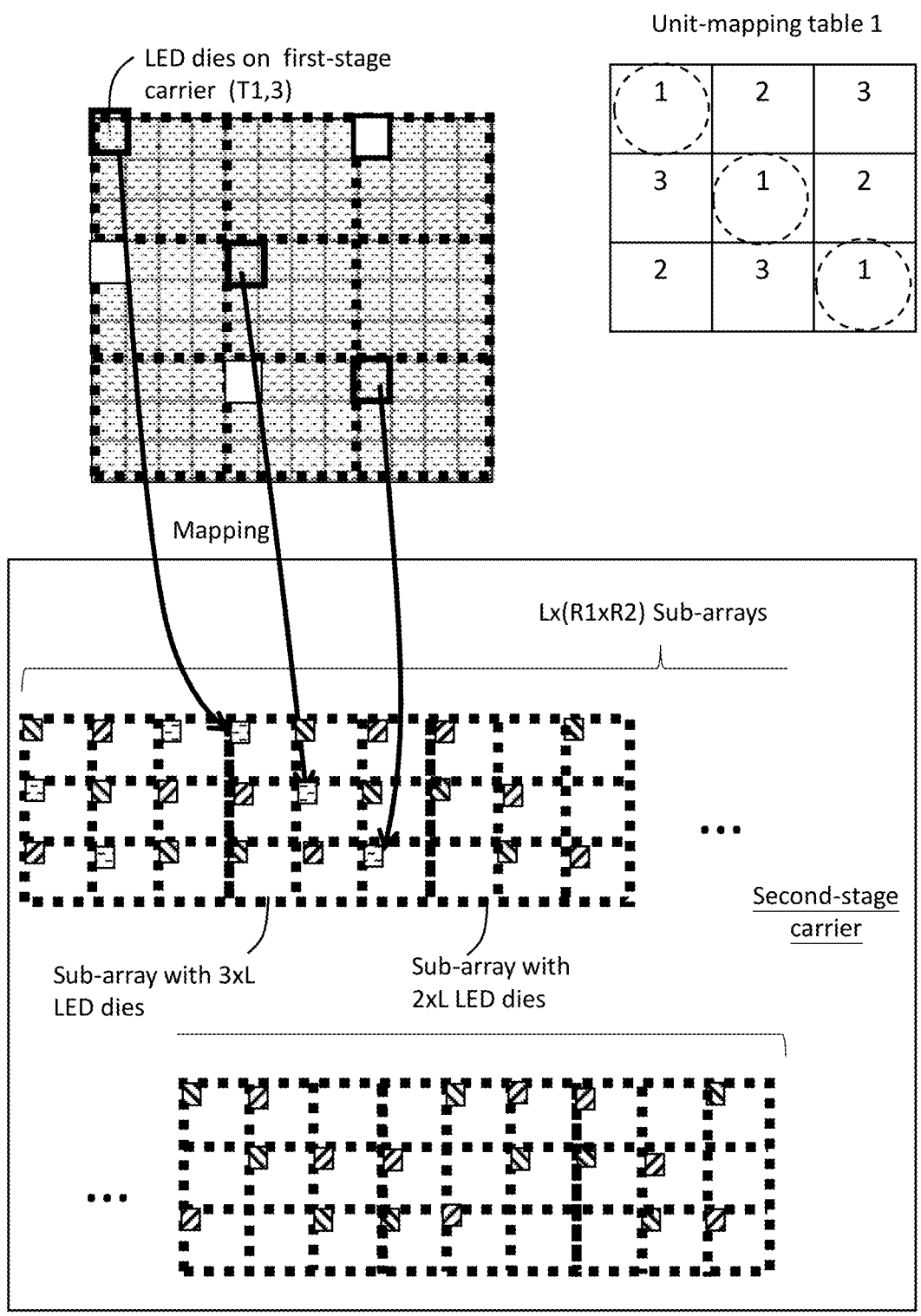
Figure 34:
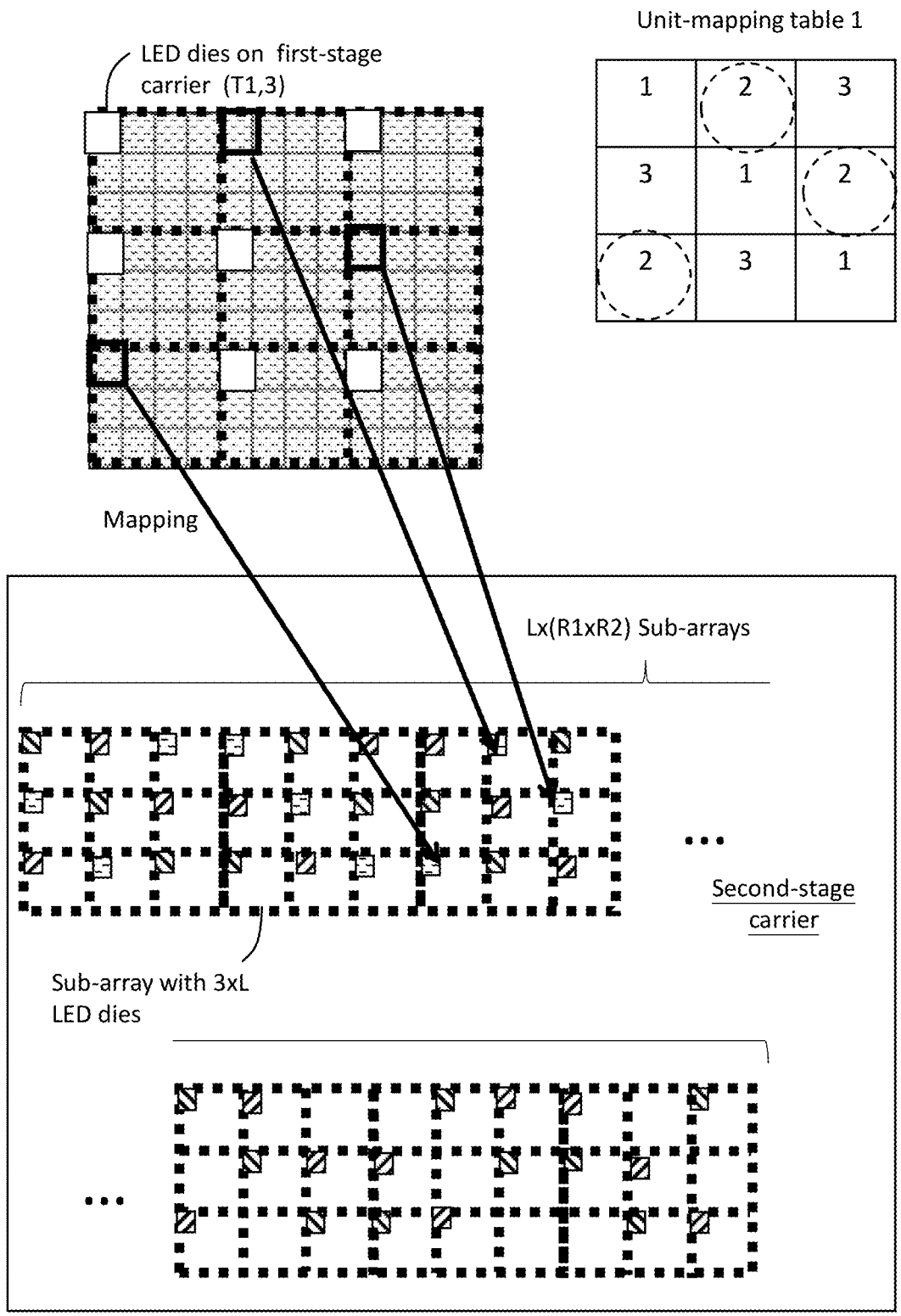
Figure 35:
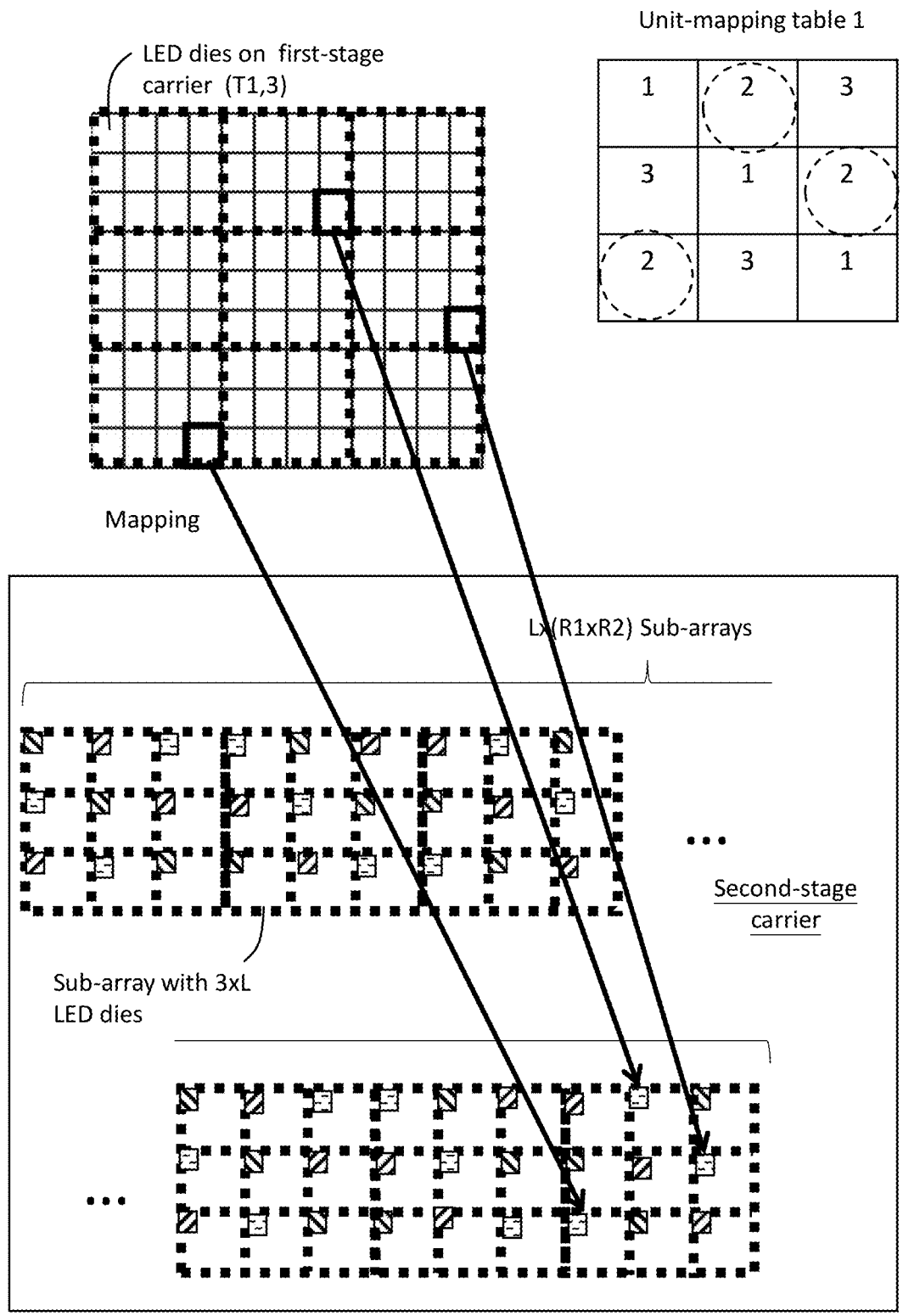

Step S55: Increment the current carrier number by one as shown in FIG. 28.

Step S56: Reinitialize the unit-picking sequence and rearrange the leading number of the unit-picking sequence to be trailing and each of the remaining sequence numbers thereof to be moved ahead by one position in the unit-picking sequence, until the leading number in the unit-picking sequence is equal to the current carrier number, wherein the rearrange the leading number follows a number of the unit-picking sequence next to the leading number of previous carrier, and resume step S51 to repeat steps above as shown in FIGS. 29 to 35.

The present embodiment pertinent to the die-transferring process puts on an emphasis on transfer of L×L or 9 LED dies of the LED units mapped by the L or 3 different numbers in the unit-mapping table and in the unit-picking sequence and arranged on each subsequent L or 3 sub-arrays of the second predetermined pattern in an iterative way.

Besides, the unit mapping can be adjusted. Referring to FIGS. 36-1 to 36-3, the schematic diagrams show unit-mapping tables according to the present invention.

In the aforementioned embodiment, the different first-stage carriers (T1,1, T1,2, and T1,3) can belong to same category, different categories of the same emission color, or different emission colors.

In one perspective of the present invention, based on the LED dies of the same emission color, the LED dies on the second-stage carrier belong to different categories of the same emission color, for example, four categories. Please refer to FIG. 38, wherein LED dies in one matrix can have different emission colors, and a plurality of numbers of the LED dies of different categories of the same emission color on the second-stage carrier are substantially equal to each other (the selected number of the LED dies assigned to each category are the same). The LED dies are divided into a plurality of two-dimension square matrices assigned to the two-dimension square matrices identical in matrix dimension. Please refer to FIG. 39-1, a selected number of the LED dies assigned to each category is substantially based on a predetermined category ratio, and the predetermined category ratios are the same. Therefore, the actual numbers of LED dies assigned to each category is close to each other. Please refer to FIG. 39-1, the LED dies in the matrices (or in one matrix) of each category of the same emission color have a quantity distribution curve which is formed by each quantity of LED dies corresponding to each category in a matrix (X-axis is categories, Y-axis is quantities). In this embodiment, a matrix has a quantity distribution curve with a quantity deviation which is less than 5%, 10%, 15%, or 20%, and the matrix is conformed matrix. Further, according to the mixing process of the present invention, a ratio of a number of the conformed matrices to a number of the all matrices on the second-stage carrier is larger than a threshold ratio. In one embodiment, the threshold ratio can be 5%, 10%, 30%, 40%, 50%, 80%, or other ratios. The quantity deviation, for example, a ratio of the maximum quantity of LED dies belonging to one category over the minimum quantity of LED dies belonging to another category in the same matrix; a ratio difference between a ratio of a quantity of LED dies belonging to one category to a total number of LED dies, and another quantity of LED dies belonging to another category to a total number of LED dies in the same matrix; or a ratio of the quantities of LED dies belonging to one category to the quantity of LED dies belonging to a neighboring category in the same matrix. In one embodiment, if a number of the plurality of light-emitting elements of each category of the same emission color in one matrix is larger than 20% of a largest number of the plurality of light-emitting elements of each category of the same emission color, the number has to be within a quantity deviation of the largest number.

Figures 1, 39:
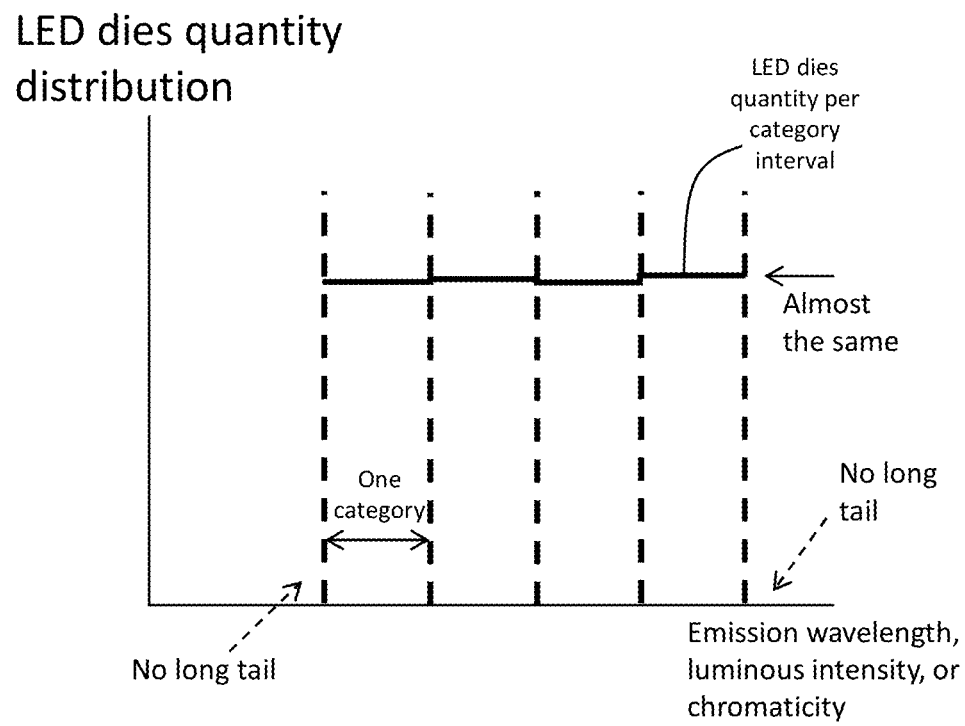
Figures 2, 39:
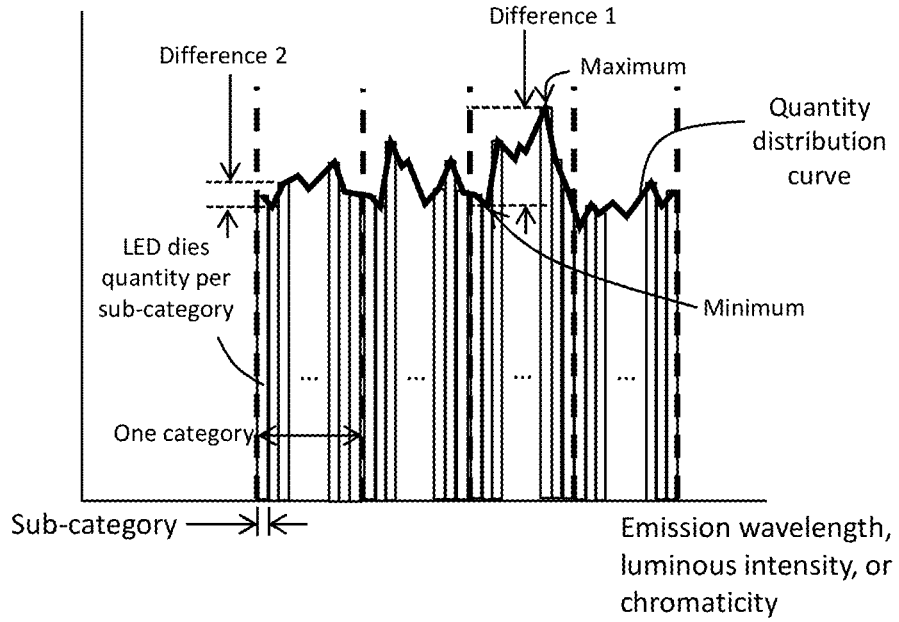
Figures 3, 39:
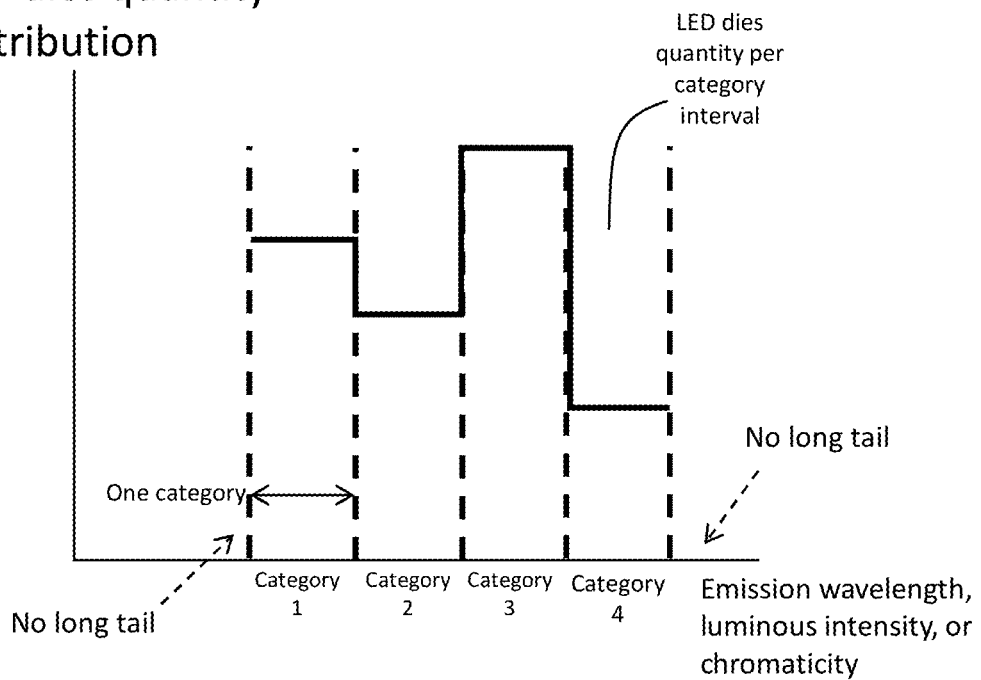
Figures 4, 39:
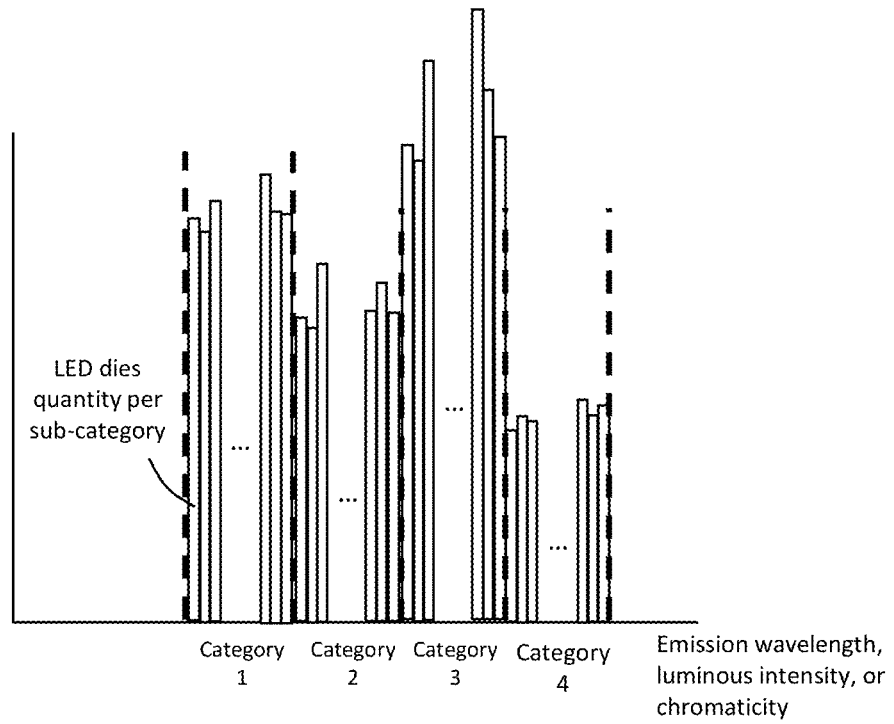
Figures 5, 39:
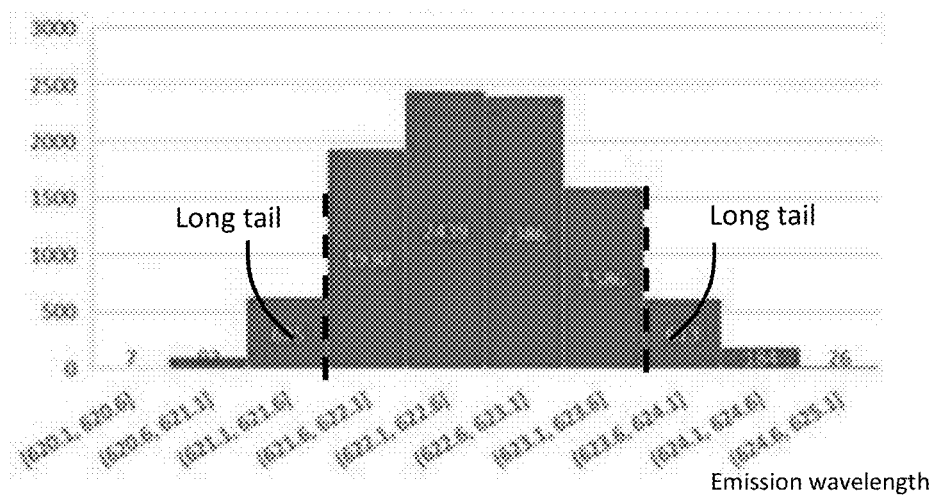
Figures 6, 39:
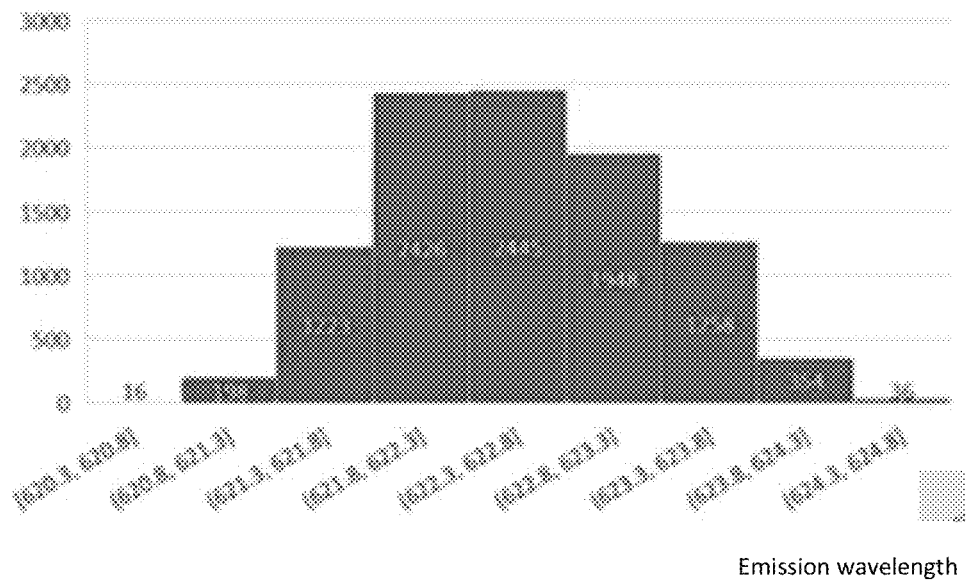
Figures 7, 39:
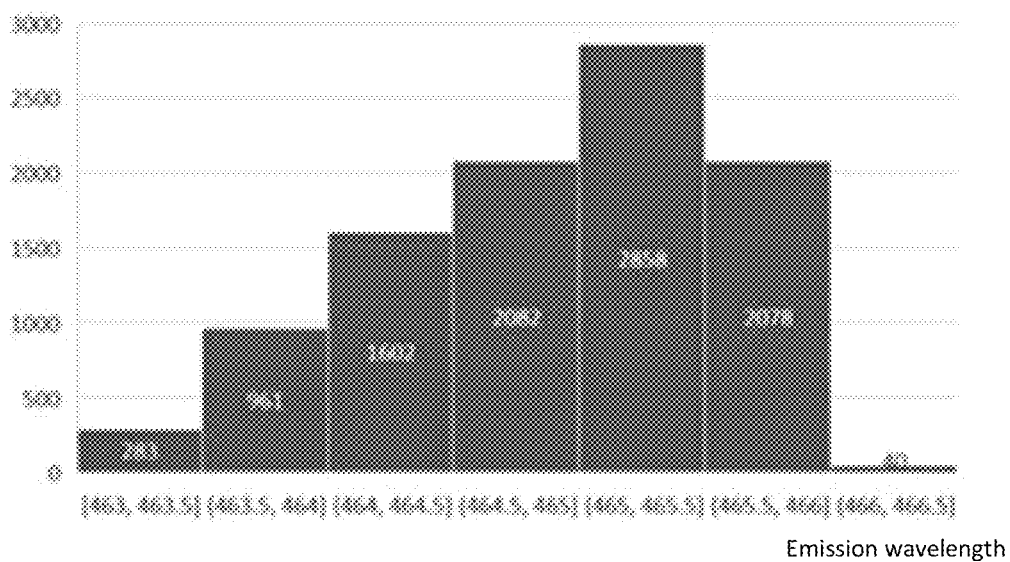

FIG. 39-2 is an example of the detail contribution of FIG. 39-1. Each category of the same emission color is divided into a plurality of sub-categories, and a quantity distribution curve is provided to show a plurality of LED dies quantities respectively corresponding to each of the sub-categories within one category, wherein the quantity distribution curve in a matrix is not a normal (Gaussian) distribution curve. However, the divergence level of the LED dies on the carrier can be determined not only by the number deviation between the quantities of LED dies of the different categories in a matrix. That is, the divergence level of the LED dies on the carrier can be determined according to the deviation of the LED dies quantity distribution within one category. Further, according to the present invention, the LED dies quantity distribution curve should not be a normal distribution curve or not be a Gaussian distribution curve. The LED dies quantity distribution curve could be a substantially straight line, or a curve having a plurality of step-shaped straight lines. Further, the quantity distribution curve has no single peak, neither long tail on a minimum limit or a maximum limit of the LED dies quantity distribution curve (referring to FIG. 39-5 and explanation in later paragraph). On the second-stage carrier, the numbers of the LED dies of different categories can optionally have a predetermined quantity priority with the numbers of LED dies of different categories are substantially equal to each other or proportional to each other.

Please refer to FIGS. 39-3-39-4, in the "predetermined quantity priority of categories proportional to each other" embodiment, the numbers of the LED dies of different categories substantially have a predetermined quantity priority on the carrier (for example, a number of LED dies of category 3>a number of LED dies of category 1>a number of LED dies of category 2>a number of LED dies of category 4). The LED dies quantity distribution curve should not be a normal distribution curve or not be a Gaussian distribution curve (Please refer to FIGS. 39-5 to 39-7, wherein the quantity distributions of LED dies according to prior art, are in a normal distribution curve, because the prior LED mixing has no category selecting process of the present invention, by selecting LED dies of one category from the wafer before placing on the carrier). The LED dies quantity distribution curve could be a step shaped curve. The LED dies on the carrier can be divided into a plurality of two-dimension square matrices identical in matrix dimension. When the numbers of the LED dies of the different categories of the same emission color in a matrix similarly have the predetermined quantity priority, the matrices are conformed. That is, when the divergence level is high enough, the feature of predetermined quantity priority is maintained in the matrices. According to the present invention, a ratio of a number of the conformed matrices to all of the matrices on the carrier is larger than a threshold ratio. In one embodiment, the threshold ratio is 5%, 10%, 30%, 40%, 50%, 80%, or other ratios.

In the "predetermined quantity priority of categories proportional to each other" embodiment, the present invention provides another matrix conforming determination concept. The quantity deviation between different matrices is less than 5%, 10%, 15%, or 20%. In detail, the differences of each quantity deviation between the quantities of LED dies are less than 5%, 10%, 15%, or 20%, In one embodiment, a first predetermined quantity priority of the plurality of light-emitting elements of each category of the same emission color of a first matrix, is the same as a second predetermined quantity priority of the plurality of light-emitting elements of each category of the same emission color of a second matrix; and when a first number of the plurality of light-emitting elements of one specific category of the same emission color of the first matrix, is within a quantity deviation of a second number of the plurality of light-emitting elements of the same category of the same emission color of the second matrix, the first matrix and the second matrix are considered to have the same predetermined quantity priority.

Figure 38:
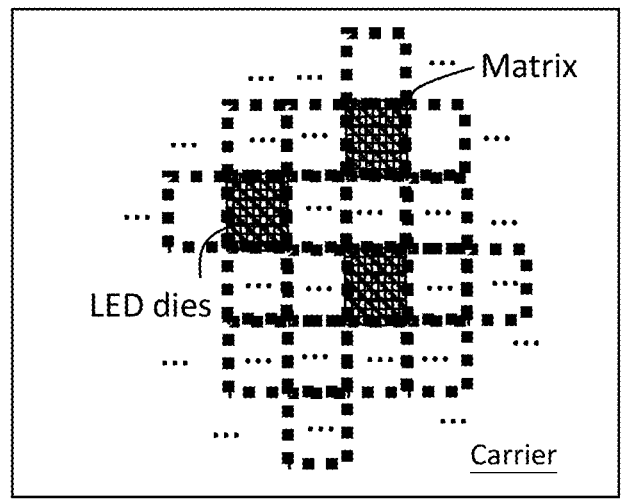

Please refer to FIG. 38, in case of different categories substantially equal to each other or proportional to each other, in one embodiment, the assigned number of the LED dies assigned to each category in the matrix, are determined by a number of the LED dies based on the predetermined category ratio assigned to each category in the matrix, or based on a number of the LED dies assigned to each category in a reference matrix on the carrier. For example, the reference matrix can have the lowest difference between the actual number and an average of the actual numbers assigned to each category of the all matrices on the carrier.

In one embodiment, a range of each category can be decided by functional needs. For example, the range of each category can be a wavelength span of less than 2 nm (for example, 0.1 nm, 0.5 nm, 1 nm, 2 nm or others). Further, a range of each sub-category can be a wavelength span of less than 2 nm (for example, 0.1 nm, 0.5 nm, 1 nm, 2 nm or others). Importantly, the range of the sub-category is narrower than the category, and it can be decided according to the capability of optical wavelength detecting facility. In one embodiment, the lowest wavelength limit and the highest wavelength limit of the x-axis of the quantity distribution diagram is an integer. The lowest wavelength limit is determined by the closet integer value larger than the minimum emission wavelength of the LED dies in the matrix. The highest wavelength limit is determined by the closet integer value smaller than the maximum emission wavelengths of the LED dies in the matrix.

In another embodiment, the range of each category can be luminous intensity level determined by optical power (Po (mW)) or luminous intensity (Iv(mcd)). For example, a range of each category can be a deviation ratio of luminous intensity level of 5%~10%, for example, 8%. The deviation ratio of luminous intensity is defined as the ratio be maximum value and the minimum value of the luminous intensity levels of the LED dies (for example, the LED dies of the same emission color, or different emission colors).

According to one perspective, the present invention provides a system of processing LED dies, which includes an optical inspection device assigning a plurality of categories to a plurality of LED groups on at least one wafer; a first transfer tool transferring the LED groups of the same category from each of the at least one wafer to a substrate; a second transfer tool, transferring the LED dies from more than one of the substrates of at least one category of the same emission color to a first-stage carrier based on a first predetermined pattern; and a third transfer tool transferring the LED dies from the first-stage carriers of at least one emission color to a second-stage carrier based on a second predetermined pattern. The first predetermined pattern arranges two adjacent LED dies in a first direction on each of the substrates, to be placed on two non-adjacent positions in the first direction on one of the first-stage carriers.

In the embodiment of the system of processing LED dies, the first, second, and third transfer tools comprise a picking function for holding the LED dies from the substrates or the carriers, and a placing function for placing the LED dies on the substrates or the carriers.

In the aforementioned description of the first embodiment, a dimension of the LED groups can be predetermined. However, a category distribution on different wafers is usually at random; that is, the dimensions and location arrangements of LED groups can be flexible to better fit different category distributions on different wafers. In one embodiment, after the step of determining the categories of the LED dies, the determined category information of LED dies on the wafers can be used to analyze an optimal dimension of the light-emitting element groups for dividing the LED dies on the wafer, based on a possible largest dimension of the LED group, to include the LED dies of the same category in the same LED groups. This analysis can be done by a computing system, or other devices with calculation capability.

Second Embodiment

Figure 40:
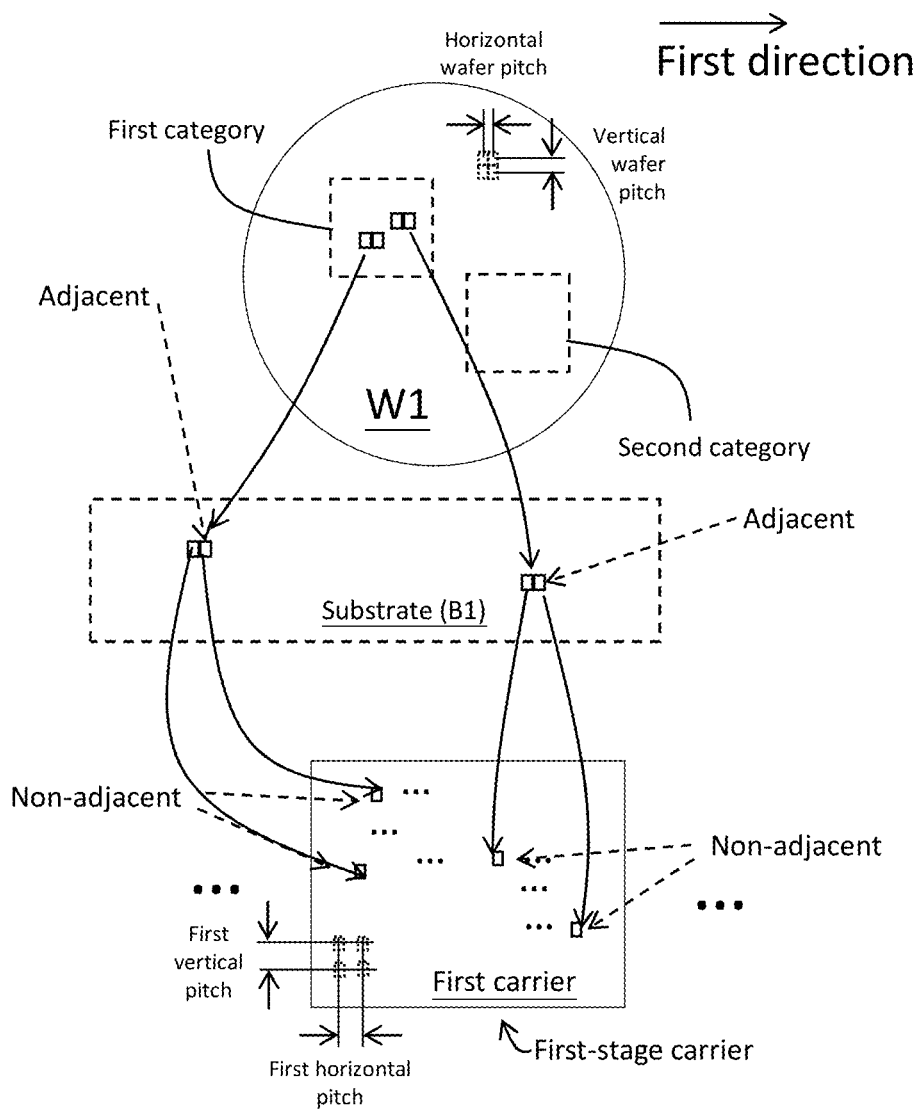
FIGS. 40 to 44 are operational schematic diagrams showing a method of processing light-emitting elements according to a second embodiment of the present invention.
Figure 41:
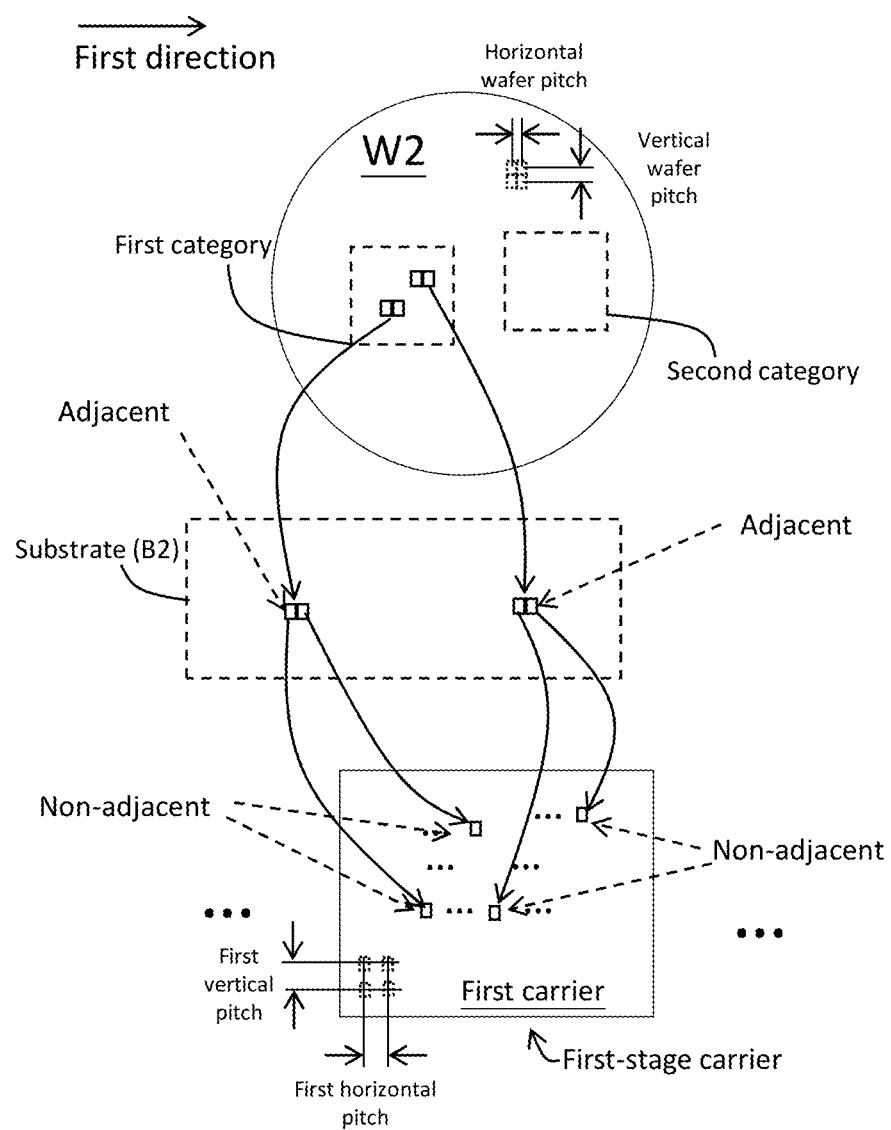

With reference to FIGS. 40 and 41, the present invention provides a method of processing LED dies by picking LED dies with a first category and a second category from wafers. The method includes: individually assigning a category to each LED die of a plurality of wafers (for example, wafers W1 and W2, in FIGS. 40 and 41), wherein the category includes a first category and a second category; and transferring a plurality of LED dies (the LED dies can be one by one transferred to next carrier, or the LED dies can be transferred to next carrier by a configuration of a plurality of LED groups) with the first category from the wafer W1 to a substrate B1, and from the wafer W2 to a substrate B2. In other words, the LED dies having the same optical property, such as the same emission wavelength, or the same luminous intensity level, on the same wafer are transferred to the same substrate. In FIGS. 40 and 41, the first predetermined pattern arranges two adjacent LED dies with the first category in a first direction on each substrate (B1 or B2) to be placed on two non-adjacent positions in the first direction on a first carrier for the first-stage carrier. The LED dies on each wafer (W1 or W2) have a horizontal wafer pitch and a vertical wafer pitch, the LED dies on the first carrier have a first horizontal pitch and a first vertical pitch. The second horizontal pitch of the LED dies on the second-stage carrier is greater than the first horizontal pitch, or the second vertical pitch of the LED dies on the second-stage carrier is greater than the first vertical pitch.

In the second embodiment, the LED dies on the first carrier belong to the first category; that is, the LED dies on the same first-stage carrier have the same category. The category of each LED die may be selected from one or more of the emission wavelengths, luminous intensity levels, and chromaticity scales.

The number of the wafers in the aforementioned embodiments, can be decided according to application purpose; for example, at least two, three, four, or five wafers.

Figure 42:
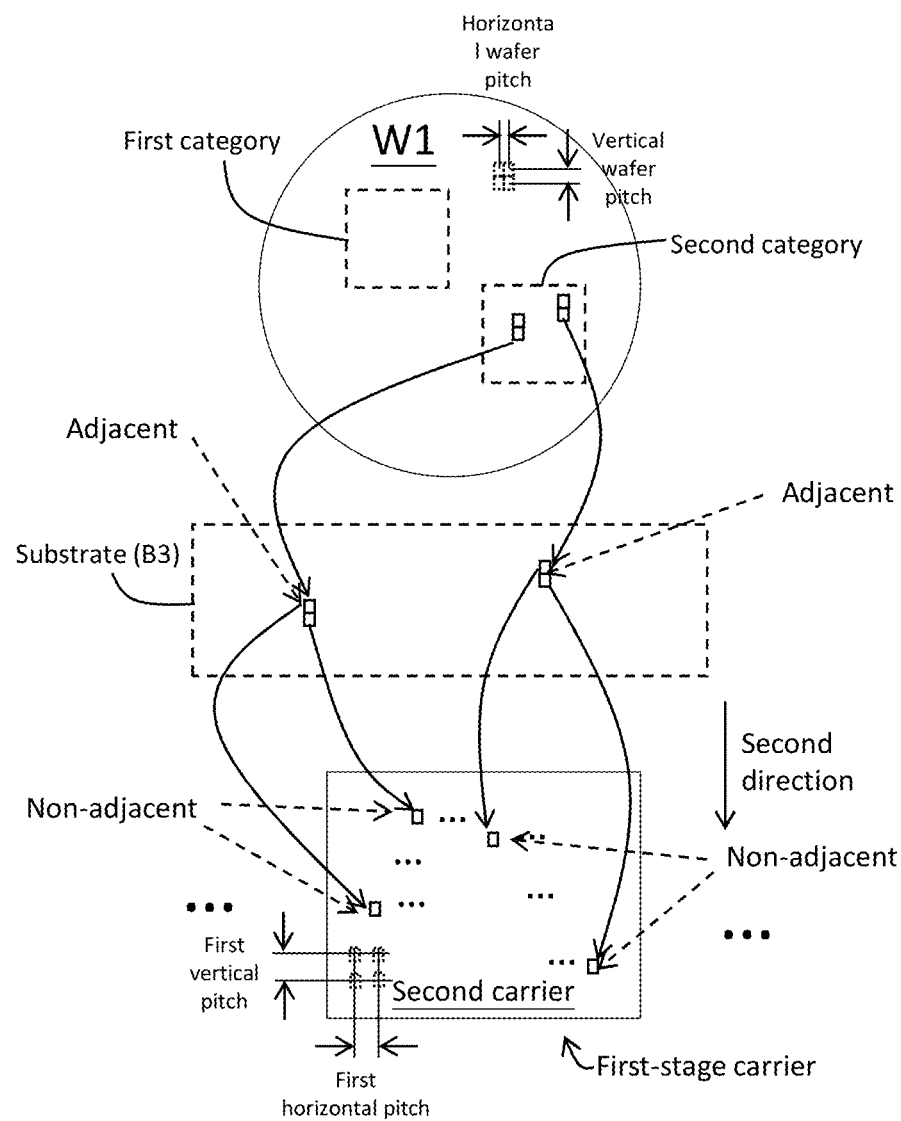
Figure 43:
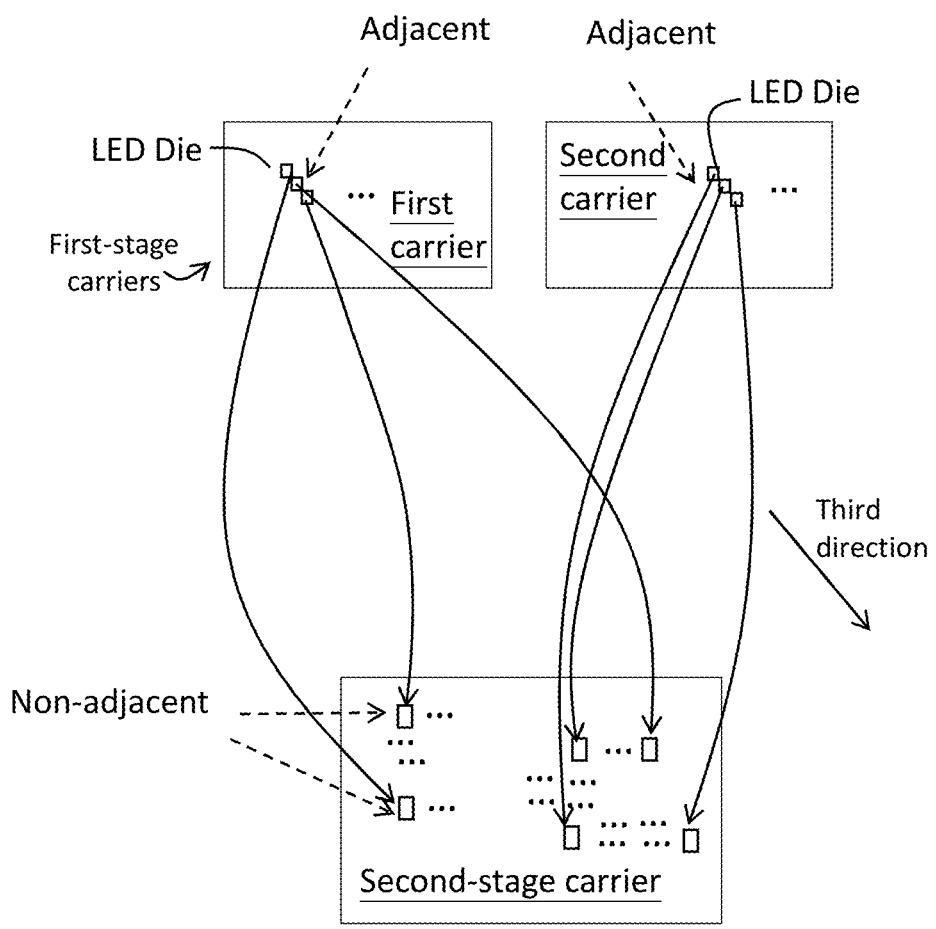

Please refer to FIGS. 42 and 43, the method further include: transferring a plurality of LED dies with the second category from the wafer (for example, wafer W1 in FIG. 42) to a substrate B3; transferring the LED dies from the substrate B3 to a second carrier for the first-stage carrier based on the first predetermined pattern; and transferring the LED dies with the first category from the first carrier, and the LED dies with the second category from the second carrier, to a second-stage carrier based on a second predetermined pattern. In FIG. 43, the second predetermined pattern arranges two adjacent LED dies with the second category in a third direction on substrate B3 to be placed on two non-adjacent positions in the third direction on the second-stage carrier.

Figure 44:
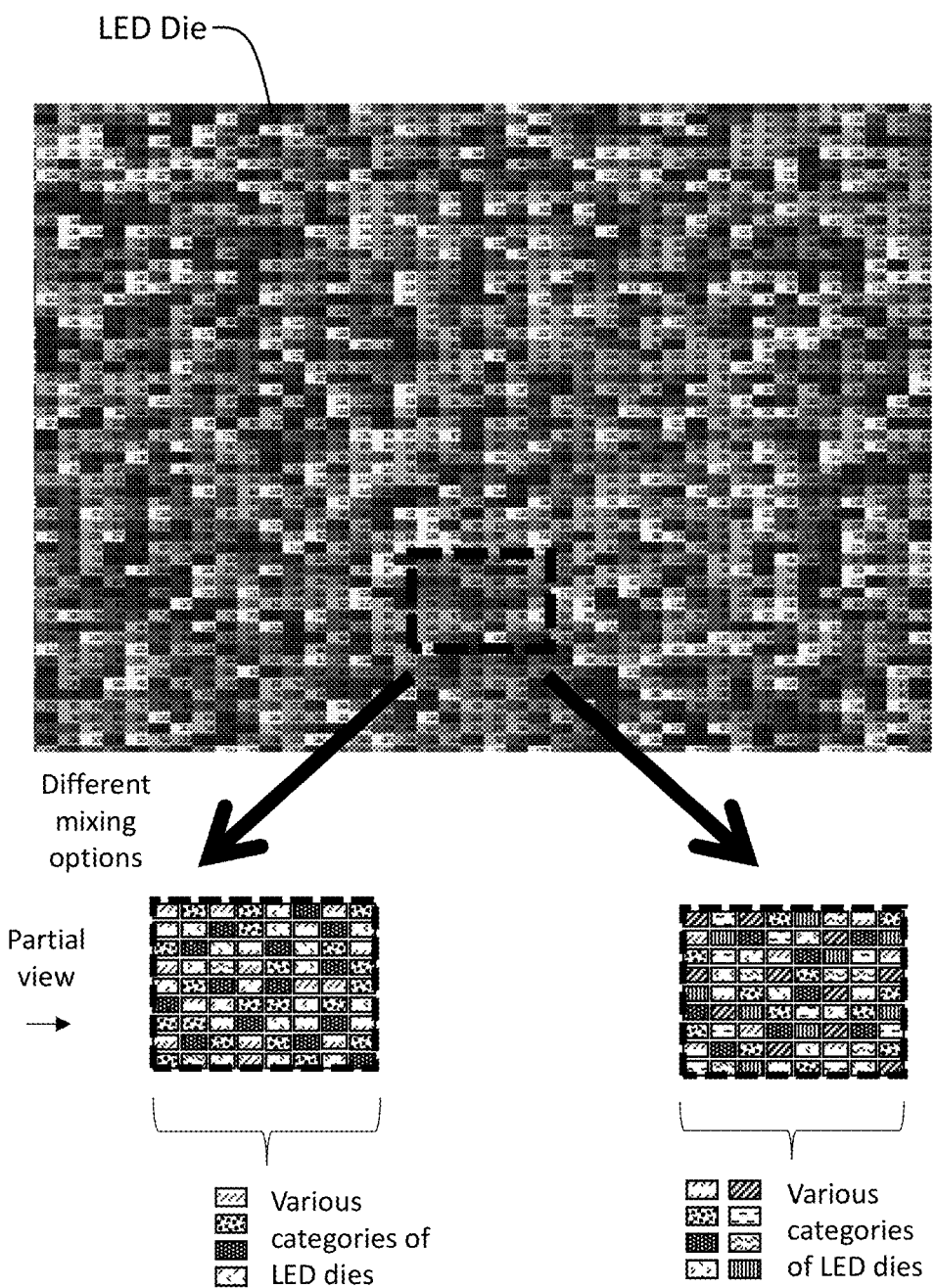

In the second embodiment, at least one of the first predetermined pattern and the second predetermined pattern may be formed according to a positioning sequence, wherein the positioning sequence includes a plurality of picking positions of the LED dies from the first-stage carriers, and a plurality of placing positions of the LED dies on the second-stage carrier. For example, the second predetermined pattern arranges the LED dies from one first-stage carrier to the second-stage carrier, according to the positioning sequence, which forms a mapping relation between the LED dies of the first-stage carrier to the LED dies of the second-stage carrier. The positioning sequence includes a first positioning sequence and a second positioning sequence for mapping the column and rows of LED dies on the first-stage carriers, to the column and rows of the second-stage carrier according to a specific sequence. The first positioning sequence and the second positioning sequence are the positioning sequences applied along different directions. For example, the horizontal and vertical directions (for example, X-direction for the horizontal direction, and Y-direction for the vertical direction), or the positive and negative slope diagonal directions. For example, when a first element in the first positioning sequence is 1, and a first element in the second positioning sequence is also 1, the location of the first elements in the first and second positioning sequences corresponds to (1, 1). A first LED dies on the first-stage carrier, is mapped to position (1, 1) on the second-stage carrier. An offset between one element and a next element picked through the first positioning sequence (or the second positioning sequence), can be selected from a group of various offsets specifying spacing counts of LED dies (or spacing counts of LED groups) between one placed and next placed LED dies with a spacing accommodating a different count of the LED dies therebetween. In one point of view, the elements picked through the first positioning sequence and the second positioning sequence are randomly selected from a group of mapping positions of the LED dies to be placed respectively. For example, a group of the offsets includes −3, −1, 2, 3, and 4. The offsets selected from the group for the first positioning sequence are sequentially 2, −1, 4, 3, 2, and −1, and the offsets selected from the group for the second positioning sequence are sequentially 4, 2, 3, −1, 2, and 3. Thus, the positions for placing the LED dies in the horizontal direction are sequentially 3, 2, 6, 9, 11, and 10, and the positions for placing the LED dies in the vertical direction are sequentially 5, 7, 10, 9, 11, and 14. In short, the positions for placing the LED dies are sequentially (3, 5), (2, 7), (6, 10), (9, 9), (11, 11), and (10, 14), in forms of (positions in the horizontal, positions in the vertical direction). Please refer to a top partial view in FIG. 44, which illustrates a result of LED mixing according to the aforementioned positioning sequence. In FIG. 44, the LED dies are shown in several gray scales, which correspond to different categories of the LED dies. As shown in FIG. 44, the LED die distribution is in a highly divergent status. Please refer to a partial view on the bottom of the FIG. 44, wherein various categories (4 or 6 categories) of the LED dies are highly distributed and the highly divergent status is obtained. If necessary, the group of the offsets can include more numbers besides the aforementioned −3, −1, 2, 3, and 4; for example, 5, 6, 7, etc.

In the second embodiment, the second predetermined pattern may arrange two adjacent LED dies with the first category and two adjacent LED dies with the second category, in a third direction (FIG. 43) on each of the first-stage carrier, to be placed on two non-adjacent positions in the third direction on the second-stage carrier. That is, the first direction, the second direction, and the third direction may be selectively aligned in a horizontal direction, a vertical direction, a positive slope diagonal direction, or a negative slope diagonal direction (referred to the explanation of FIG. 5).

Figure 45:
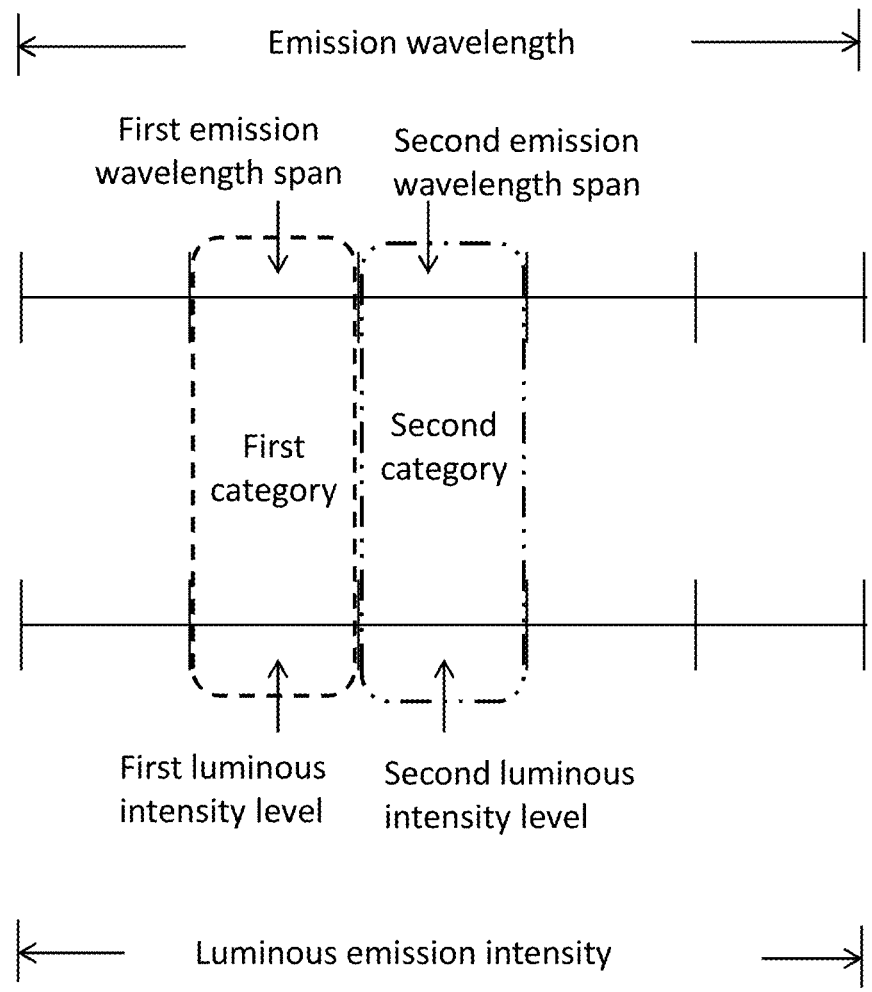
Figure 46:
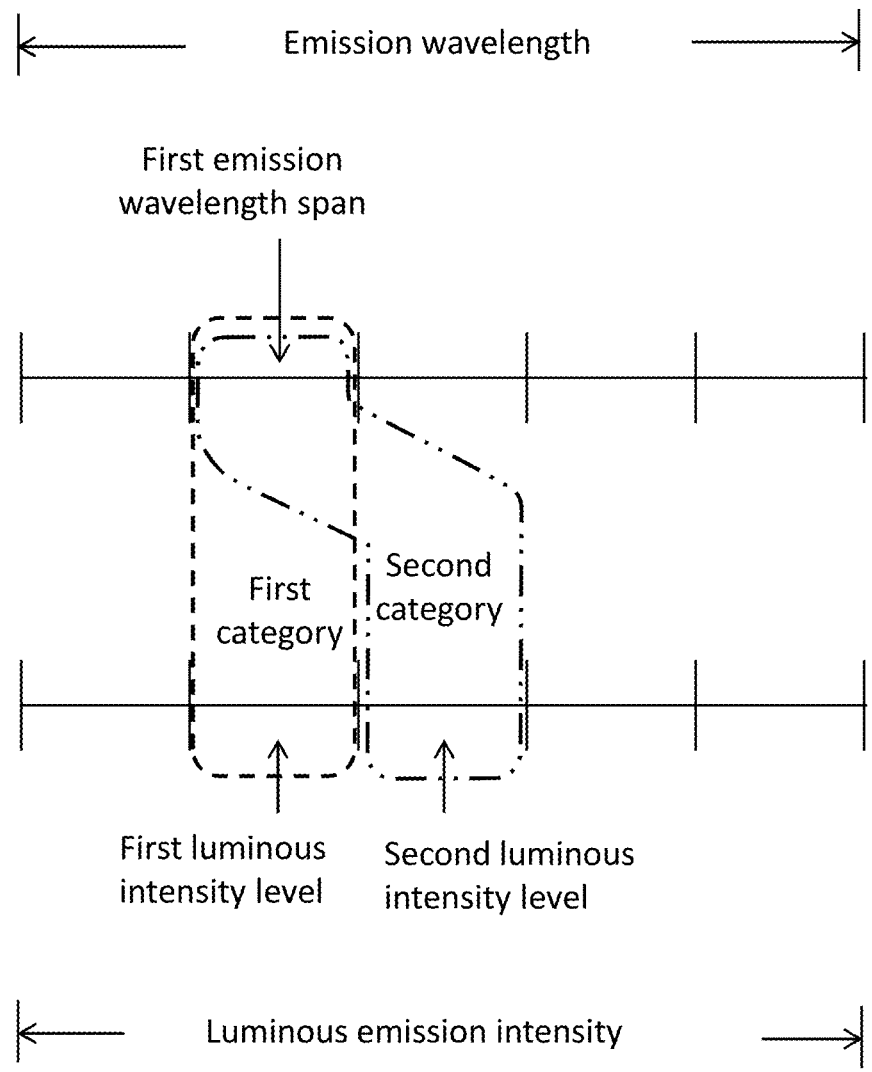
Figures 1, 46:
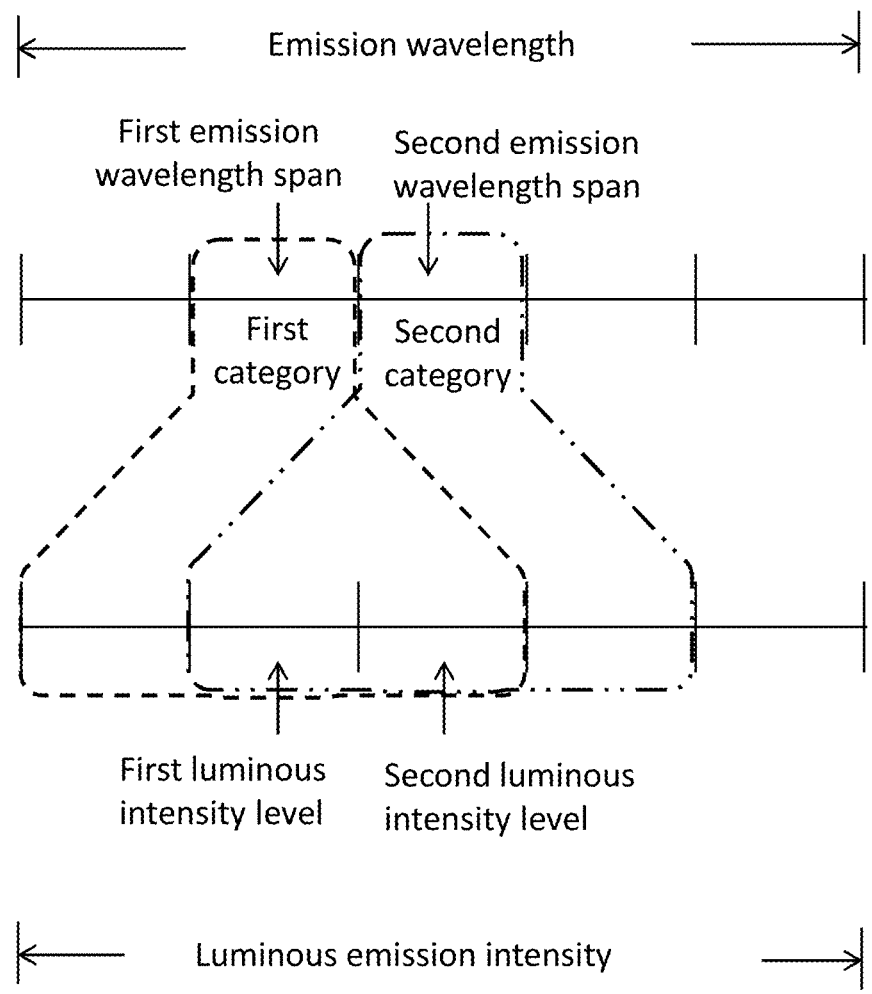

Please refer to FIG. 45, the first category of the LED dies belonging to a first emission wavelength span and a first luminous intensity level, and the second category of the LED dies belong to a second emission wavelength span and a second luminous intensity level. Please refer to FIG. 46, the first category of the LED dies belonging to the first emission wavelength span and the first luminous intensity level, and the second category of the LED dies belonging to the first emission wavelength span and a second luminous intensity level. Please refer to FIG. 46-1, the first category of the LED dies belonging to the first emission wavelength span, the first luminous intensity level, and another luminous intensity level next to the first luminous intensity level. The second category of the LED dies belonging to the second emission wavelength span, the second luminous intensity level, and another luminous intensity level next to the second luminous intensity level. FIGS. 45, 46 and 46-1 illustrate three embodiments of the present invention, they show that the categories can be flexibly decided according to embodying purpose and the user can decide what the category of the LED dies may include. For example, the first and second categories merely have different luminance levels. Or, the first and second categories respectively have different emission wavelength span. In an embodiment, the first category of the LED dies is belonged to the first emission wavelength span and a luminous intensity level including the first luminous intensity level and the second luminous intensity level. In an embodiment, the LED dies of the first category and the LED dies of the second category have different luminous intensity levels and/or different emission wavelength spans. That is, the categories of the LED dies can be defined according to embodying purpose, which are not limited to the above illustrated embodiments.

In one embodiment, the LED dies with the first category and the LED dies with the second category are respectively placed on the first-stage carriers by a transfer process. With reference to FIG. 6, in one embodiment, the transfer printing process includes: picking a part of the LED dies by adhering the picked LED dies from the substrates on an adhesive layer of a transfer tool (S11); and placing (or, releasing) the picked LED dies from the adhesive layer by forming the populated bulges on one of the first-stage carriers (S12).

Figure 47:
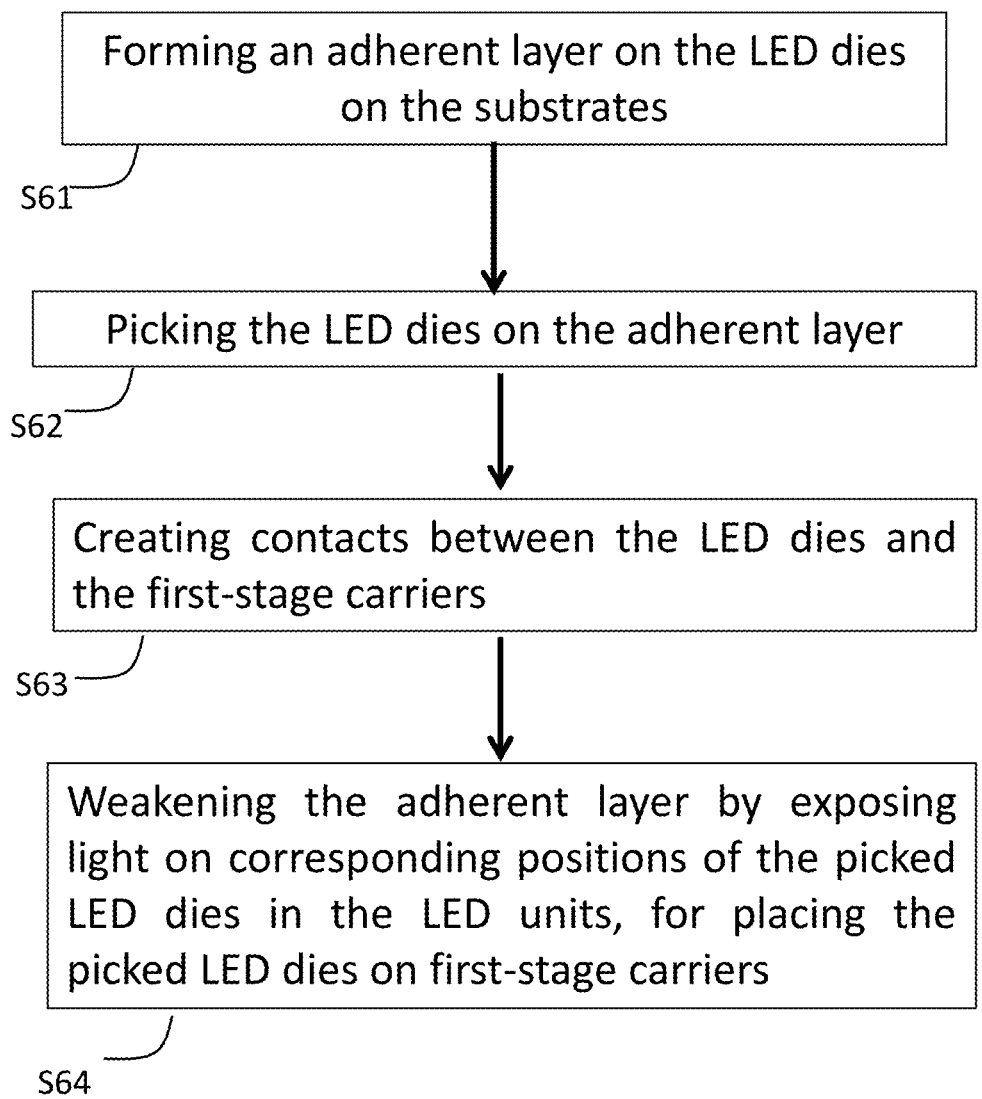
FIG. 47 is a flow diagram showing an embodiment of a direct release layer process according to the present invention.

In one embodiment, the LED dies with the first category and the LED dies with the second category are respectively placed on the first-stage carriers by a direct release layer process. With reference to FIG. 47, in one embodiment, the direct release layer process includes: forming an adherent layer on the LED dies of the substrates (S61); picking the LED dies on the adherent layer from the substrates (S62); creating contacts between the LED dies and the first-stage carriers (S63); and weakening the adherent layer by exposing corresponding positions of the picked LED dies in the LED units to light, for placing the picked LED dies on the first-stage carriers (S64).

Third Embodiment

Figure 48:
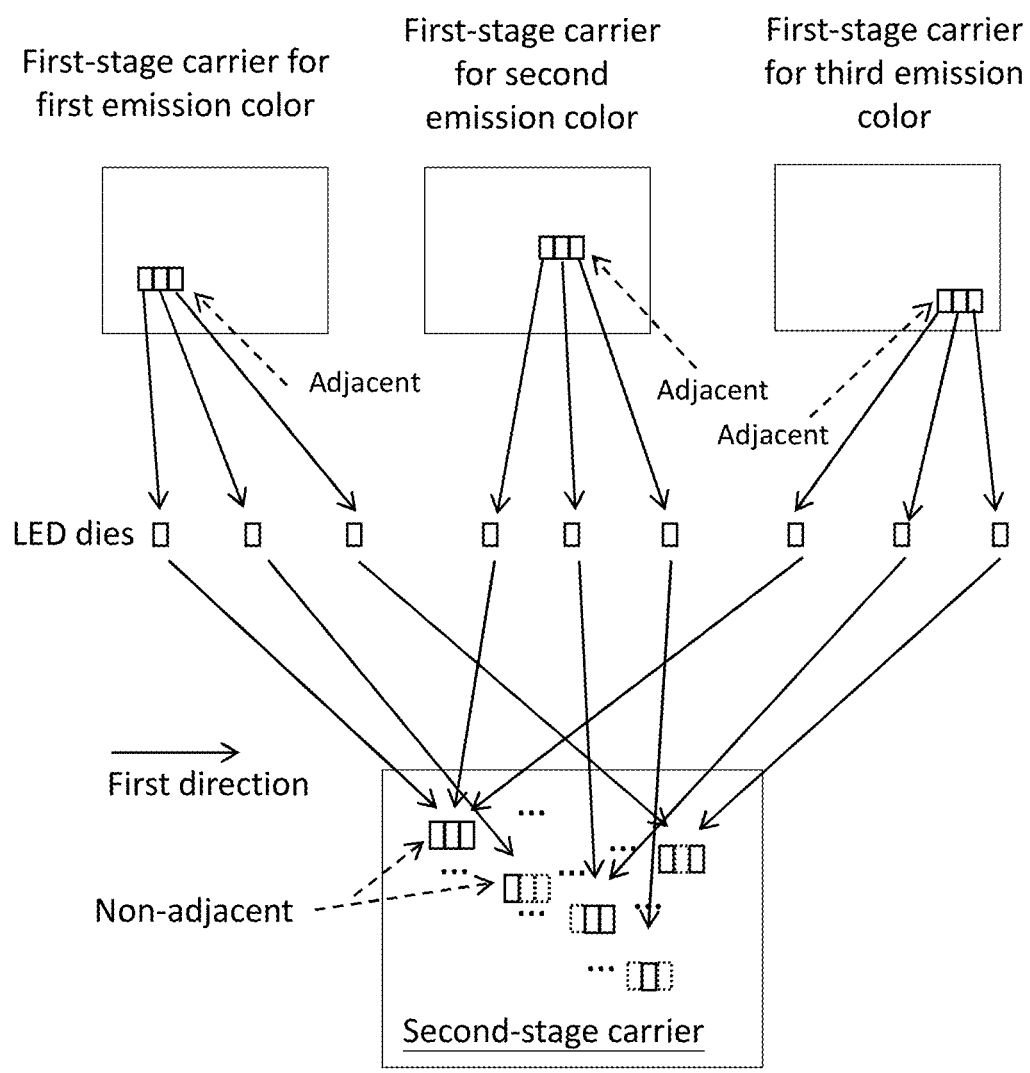
FIGS. 48 and 49 are schematic diagrams showing a method of processing light-emitting elements according to a third embodiment of the present invention.

Please refer to FIG. 48, wherein the present invention provides a method of processing LED dies with a plurality of emission colors. The method includes: selecting a plurality of pre-mixed LED dies with a plurality of emission colors (for example, red, green, and blue); and placing the pre-mixed LED dies with each emission color on a carrier based on a predetermined pattern. The predetermined pattern arranges a plurality of adjacent pre-mixed LED dies with each emission color on the first-stage carriers, to be placed on a plurality of non-adjacent positions in a first direction on the second-stage carrier.

In one embodiment, the pre-mixed LED dies with the plurality of emission colors collectively generate white emission color light. For example, when the emission colors of the pre-mixed LED dies include red and green, the pre-mixed LED dies may collectively generate yellow light. Or, the pre-mixed LED dies with the plurality of red, green, and blue emission colors, collectively generate white emission color light.

Figure 49:
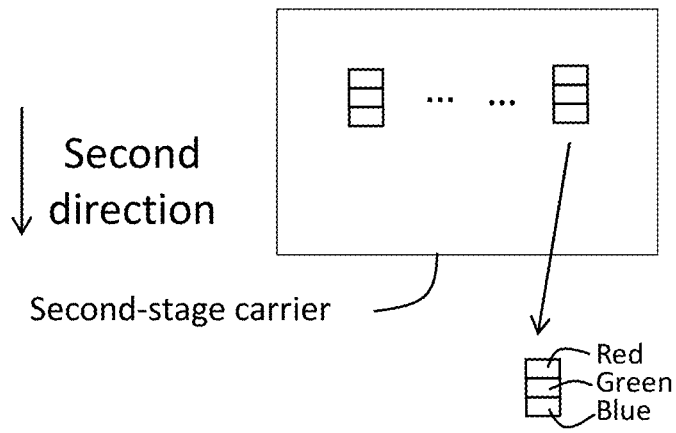

With reference to FIG. 49, the predetermined pattern arranges the pre-mixed LED dies with the emission colors including red, green, and blue, to be placed in an order of red, green, and blue of the emission colors in a second direction on the second-stage carrier.

In FIGS. 48 and 49, the first and second directions are shown as two independent directions. Each of the first direction and the second direction can be selectively aligned in at least one of the horizontal direction, the vertical direction, the positive slope diagonal direction, and the negative slope diagonal direction. Or, the first direction (or the second direction) may be a combination of two of the directions which are not parallel to each other. The first direction (or the second direction) is selectively aligned in one of the horizontal direction, the vertical direction, the positive slope diagonal direction, and the negative slope diagonal direction.

In the third embodiment, the pre-mixed LED dies may be placed on the second-stage carrier by a transfer process. The transfer process of the third embodiment is similar to the transfer printing processes of the first and second embodiments, please refer to the above descriptions of FIG. 6. In this embodiment, the pre-mixed LED dies can be referred to the LED dies in the first and second embodiment. The transfer printing process of the third embodiment includes: picking a part of the pre-mixed LED dies by adhering the picked pre-mixed LED dies on an adhesive layer of a transfer tool, wherein the plurality of populated bulges correspond to the positions of the picked pre-mixed LED dies respectively; and placing (or, releasing) the picked pre-mixed LED dies from the adhesive layer by forming populated bulges respectively corresponding to the picked LED dies on one of the plurality of the second-stage carrier.

In one embodiment, the pre-mixed LED dies are placed on the second-stage carrier by a direct release layer process. The transfer printing process of the third embodiment is similar to the transfer printing processes of the first and second embodiments, please refer to the above descriptions of FIGS. 7 and 47. In this embodiment, the pre-mixed LED dies can be referred to the LED dies in the first and second embodiment. The direct release layer process of the third embodiment may include: forming an adherent layer on the pre-mixed LED dies on the first-stage carrier; individually defining the pre-mixed LED dies on the first-stage carrier, as a plurality of pre-mixed LED units, and picking the pre-mixed LED dies on the adherent layer from the first-stage carrier with each pre-mixed LED unit having a first-directional dimension and a second-directional dimension, wherein the first-directional dimension corresponds to the second horizontal pitch and the second-directional dimension corresponds to the second vertical pitch; creating contacts between the picked pre-mixed LED dies and the second-stage carrier; and weakening the adherent layer by exposing corresponding positions of the picked pre-mixed LED dies in the LED units to light, to place the picked pre-mixed LED dies from the adherent layer to the second-stage carrier. The direct release layer process of the third embodiment is similar to the direct release layer process of the first embodiment, please refer to figures and related description of the first embodiment. In this embodiment, the pre-mixed LED dies can be referred to the LED dies arranged in the first embodiment.

The picked pre-mixed LED dies in the third embodiment (referred to the picked LED dies of the first embodiment) on the first-stage carrier can be applied to the transferring method depicted in FIGS. 8 to 23 by replacing the LED dies on the first-stage carrier. The details of the transferring method can be referred to previous sections and are thus omitted for brevity. Besides, the predetermined pattern of the third embodiment may further arrange the pre-mixed LED dies (referred to the LED dies in the figures) by including: (a) selecting the first-stage carrier (T1,1) (FIG. 9); (b) assigning a first sequence integer in the unit-mapping table (first sequence integer=1 in the unit-mapping table 1, FIG. 9); (c) on the selected first-stage carrier (T1,1), sequentially picking the pre-mixed LED dies from the LED units on the matrices corresponding to the first sequence integer in the unit-mapping table, and placing the picked pre-mixed LED dies on different sub-arrays on the second-stage carrier (FIGS. 9 and 10), until the (R1×R2) pre-mixed LED dies on the LED units corresponding to the first sequence integers in the unit-mapping table 1 are fully picked; (d) at least assigning a second sequence integer in the unit-mapping table (second sequence integer=2 in the unit-mapping table 1, FIG. 11) for the selected first-stage carrier (T1,1); on the selected first-stage carrier (T1,1), sequentially picking the pre-mixed LED dies from the LED units corresponding to the second sequence integer in unit-mapping table, and placing the picked pre-mixed LED dies on other sub-arrays on the second-stage carrier (FIG. 11), until the (R1×R2) pre-mixed LED dies in the LED units corresponding to the second sequence integer in the unit-mapping table are fully picked (FIG. 12); and (e) selecting a next first-stage carrier, and repeating the steps (b) to (d) (FIGS. 14 to 23). Importantly, the number of the LED units in each two-dimensional matrix is a multiple of the number of the first-stage carriers for providing the LED dies transferred to the second-stage carrier. For example, when different first-stage carriers respectively provide red, green, and blue emission color LED dies, each second stage carrier includes a plurality of LED dies of red, green, and blue emission colors. The second horizontal pitch h2 is X times of the first horizontal pitch h1 (h2=X×h1). The second vertical pitch v2 is Y times of the first vertical pitch v1 (v2×v1); and X and Y are larger than Upon transferring the LED dies from the first-stage carriers to the second stage carrier, the LED dies on each of L number of the first-stage carriers to be transferred to the second stage carrier are grouped into a plurality of units; each unit contains X×Y number of LED dies in a two dimensional matrix (X,Y).

The predetermined pattern of the third embodiment can be applied to the transferring method depicted in FIGS. 24 to 35 by replacing the LED dies on the first-stage carrier. The details of the transferring method can be referred to previous sections and are thus omitted for brevity.

In an embodiment, three sequence integers are used for mapping LED dies of the first-stage carrier in the LED picking sequence depicted above. Furthermore, please refer to FIGS. 36-1 to 36-3, wherein several unit-mapping tables exemplified are other options for picking and placing the LED dies. The user can decide the suitable unit-mapping table according to application purpose.

In an embodiment, the unit-mapping tables for the three sequence integers can be not limited to the aforementioned square 3×3 matrices. For example, please refer to FIGS. 36-4 to 36-9, wherein the unit-mapping tables can be rectangle 3×4 matrices, 3×5 matrices, or other kinds of the unit-mapping tables. Moreover, the number of the sequence integers may not be limited to three. For example, four is also a possible sequence integer for pitching and mixing the LED dies. Please refer to FIGS. 36-10 and 36-11, wherein the examples of the unit-mapping tables for the four sequence integers are shown. Therefore, according to the present invention, the sequence integer can be decided according to a number of the wafers providing the LED dies, such as, two, five, or other integers, and the related unit-mapping tables can be correspondingly modified.

The predetermined pattern of the third embodiment may be applied to processes depicted in FIGS. 37 to 37-2. The details can be referred to previous sections, and are omitted for brevity. Besides, the predetermined pattern arranges the pre-mixed LED dies by including: (a) setting a leading sequence integer in the unit-picking sequence to a current carrier number of a selected one of the carriers and an initial sequence integer; (b) selecting L LED units of the selected carrier mapped by L sets of rows and columns of the numbers in the unit-mapping table, wherein the numbers in the unit-mapping table are identical to the leading sequence integer of the unit-picking sequence, and sequentially arranging L pre-mixed LED dies at each identical set of the respective mapped LED units on the rows and columns of one of sequentially selected from the matrices, wherein the rows and columns of the mapped LED units on selected matrices are identical to the rows and columns of the arranged L pre-mixed LED dies on the sub-array, until all the pre-mixed LED dies of the mapped LED units are fully arranged; (c) rearranging the unit-picking sequence with the leading sequence integer thereof to be trailed to each of the remaining sequence integers thereof by moving one position ahead in the unit-picking sequence; (d) incrementing the current carrier number by one; and (e) reinitializing the unit-picking sequence, sequentially rearranging the leading sequence integer of the unit-picking sequence to be trailed to each of the remaining sequence integers thereof by moving one position ahead in the unit-picking sequence until the leading carrier number in the unit-picking sequence is equal to the current carrier number, and resuming step (a).

According to the above-mentioned embodiments of mixing LED methods, the diversity of the LED dies distribution can be obtained. Therefore, the present invention provides an LED supply carrier or a light-emitting element device having a highly divergent distribution of the emission wavelengths, luminous intensity levels, or chromaticity scales of the LED dies.

Fourth Embodiment

Figure 50:
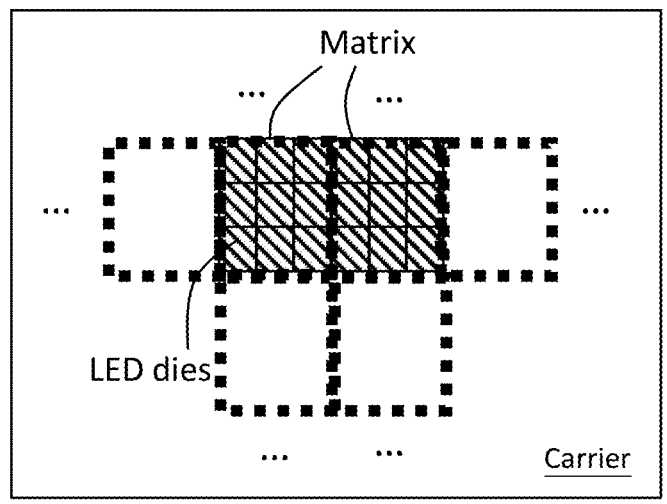
FIGS. 50 and 51 are schematic diagrams showing LED supply carriers according to a fourth embodiment of the present invention.
Figure 50:
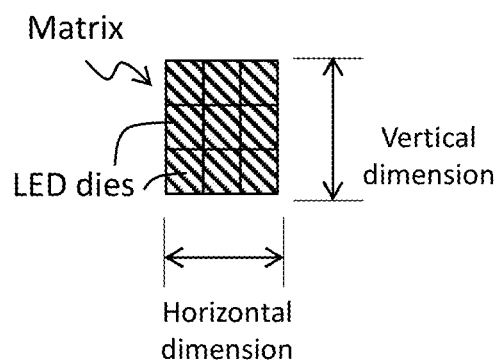
Figure 51:
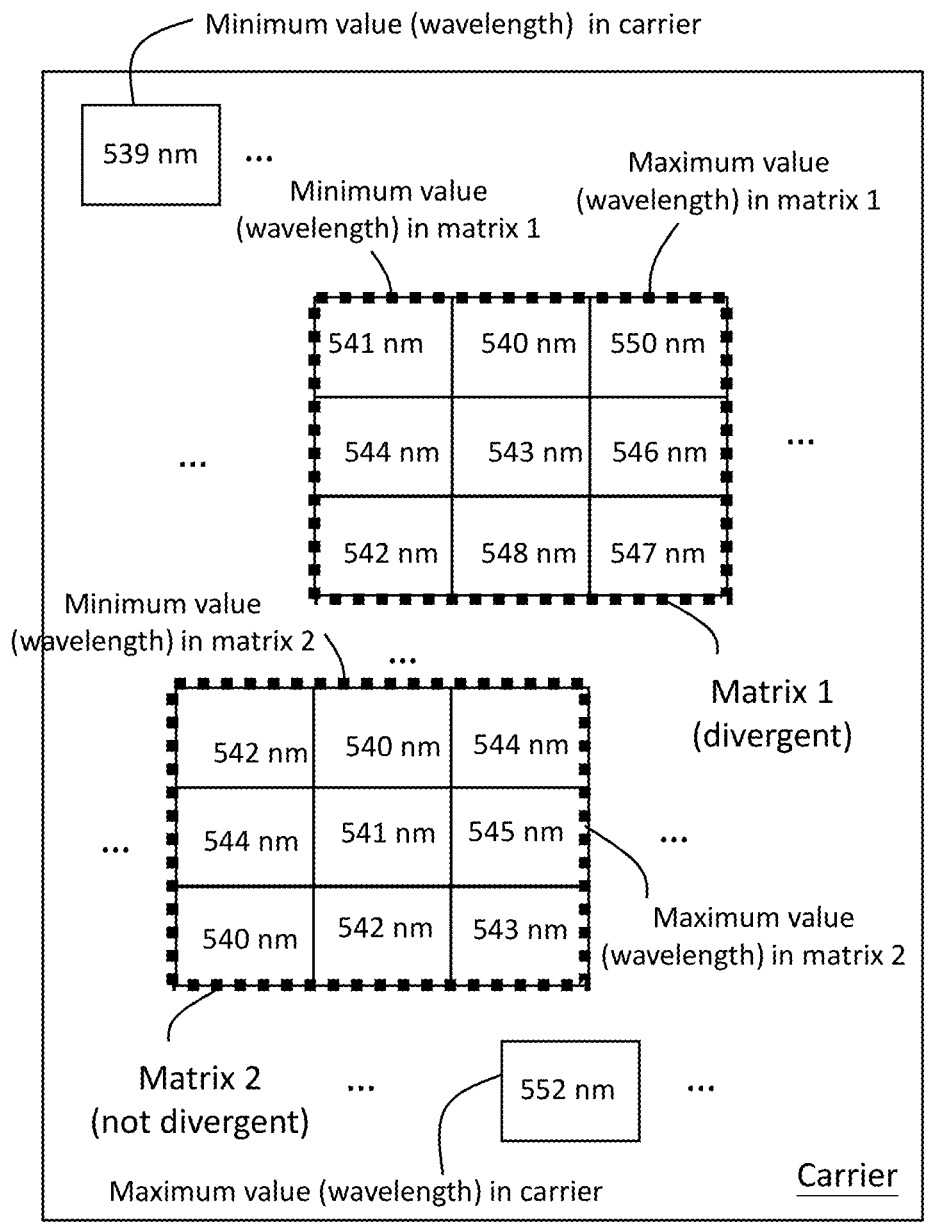

Please refer to FIGS. 50 and 51, an LED supply carrier includes at least one carrier and a plurality of LED dies placed on each of the at least one carrier. The plurality of LED dies are divided into a plurality of LED groups respectively assigned to a plurality of two-dimension square matrices identical in matrix dimension (for example, but not limited to 3×3 matrix in FIG. 50), and more than 40% of the square matrices are divergent (for example, matrix 1 is divergent, matrix 2 is not divergent as shown in FIG. 51). In an embodiment, a divergent carrier has more than 30%, 40%, 70% or 80% of the matrices are divergent. FIG. 51 shows one example, wherein any matrix has a difference between a maximum value and a minimum value of a category for the LED dies in a corresponding square matrix indicative of the same emission color. The difference according to one category of the LED dies in a divergent matrix is greater than 50% of the maximum difference of the categories of the LED dies in the carrier. In an embodiment, a difference of the LED dies in a matrix is greater than 30%, 40%, 70% or 80% of the maximum difference of the categories of the LED dies is considered as divergent. In FIG. 51, the categories of the LED dies are illustrated by wavelengths.

The matrices shown in FIGS. 50 and 51, are for illustrating the LED dies with the same emission color. For functional need, a number of the LED dies of same emission color for example, 3000, 5000, 8000, 10000, or 15000. When the LED dies on the carrier includes various emission colors, only the LED dies of same emission color are considered to determine the maximum value and a minimum value. The determination is applied based on a minimum count of LED dies with each the same emission color in the matrix.

The embodiment of FIG. 51 is one example for illustrating the category of the fourth embodiment, which should not be limited to the wavelength only and the light-emitting intensity can be a factor for divergence determination. Persons skilled in the art can understand the embodiment associated with the light-emitting intensity in analogy to the embodiment of FIG. 51. A difference value of the matrix is calculated to estimate its divergence as shown in FIG. 51. Thus, the details of the embodiment associated with the luminous intensity are not elaborated here. In an embodiment, the value of the LED in the matrix shown in FIG. 51 is an average value of a group of LED dies. To be specific, the value 543 nm of the LED in FIG. 51 is an average value of 9 neighboring LED dies. The amount of the LED in the group can be adjusted, such as 4, 6, 9 and 16.

In one embodiment, when the mixing LED dies on the LED supply carrier have higher divergences. The percentage of the divergent matrices on the carrier can be higher. For example, more than 40% of the square matrices on the carrier are divergent. Each divergent matrix is defined to have a difference between a maximum value and a minimum value of the category indicative of the same emission color for the LED dies in the divergent matrix, and the difference in the divergent matrix is greater than 50% of the maximum category difference of the LED dies in the carrier. The status of divergent described in the fourth embodiment can be applied to other embodiments disclosed in the present invention.

Fifth Embodiment

Figure 52:
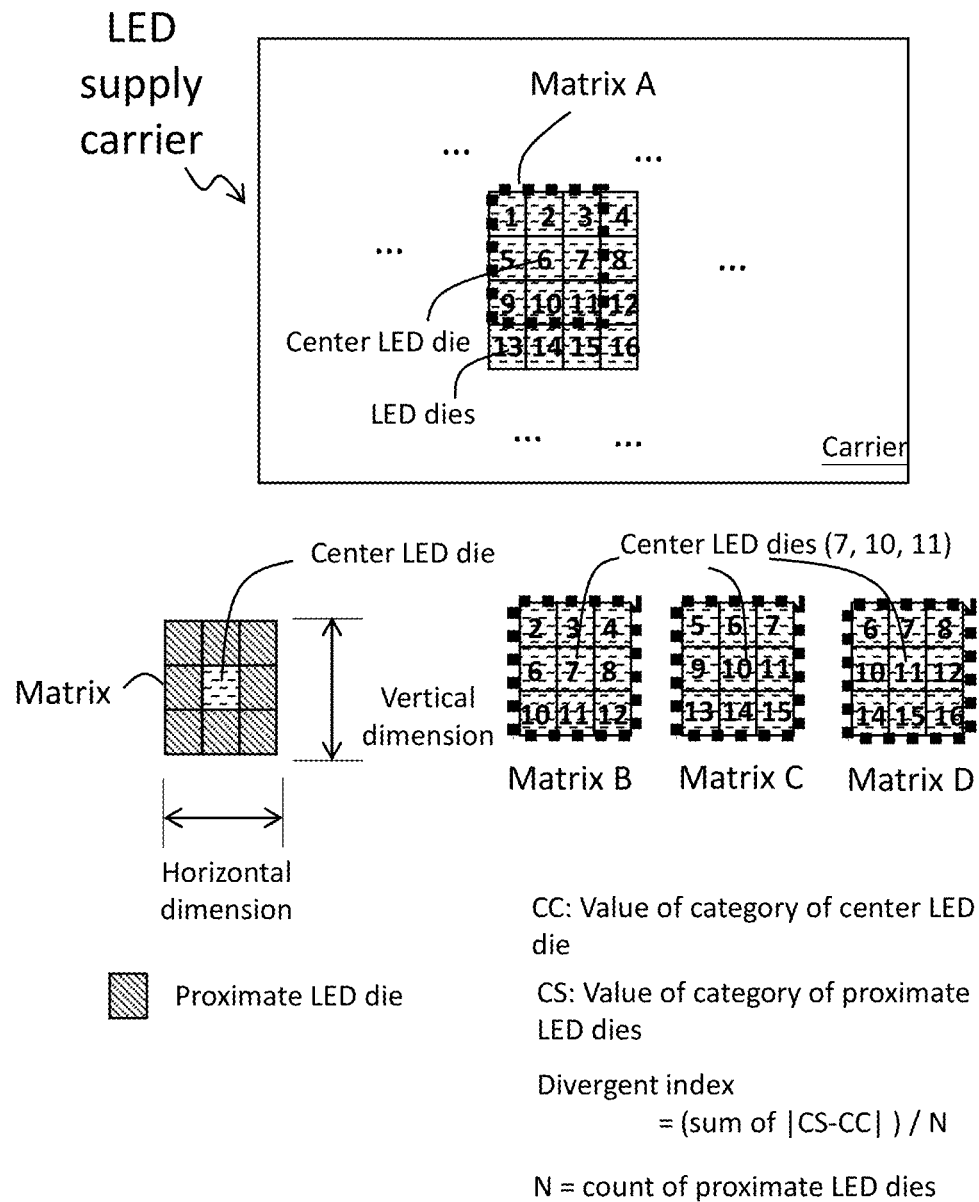
FIGS. 52 and 53 are schematic diagrams showing LED supply carriers according to a fifth embodiment of the present invention.
Figure 53:
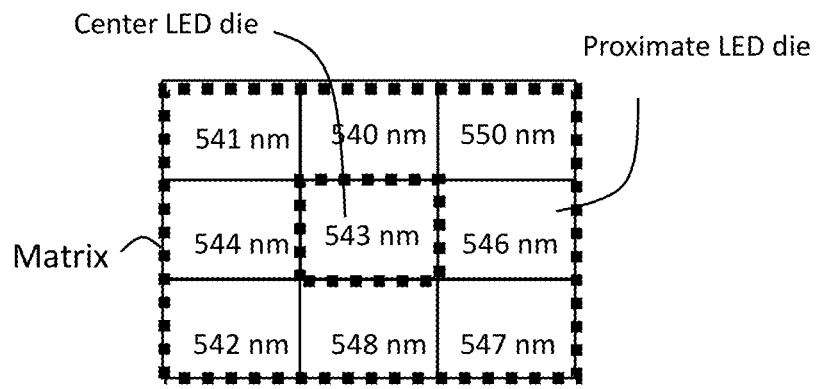

Please refer to FIGS. 52 and 53, an LED supply carrier includes at least one carrier and a plurality of LED dies (for example, LED dies 1 to 16 as shown in FIG. 52) placed on the carrier, wherein more than 60% of the plurality of LED dies with proximate LED dies in forms of matrices for calculating divergent indexes are divergent, and a divergent LED die is defined to have a divergent index greater than a reference value. The LED supply carrier can be applied to a light-emitting element device. The LED dies shown in the matrices of FIGS. 52 and 53 are for illustrating the LED dies with the same emission color. For functional need, a number of LED dies of same emission color in each of the matrices can be more than: for example, 3000, 5000, 8000, 10000, or 15000.

Please refer to FIG. 52, the LED dies 1 to 16 may be divided into several groups assigned to a plurality of two-dimension square matrices A, B, C, and D. In the matrix A, LED die 6 is the center LED die, and the LED dies 1, 2, 3, 5, 7, 9, 10, and 11 are the proximate LED dies, category values of which are used to calculated the divergent index. The proximate LED dies 1, 2, 3, 5, 7, 9, 10, and 11 in the matrix A, can be selected to be the center LED dies of other matrixes. For example, the proximate LED die 7 in the matrix A, is the center LED die of matrix B; the proximate LED die 10 in the matrix A, is the center LED die of matrix C; the proximate LED die 11 in the matrix A, is the center LED die of matrix D. In other words, the divergent index can be considered as a difference value of the matrix which is calculated to estimate its divergence as shown in FIG. 53.

In FIG. 53, the divergent index is calculated by a ratio of a sum of |CS−CC| to N. The sum of |CS−CC| is derived by adding all absolute values of a difference between a value of a category of the LED die (CC) at the center of the matrix and a value of the category (CS) of a plurality of the LED die in the matrix (in the proximity of the center LED die with an emission color identical to that of the center LED die), and N is a count of the LED dies in the matrix with the emission color. In other words, the divergent index is the average of the difference between the LED arranged on the center of the matrix (CC) and other LED dies arranged around the center of the matrix (CS). In an embodiment, the value of the LED in the matrix shown in FIG. 53 is an average value of a group of LED dies. To be specific, the value 543 nm of the LED in FIG. 53 is an average value of 9 neighboring LED dies. The amount of the LED in the group can be adjusted, such as 4, 6, 9 and 16.

In the fifth embodiment, the category may be an emission wavelength, or a luminous intensity. When the category is the emission wavelength, the reference value is a wavelength threshold; or, when the category is the luminous intensity, the reference value is an intensity threshold.

The matrix shown in FIG. 53, is one example for the category of wavelength. For example, when the wavelength threshold (reference value) is 3 nm, which is less than the divergent index corresponding to the center LED dies of the matrix in FIG. 53, and the center LED dies in FIG. 53 is divergent. Or, when the wavelength threshold (reference value) is 3.5 nm, which is larger than the divergent index corresponding to the center LED dies of the matrix in FIG. 53, the center LED dies in FIG. 53 is not divergent. The percentage of the divergent LED dies on the carrier, can be calculated based on each LED die in the carrier, and the matrices formed by the proximate LED dies centering on the LED dies. The status of divergent described in the fifth embodiment can be applied to other embodiments disclosed in the present invention.

Besides, the percentage 60% in the aforementioned "more than 60% of the plurality of LED dies are divergent" is one example instead of a limitation. Feasible percentage may be decided according to an implementation requirement. For example, in a higher divergent carrier requirement according to the present invention, the percentage may be 70% or higher values.

Sixth Embodiment

In comparison with the fourth embodiment, the sixth embodiment further includes a circuit for controlling light emission of the plurality of LED dies. Please refer to FIG. 54, a light-emitting element device includes a carrier, a plurality of LED dies placed on the carrier, and a circuit mounted on the carrier and electrically coupled to the plurality of LED dies to control light emission of the plurality of LED dies. The plurality of LED dies are divided into a plurality of LED groups respectively assigned to a plurality of two-dimension matrices identical in matrix dimension, and more than 60% of the matrices are divergent. A divergent matrix is defined to have a difference between a maximum value and a minimum value of a category for the LED dies with the same emission color in the divergent matrix, and the difference in the divergent matrix is greater than 50% of the maximum difference of the categories of the LED dies with the same emission color on the carrier. Regarding the details of determining the divergent matrix, please refer to the explanation of the fourth embodiment.

Figure 54:
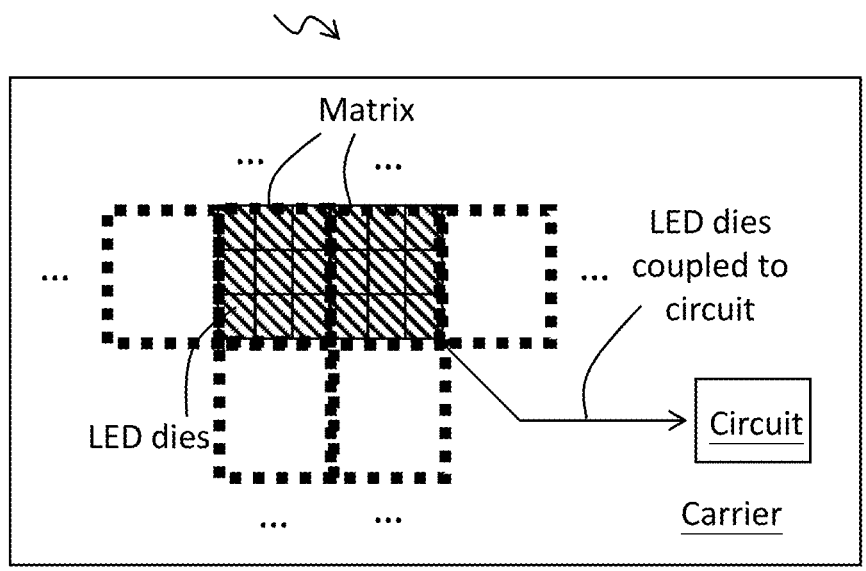
FIGS. 54 and 55 are schematic diagrams showing a method of processing light-emitting elements according to the sixth and seventh embodiments of the present invention.
Figure 54:
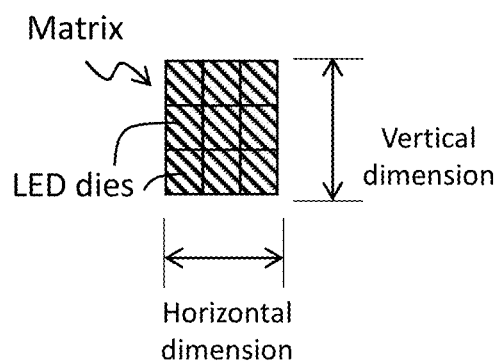

The LED dies in the matrices shown in FIG. 54, are for illustrating the LED dies with the same emission color. For functional need, a number of the LED dies of same emission color in each of the matrices can be more than: for example, 3000, 5000, 8000, 10000, or 15000. When the LED dies on the carrier include various emission colors of the LED dies and determinations of the divergent indexes are based on a minimum count of LED dies with each the same emission color in the matrix, the vertical and horizontal dimensions of the matrix can be increased for including enough LED dies for complying with the minimum count of LED dies with each the same emission color in the matrix. The combination of the circuit and the carrier described in the sixth embodiment can be applied to other embodiments disclosed in this specification in a form of circuit, carrier, or module.

Seventh Embodiment

In comparison with the fifth embodiment, the seventh embodiment provides a light-emitting element device which further includes a circuit for controlling light emission of the plurality of LED dies. Please refer to FIG. 55, a light-emitting element device includes a carrier, a plurality of LED dies placed on the carrier, and a circuit mounted on the carrier and electrically coupled to the plurality of LED dies to control light emission of the plurality of LED dies. More than 60% of the plurality of LED dies with proximate LED dies, in forms of matrices for calculating divergent indexes, are divergent; wherein a divergent LED die is defined to have a divergent index greater than a reference value. With reference to FIGS. 52 and 53, the divergent index is calculated by a ratio of a sum of |CS−CC| to N. The sum of

|CS−CC| is derived by adding all absolute values of a difference between a value of a category of the LED die (CC) at the center of the matrix and a value of the category (CS) of a plurality of the LED dies in the matrix (in the proximity of the center LED die with the same emission color to that of the center LED die), N is a count of the LED dies in the proximity of the matrix. Regarding the detail of determining the divergent index and the reference value, please refer to the explanation of the fifth embodiment.

In the aforementioned embodiment, the percentage of LED dies with proximate LED dies are divergent, wherein the percentage can be not limited to 60%. For example, when the mixing of the LED dies with more diverse values of the category on the light-emitting element device, the percentage can be higher, such as 70%, 80%, or other higher percentages.

Figure 55:
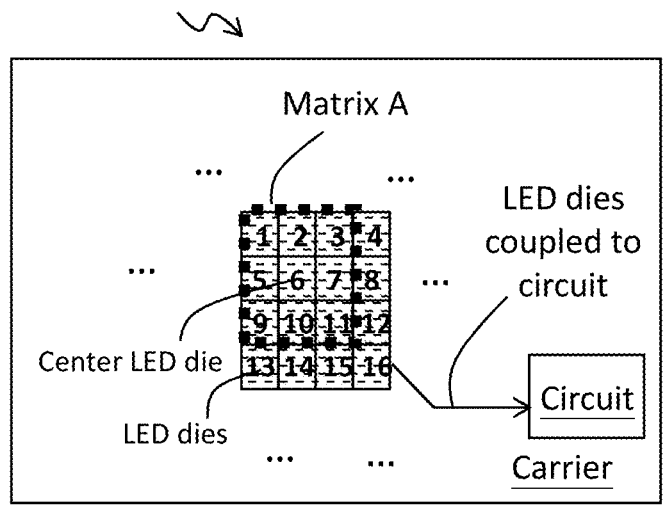
Figure 55:
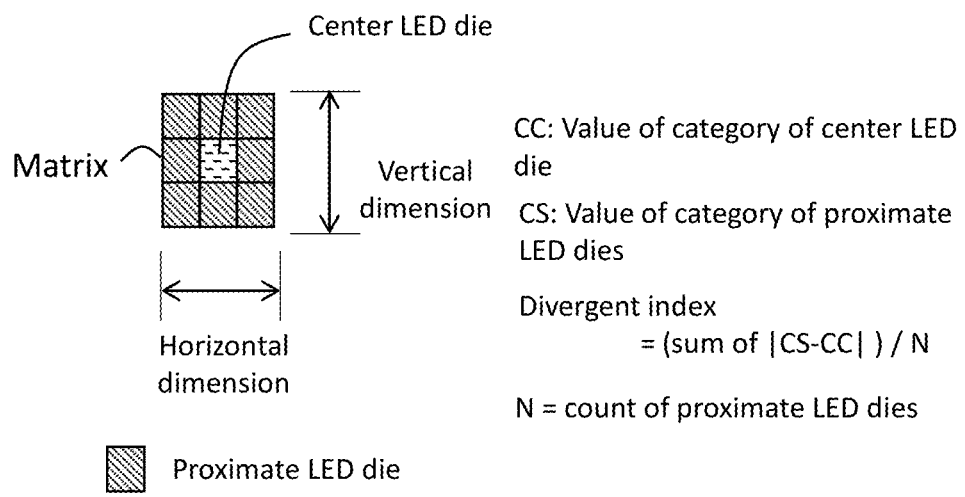

The LED dies in the matrix shown in FIG. 55, which is one example for the LED dies with the same emission color, are for illustrating the LED dies with the same emission color. For functional need, a number of the LED dies of same emission color in each of the matrices can be more than: for example, 3000, 5000, 8000, 10000, or 15000. When the LED dies include various emission colors of the LED dies in the matrix, and the divergent LED die determination is based on a minimum counts of the proximate LED dies with the same emission color in the matrix, the vertical and horizontal dimensions of the matrix can be increased for including enough LED dies for complying with the minimum counts of LED dies with the same emission color in the matrix. The combination of the circuit and the carrier described in the sixth embodiment can be applied to other embodiments disclosed in this specification in a form of circuit, carrier, or module.

In one embodiment, the light-emitting element device can be a micro-LED display, a mini-LED display, or a backlight module.

Eighth Embodiment

Figure 56:
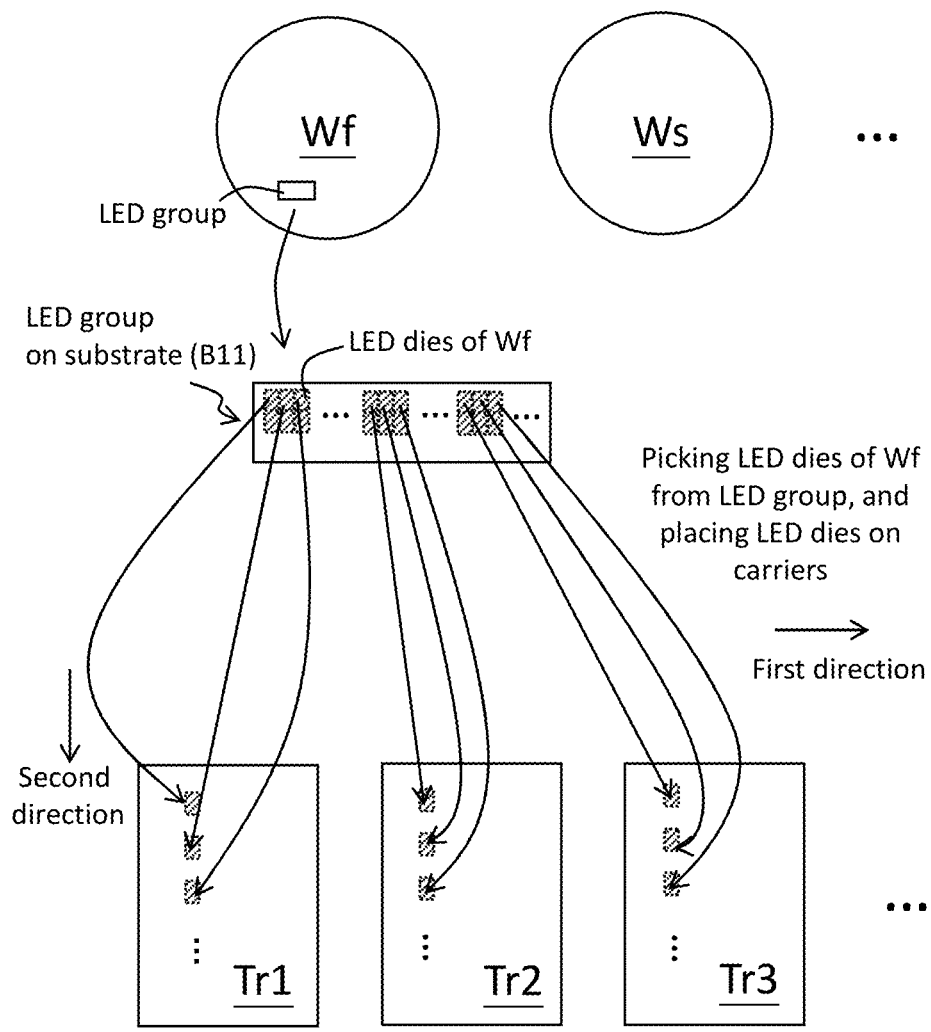
FIGS. 56-60 are schematic diagrams showing a method of processing LED dies according to the eighth embodiment of the present invention.
Figure 57:
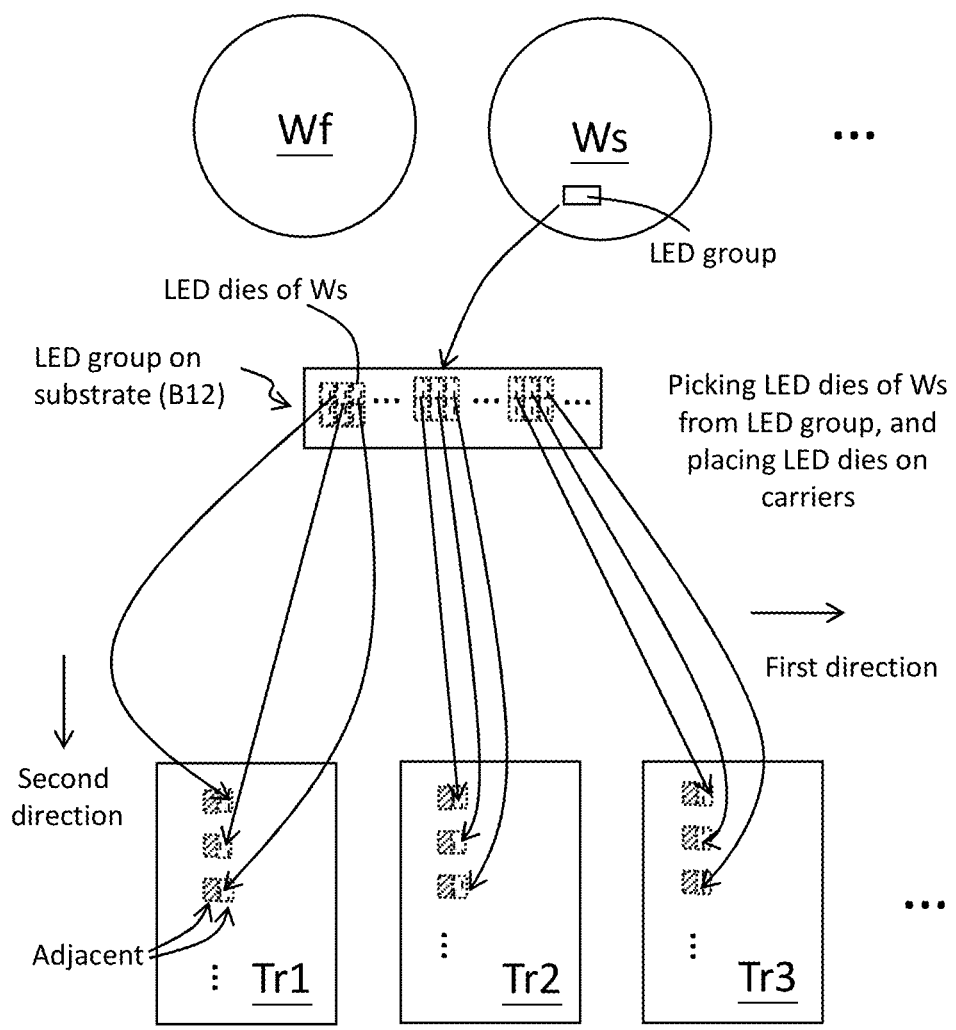
Figure 58:
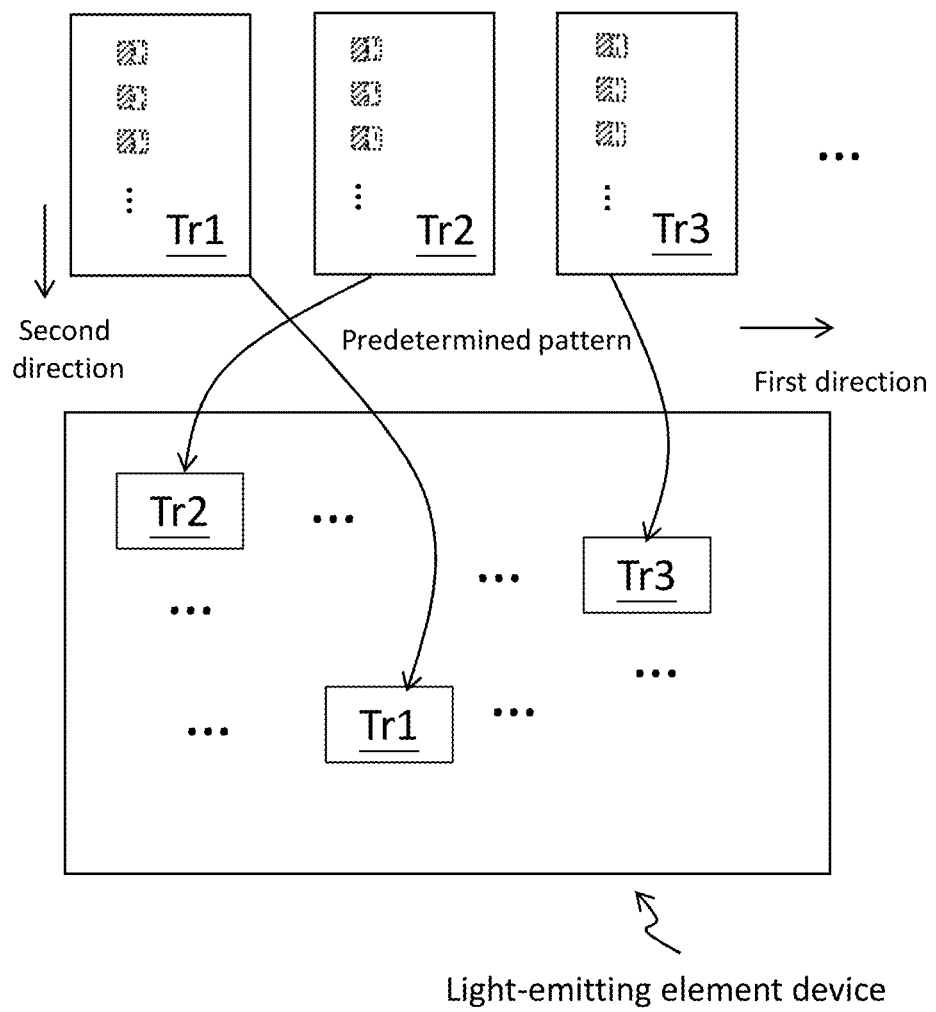

Referring to FIG. 56, the present invention further provides a method of processing LED dies, which includes: providing a first wafer Wf with a first emission color, a second wafer Ws with a second emission color, a plurality of substrates, and a plurality of carriers Tr1, Tr2, Tr3, . . . ; picking one LED group of the same category from the first wafer Wf, to the substrate B11; sequentially picking the LED dies from the LED group of the substrate B11 (for example, one by one picking the adjacent LED dies of the LED group in the first direction), to be sequentially placed on predetermined sections of the selected carrier Tr1 (for example, one by one placing the LED dies on adjacent positions in the second direction on the carrier Tr1); repeating the step of picking the LED dies from the LED group on the substrate B11, till the predetermined sections on the carrier Tr1 are fully arranged with the LED dies of the LED group from the substrate B11; repeating the step of picking the LED dies from the substrate B11, till predetermined sections on a carrier Tr2 are fully arranged with the LED dies of the LED group from the substrate B11; repeating the step of picking the LED dies from the substrate B11, till predetermined sections on a carrier Tr3 are fully arranged with the LED dies; picking one LED group from the second wafer Ws (FIG. 57), and picking the LED dies from the LED group of the same category on the second wafer Ws, to the substrate B12; and sequentially placing the LED dies from the substrate B12 in the first direction to predetermined sections of the selected carrier Tr1 (for example, one by one placing the LED dies on adjacent positions in the second direction on the carrier Tr1); repeating the step of picking the LED dies from the LED group from the substrate B12, till other predetermined sections on the carrier Tr1 are fully arranged with the LED dies of the LED group from the substrate B12; repeating the step of picking the LED dies from the substrate B12, till other predetermined sections on the carrier Tr2 are fully arranged the LED dies of the LED group from the substrate B12; repeating the step of picking the LED dies the substrate B12, till other predetermined sections on the carrier Tr3 are fully arranged with the LED dies of the LED group from the substrate B12; and the LED dies on the carriers Tr1, Tr2, Tr3, etc., are fully arranged to a light-emitting element device according to a predetermined pattern (FIG. 58). In an embodiment, the predetermined pattern arranges LED dies based on a sequence of placing the LED dies on the carrier (for example, the LED dies are placed first on the carrier Tr1, then the carrier Tr2, and then the carrier Tr3), to be placed on corresponding non-adjacent positions on the light-emitting element device (for example, according to a random permutation method). In an embodiment, an LED from the carrier Tr1 is arranged on the light-emitting element device next to an LED from the Tr2. Please refer to the aforementioned embodiments for the detail of the predetermined pattern, and the related explanation is not elaborated here. The LED from wafer Ws and the LED from wafer Wf are arranged in the first direction as shown in FIG. 57. In an embodiment, the LED from wafer Ws and the LED from wafer Wf are arranged in the second direction.

Figure 59:
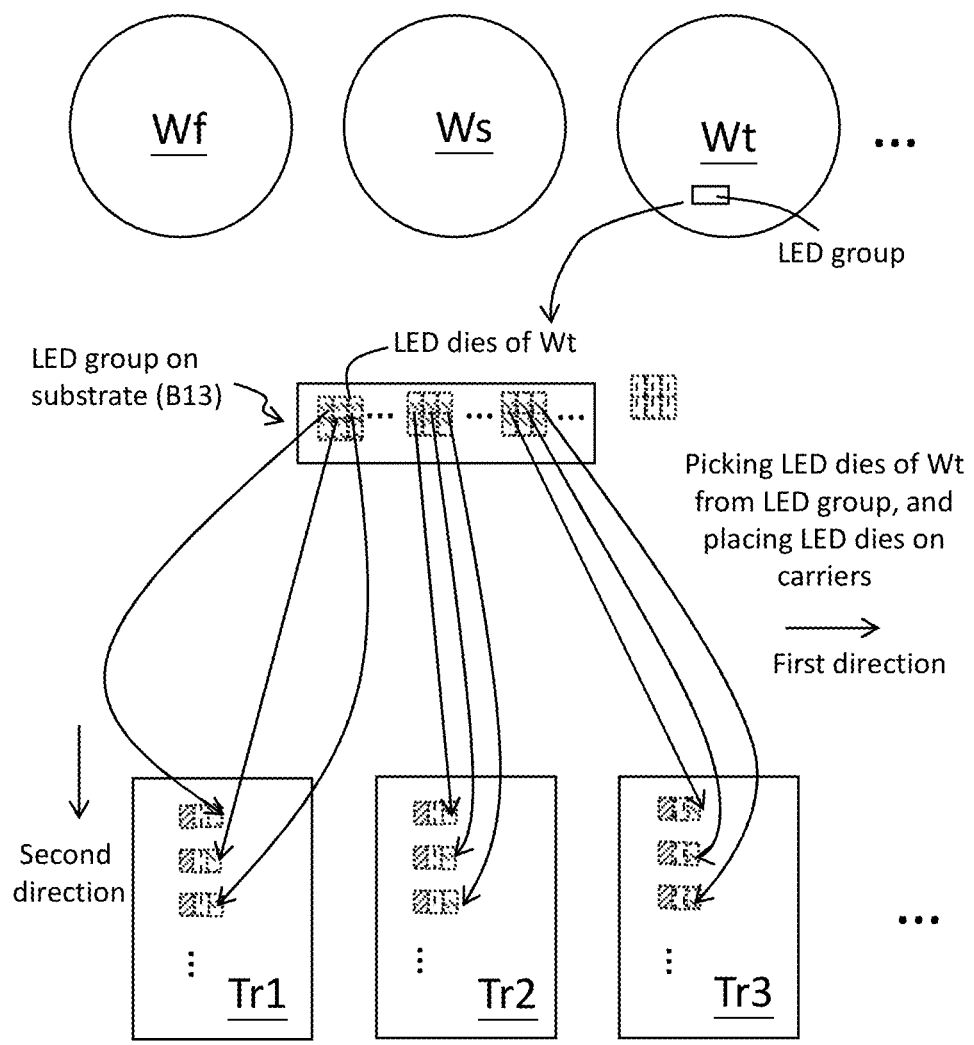
Figure 60:
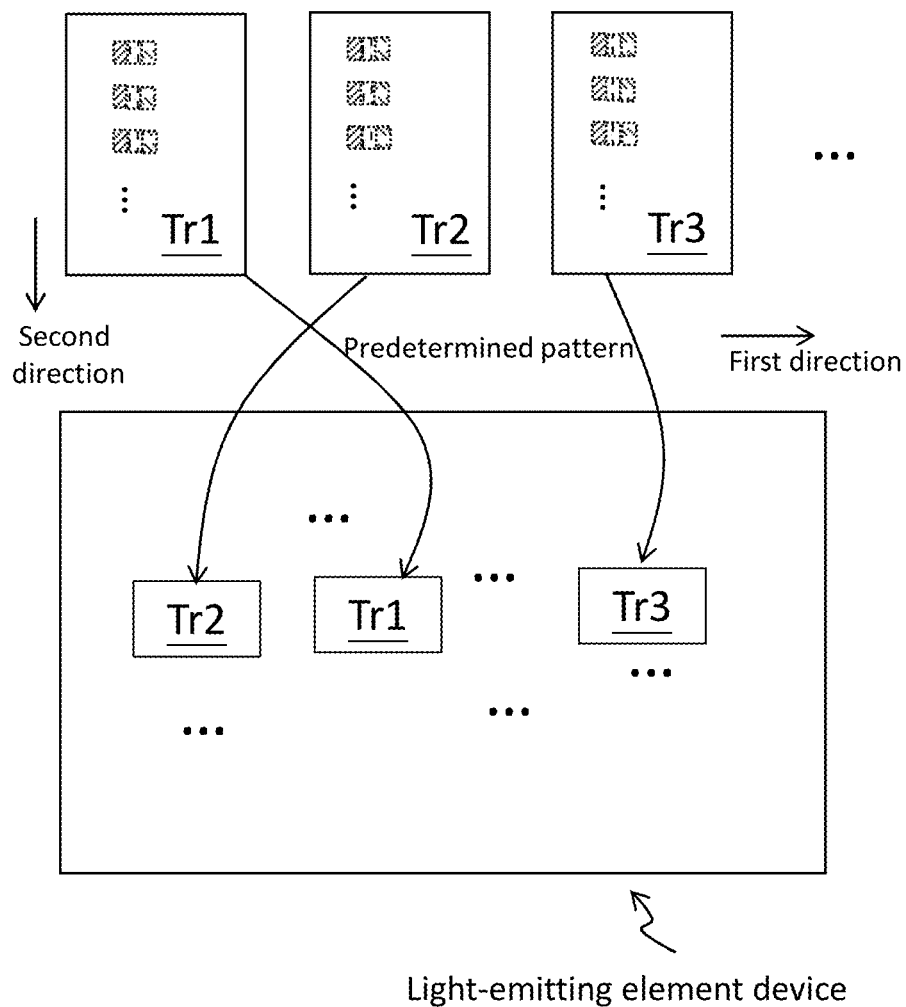

Please refer to FIGS. 59 and 60, in the eighth embodiment, the method of processing LED dies may further include: picking one LED group from a third wafer Wt with a third emission color, and picking the LED dies from the LED group of the third wafer Wt, to a substrate B13; placing the LED dies from the substrate B13 to be sequentially placed on the carrier Tr1; repeating the step of picking the LED dies from the LED group from the substrate B13, till the LED dies of the LED group from the substrate B13 are fully arranged on yet other predetermined sections on the carrier Tr1; repeating the step of picking the LED dies from the substrate B13, till the LED dies are fully arranged on yet other predetermined sections on the carrier Tr2; repeating the step of picking the LED dies the substrate B13, till the LED dies are fully arranged on yet other predetermined sections on the carrier Tr3; and transferring the LED dies from the carrier Tr1, Tr2, Tr3, etc., to the light-emitting element device (FIG. 60). The LED dies are arranged on the light-emitting element device or on the carrier in the first direction as shown in FIGS. 58~60. In an embodiment, the LED dies are arranged on the light-emitting element device or on the carrier in the second direction.

It is noted, that the LED dies picked from the same LED group are considered to have a substantially same optical property. For example, the difference between the maximum value and the minimum value of the emission wavelengths of the light from the LED dies picked from the LED group is less than 1% of the minimum value of the emission wavelengths of the light from the LED dies picked from the LED group. In another embodiment, the difference between maximum value and the minimum value of the light-emitting efficiency of the LED dies picked from the LED group is less than 3% of the minimum value of the emission wavelengths of the light from the LED picked from the LED group.

Ninth Embodiment

Figure 61:
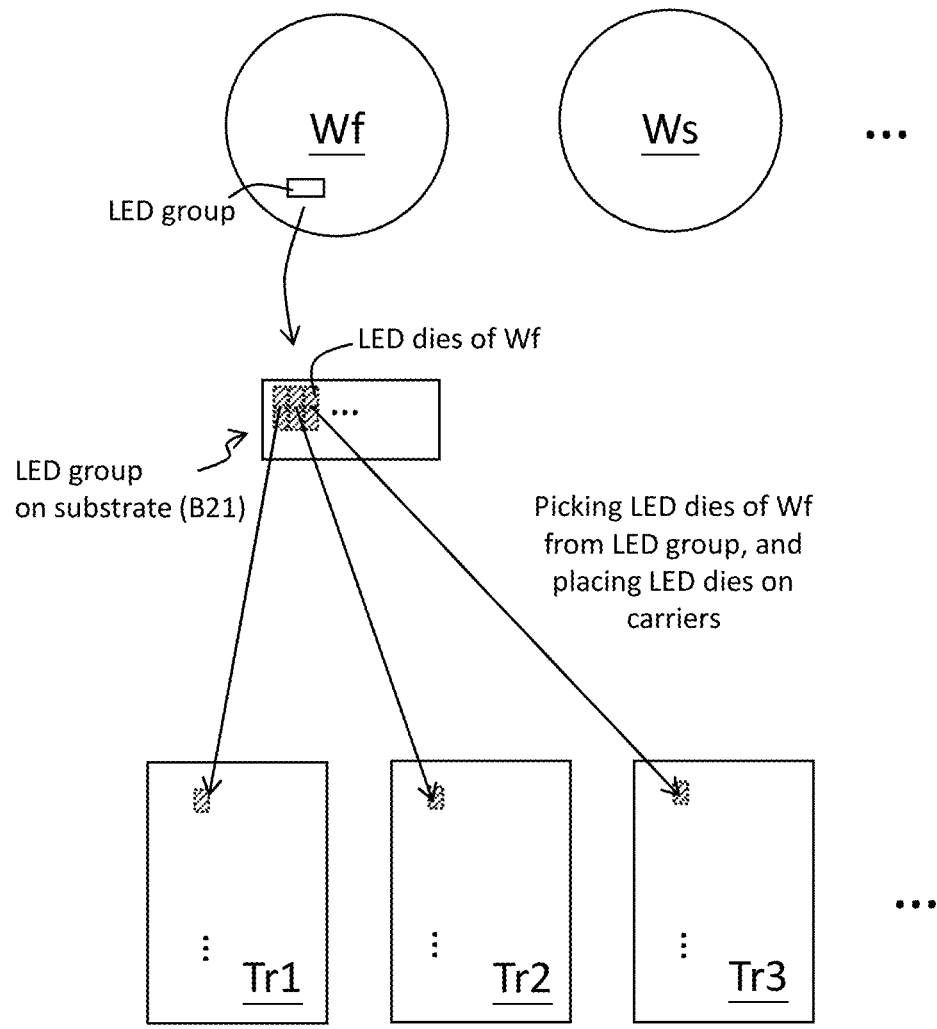
FIGS. 61-65 are schematic diagrams showing a method of processing LED dies according to the ninth embodiment of the present invention.
Figure 62:
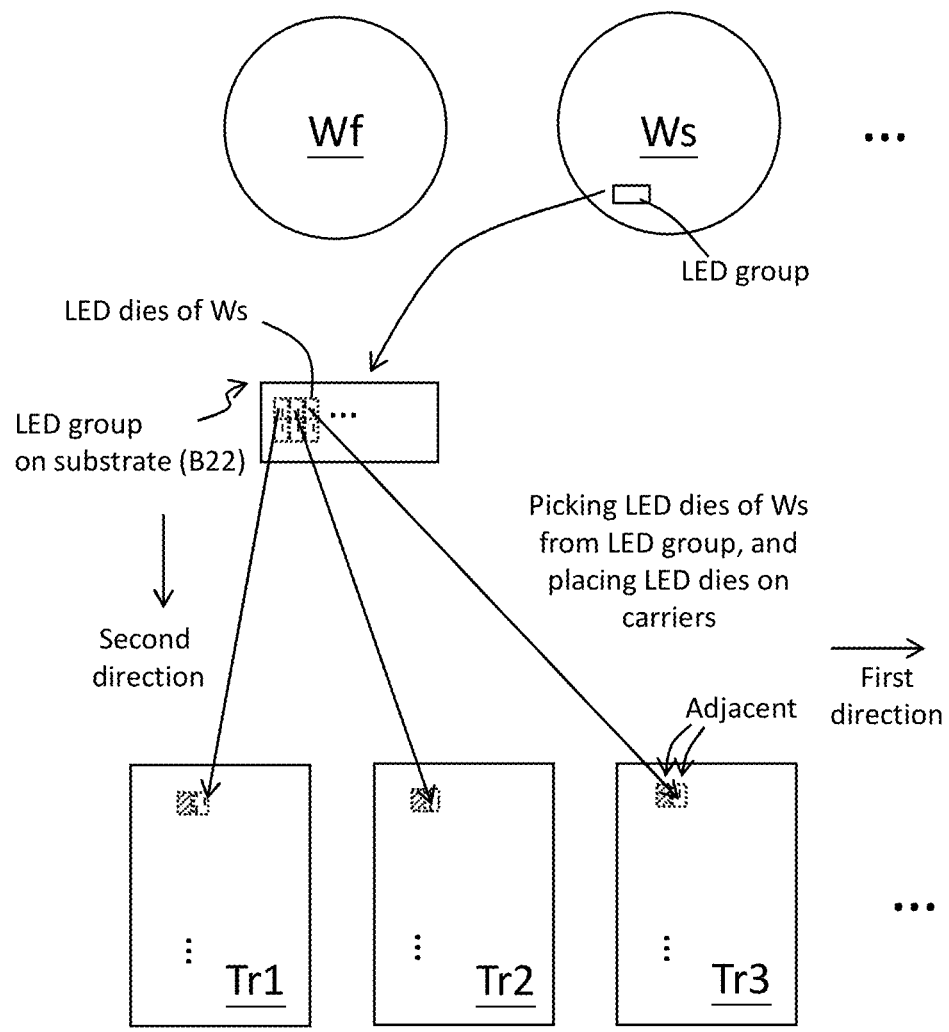
Figure 63:
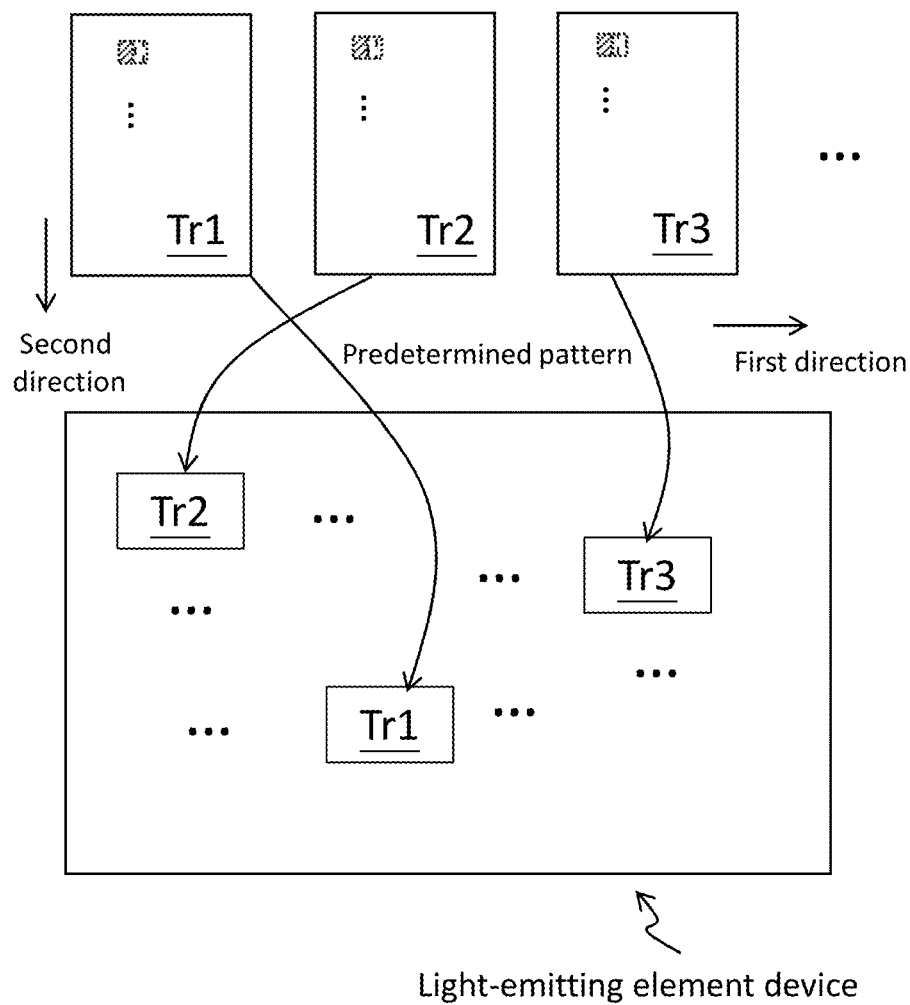

Referring to FIG. 61, the present invention further provides a method of processing LED dies, which includes:

providing a plurality of substrates, a plurality of carriers Tr1, Tr2, Tr3, etc.; picking one LED group from a first wafer Wf with a first emission color on the substrate B21, and sequentially picking the LED dies from the LED group on the substrate B21, to be placed on predetermined regions on different carriers Tr1, Tr2, Tr3, etc.; repeating the step of picking the LED dies from the LED group on the substrate B21, and placing the LED dies on different ones of the carriers Tr1, Tr2, Tr3, etc.; picking one LED group from a second wafer Ws with a second emission color to the substrate B22 (FIG. 62), and sequentially picking the LED dies from the LED group on the substrate B22, to be separately placed on the different ones of the carriers Tr1, Tr2, Tr3, etc., wherein the LED dies of the second emission color are respectively adjacent to the LED dies of the first emission color on the carriers Tr1, Tr2, Tr3, etc.; repeating the step of picking the LED dies from the LED group on the substrate B22, and placing the LED dies on different ones of the carriers Tr1, Tr2, Tr3, etc.; and when all of the carriers Tr1, Tr2, Tr3, etc. are fully arranged with the LED dies, transferring the LED dies on the carriers Tr1, Tr2, Tr3, etc. to a light-emitting element device according to a predetermined pattern (FIG. 63). In an embodiment, the predetermined pattern arranges LED dies based on a sequence of transferring the LED dies from the substrates to the carriers (for example, the LED dies are placed first on the carrier Tr1, then the carrier Tr2, and then the carrier Tr3), to be placed on two non-adjacent positions on the light-emitting element device. Please refer to the aforementioned embodiments for the detail of the predetermined pattern, and the related discussion is not elaborated here.

Figure 64:
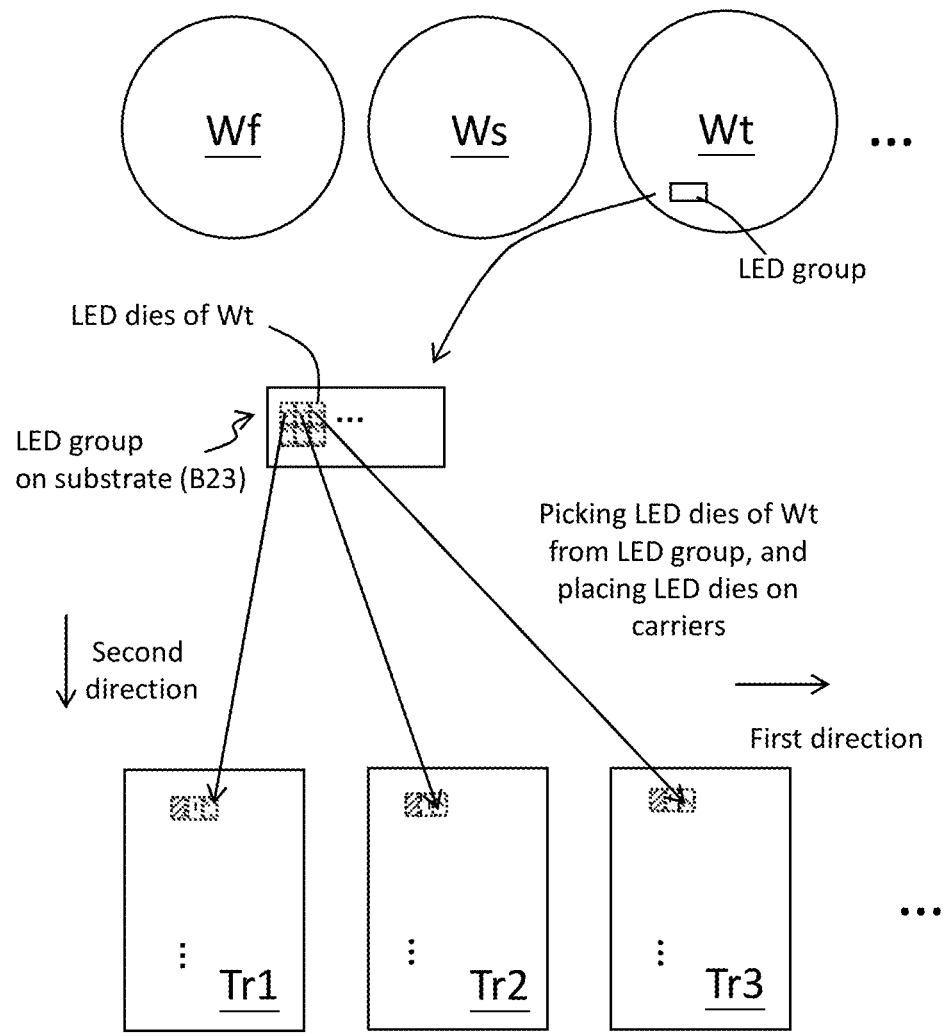
Figure 65:
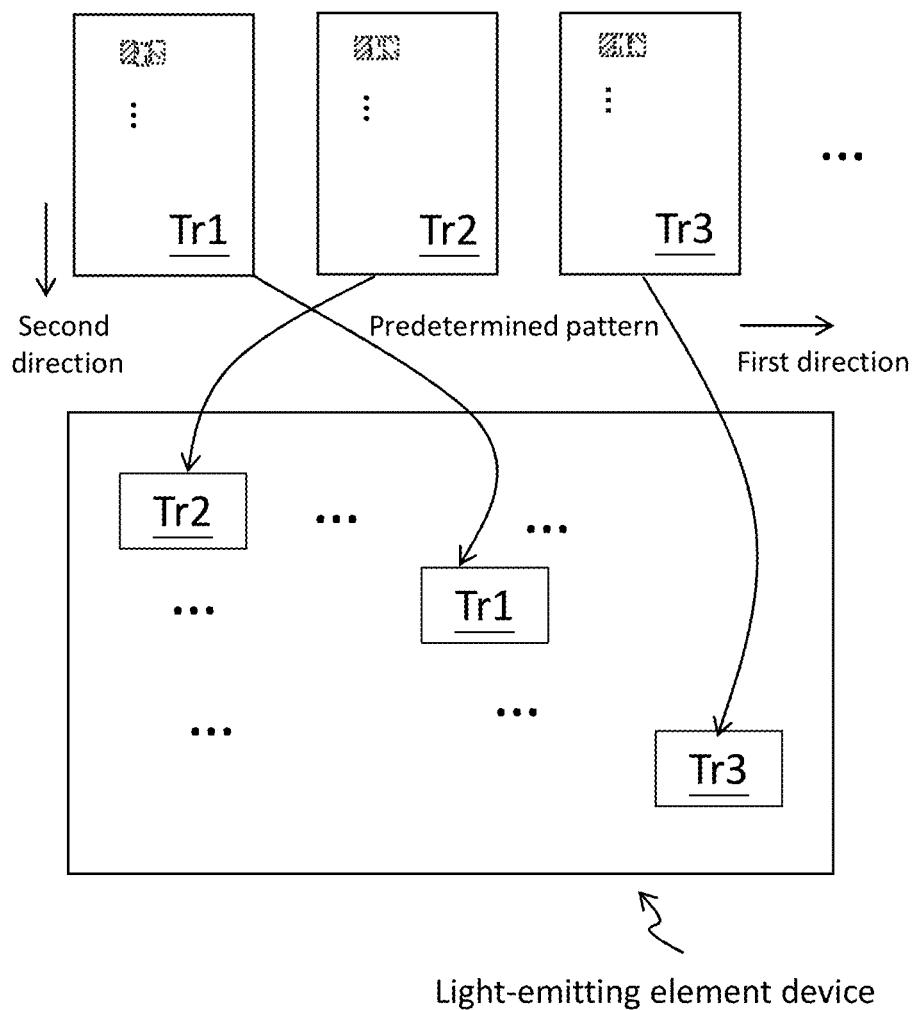

Please refer to FIGS. 64 and 65, in the ninth embodiment, the method of processing LED dies may further include: picking one LED group from a third wafer Wt with a third emission color to the substrate B23; sequentially picking the LED dies from the LED group on the substrate B23, to be separately placed on the different ones of the carrier Tr1, Tr2, Tr3, etc.; repeating the step of picking the LED dies from the LED group on the substrate B23, to be separately placed on the different ones of the carriers Tr1, Tr2, Tr3, etc.; and transferring the LED dies from the carriers Tr1, Tr2, Tr3, etc., to the light-emitting element device (FIG. 65). In this embodiment, there is a plurality of predetermined sections (for example, 200 sections) on the carriers Tr1 for placing the LED dies from the substrate B23. In the process, the predetermined sections on the carrier Tr1 may not be fully placed (for example, placed on 50 sections), and then the LED dies on the substrate B23 are placed on a plurality of predetermined sections on the carrier Tr2. The LED dies are arranged on the light-emitting element device or on the carriers in the first direction as shown in FIGS. 61~65. In an embodiment, the LED dies are arranged on the light-emitting element device or on the carriers in the second direction.

Tenth Embodiment

Figure 66:
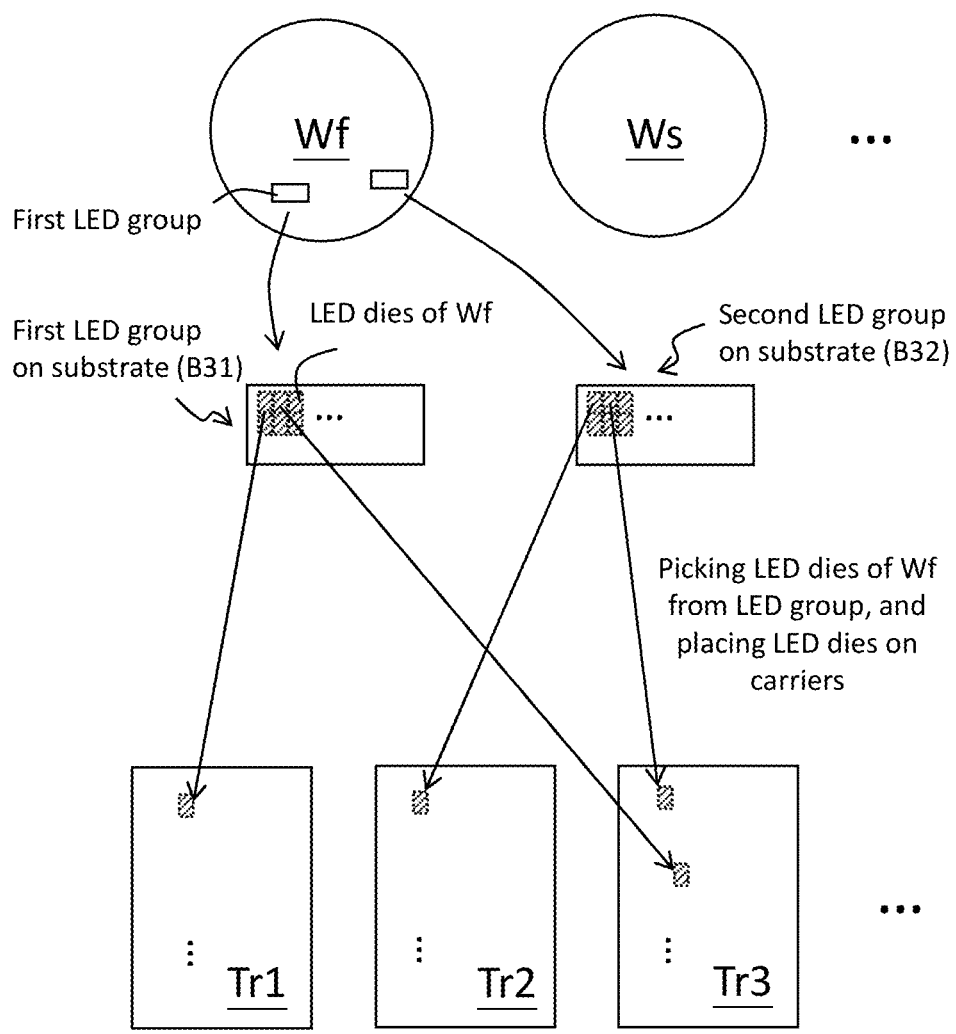
FIGS. 66-70 are schematic diagrams showing a method of processing LED dies according to the tenth embodiment of the present invention.
Figure 67:
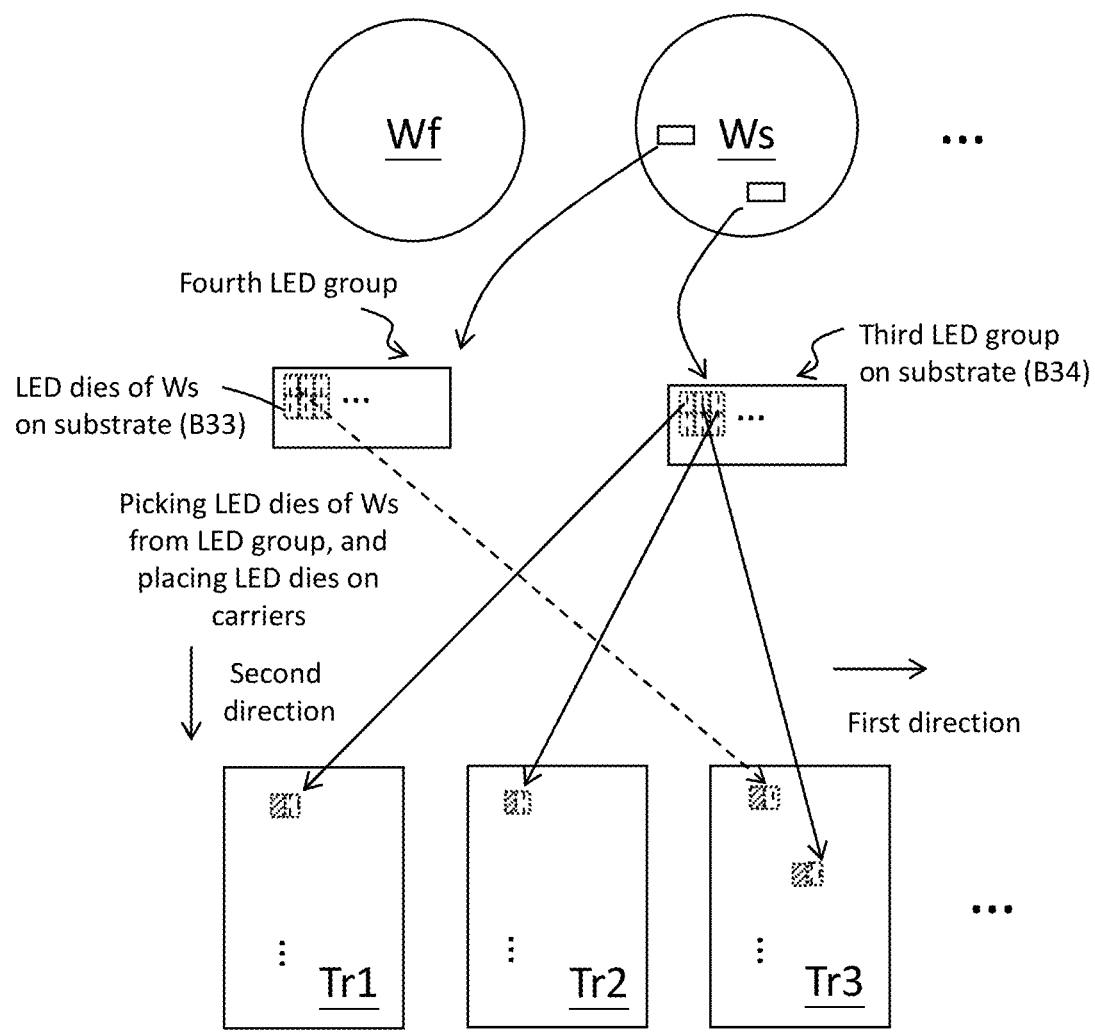
Figure 68:
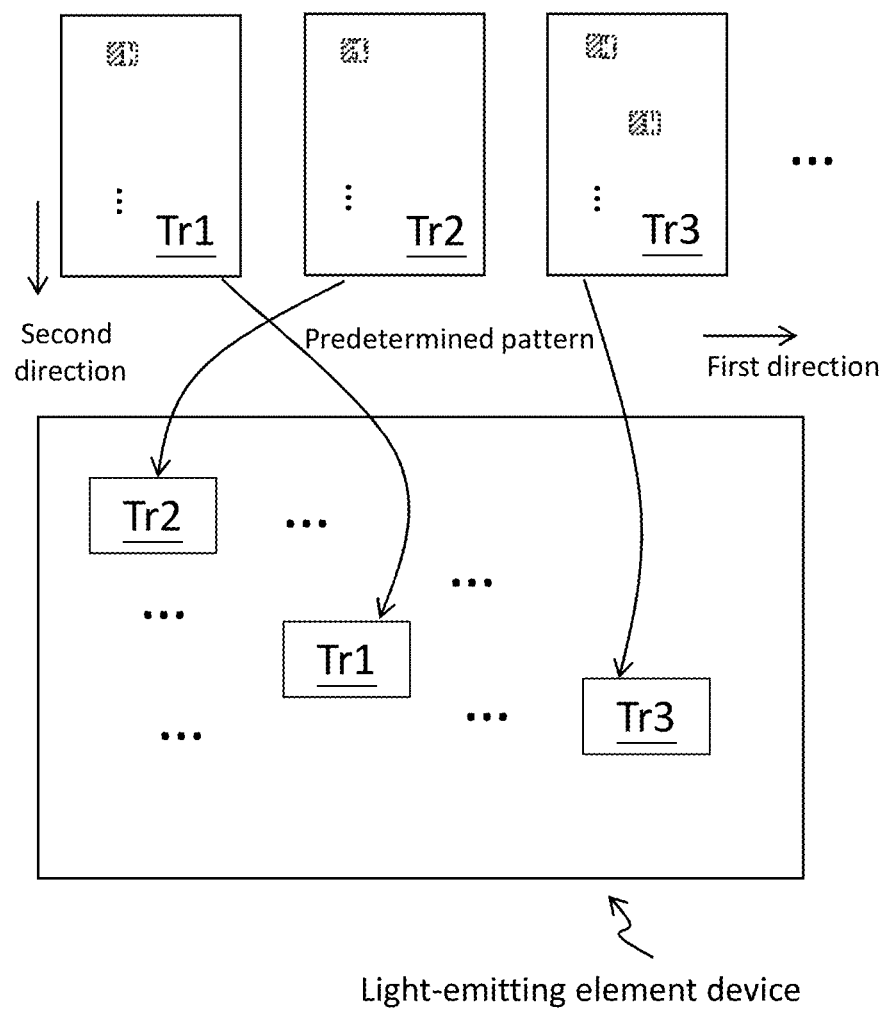

Referring to FIG. 66, the present invention further provides a method of processing LED dies, which includes: (a) providing a plurality of carriers Tr1, Tr2, Tr3, etc.; (b) picking a first LED group and a second LED group from a first wafer Wf with a first emission color to different substrates B31 and B32, and picking the LED dies respectively from the first and second LED groups on the substrates B31 and B32, to be separately placed on predetermined regions at different ones of the carriers Tr1, Tr2, Tr3, etc., wherein a portion of the LED dies from each of the first and second LED groups are placed on at least one (for example, but not limited to carrier Tr3) of the carriers Tr1, Tr2, Tr3, etc.; repeating the picking the LED dies from the groups and transferring the LED dies from the substrates B31 and B32 to the plurality of carriers Tr1, Tr2, Tr3, etc.; picking a third LED group from a second wafer Ws with a second emission color (FIG. 67) to the substrates B33 and B34, and picking the LED dies from the substrates B33 and B34, to be separately placed on the carriers Tr1, Tr2, Tr3, etc. (in one example, picking and placing the LED dies of two LED groups to the carriers, in which the two LED groups include the third LED group and fourth LED group), wherein the LED dies of the second emission color (from the substrates B33 and B34) are respectively adjacent to the LED dies of the first emission color on the carriers Tr1, Tr2, Tr3, etc.; repeating the step of picking the LED dies from the group and transferring the LED dies of the substrates B33 and B34 to the plurality of carriers Tr1, Tr2, Tr3, etc.; and when all of the carriers Tr1, Tr2, Tr3, etc. are fully arranged with the LED dies, placing the plurality of carriers on a light-emitting element device (FIG. 68) according to a predetermined pattern. In an embodiment, the predetermined pattern arranges one carrier and a next carrier based on a sequence of transferring the LED dies from the carriers to the light-emitting element device (for example, the LED dies on the carrier Tr1 are picked first, then the carrier Tr2, and then the carrier Tr3). In an embodiment, the LED dies picked from the carriers are placed on corresponding non-adjacent positions on the light-emitting element device. Please refer to the aforementioned embodiments for the detail of the predetermined pattern, and the related explanation is not elaborated here.

Figure 69:
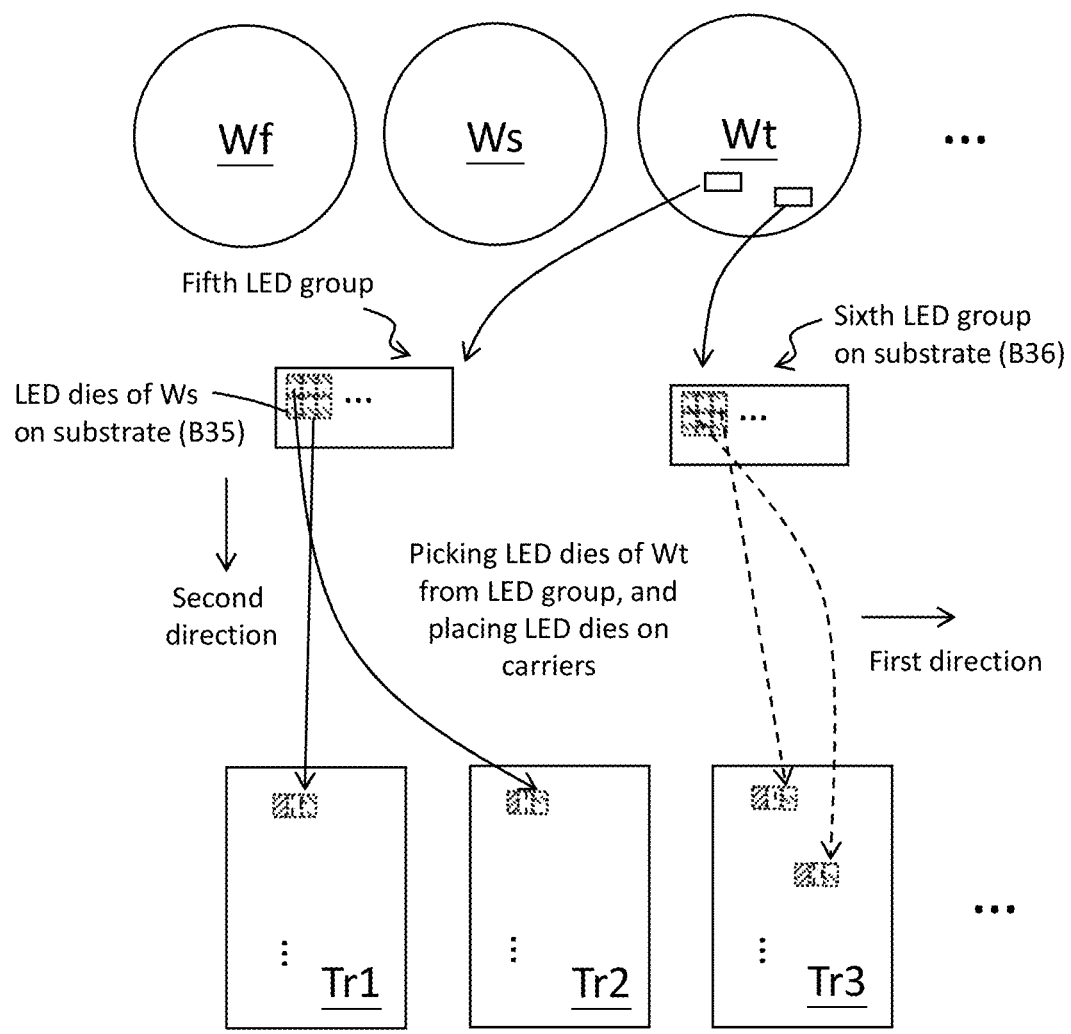
Figure 70:
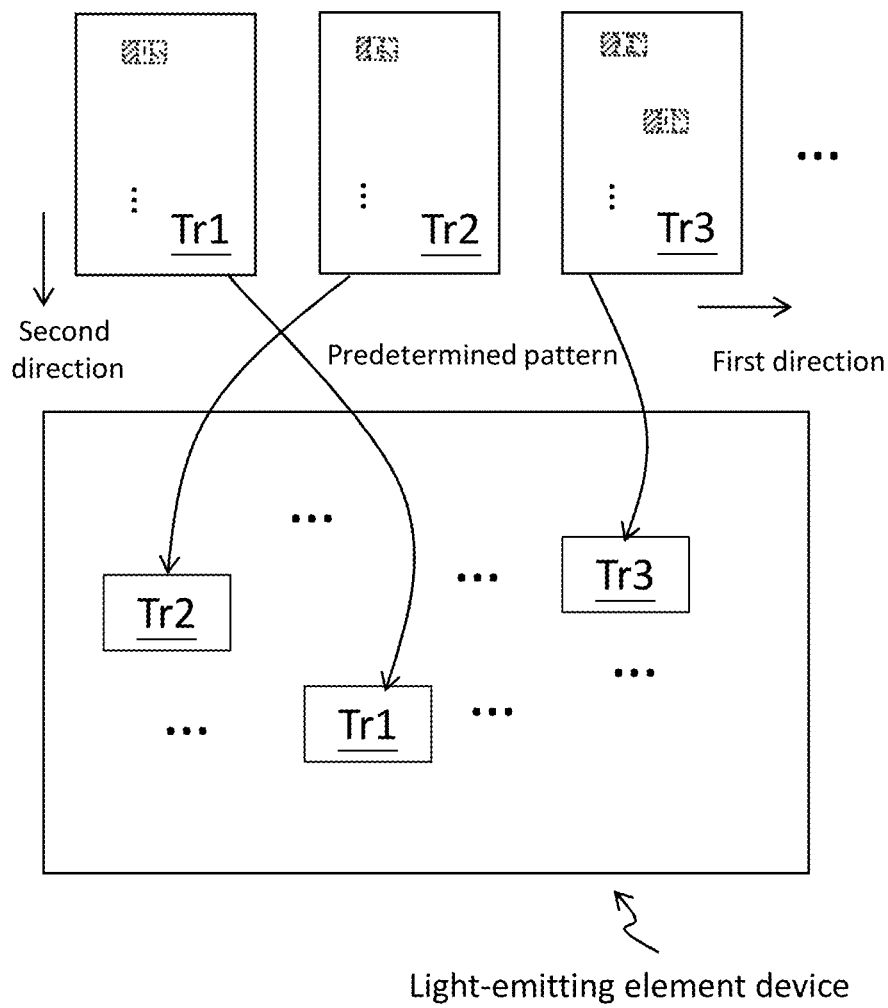

Referring to FIGS. 69 and 70, the method of method of processing LED dies, may further include: picking a fifth LED group (or the fifth LED group and a sixth LED group) from a third wafer Wt with a third emission color to the substrates B35 and B36, and picking the LED dies from the substrates B35 and B36, to be separately placed on different ones of the carriers Tr1, Tr2, Tr3, etc.; repeating the step of picking the LED dies from the LED group from the substrates B35 and B36, to be separately placed on the different ones of the carriers Tr1, Tr2, Tr3, etc.; and placing the carriers Tr1, Tr2, Tr3 on the light-emitting element device (FIG. 70). The LED dies are arranged on the light-emitting element device or on the carrier in the first direction as shown in FIGS. 67~70. In an embodiment, the LED dies are arranged on the light-emitting element device or on the carriers in the second direction.

It is noted that the LED dies from one LED group can be arranged on adjacent positions of one carrier. For example, three LED dies from the first LED group are arranged next to each other in a row on the carrier Tr1. In another embodiment, nine LED dies from the first LED group are arranged in a 3×3 matrix on the carrier Tr1.

Eleventh Embodiment

Figure 71:
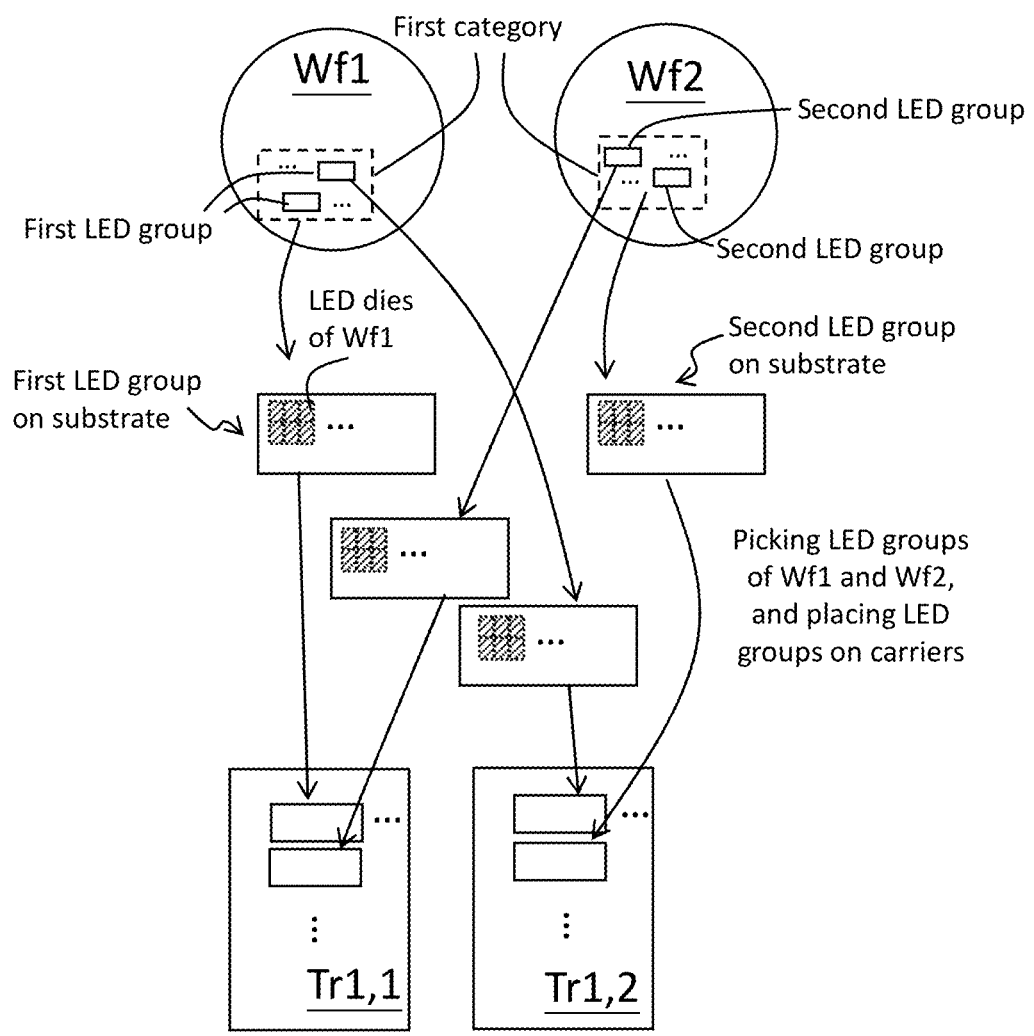
FIGS. 71-78 are schematic diagrams showing a method of processing LED dies according to the eleventh embodiment of the present invention.
Figure 72:
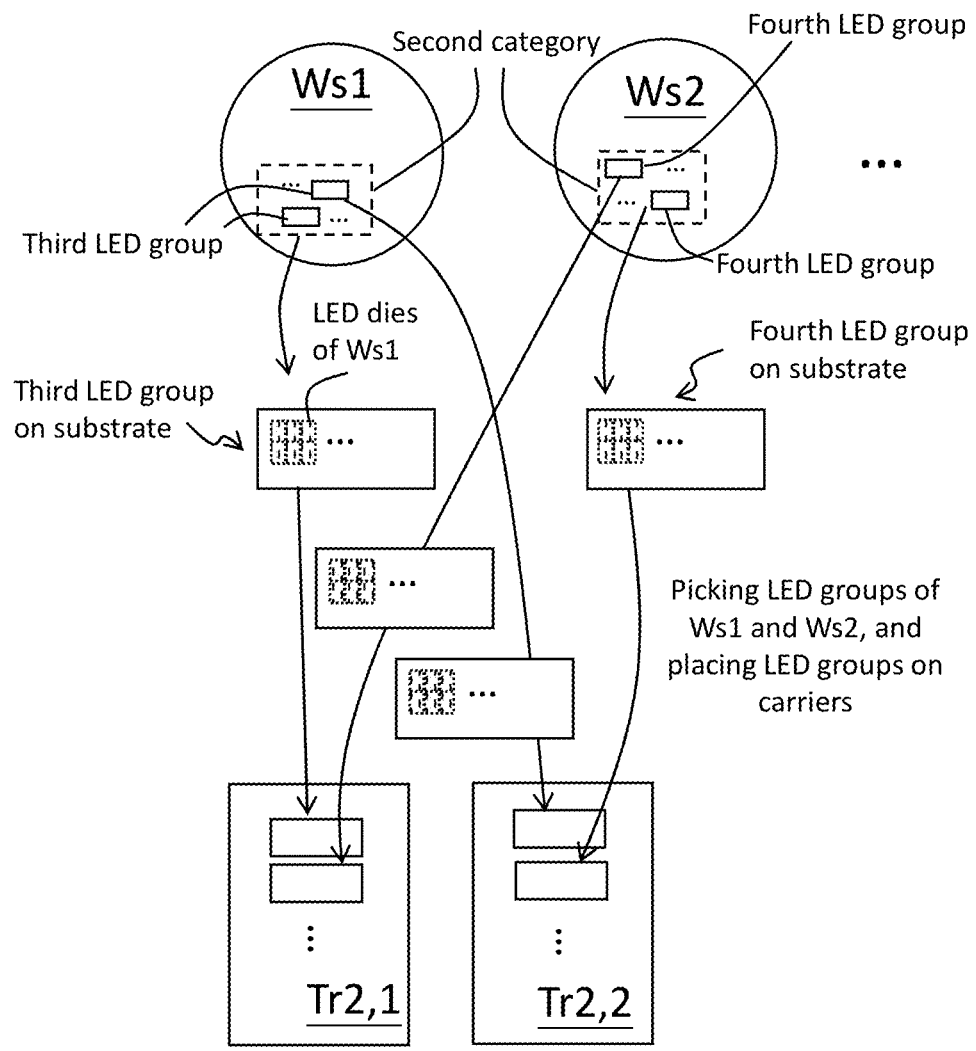
Figure 75:
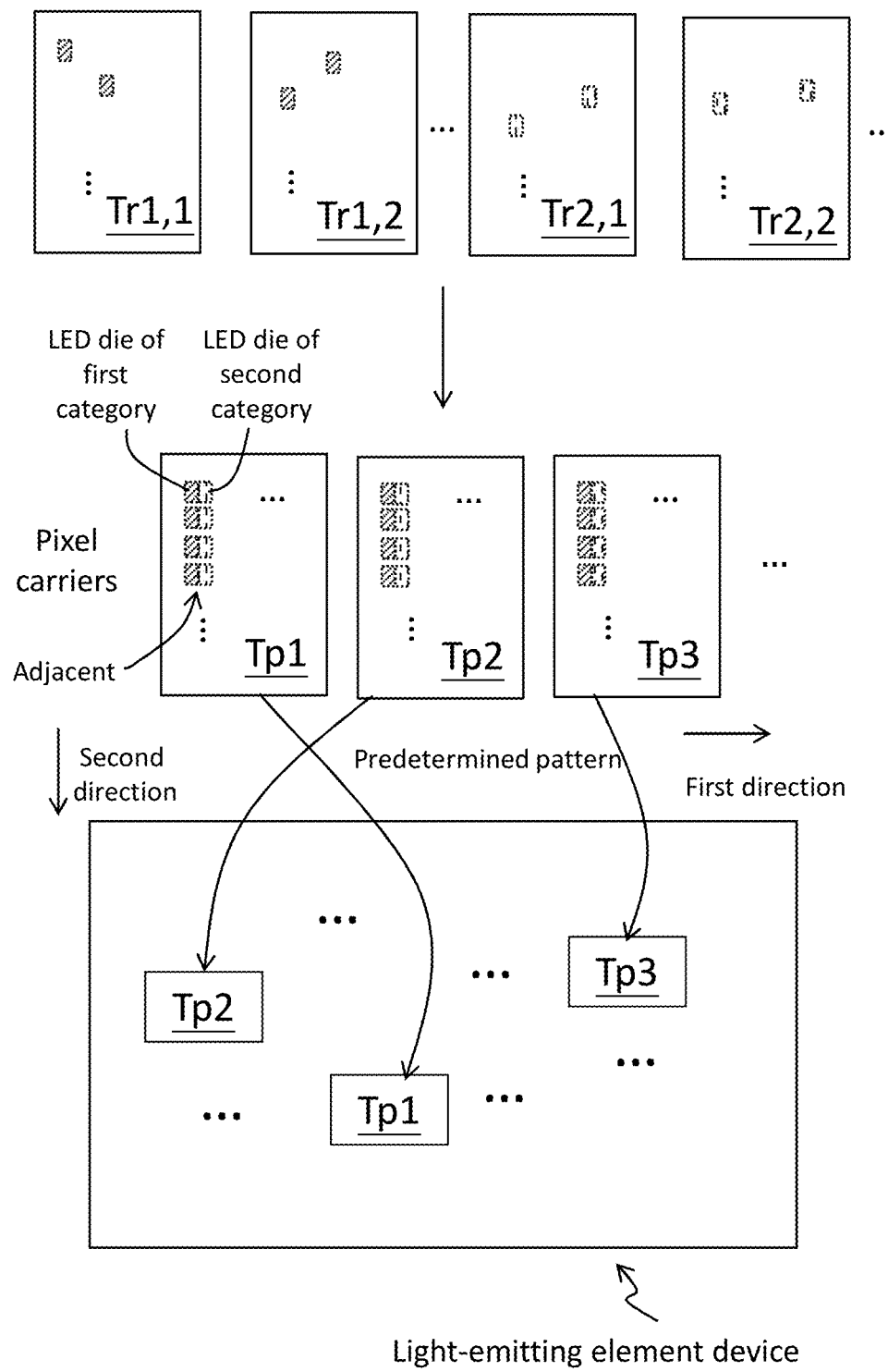

Referring to FIG. 71, the present invention further provides a method of processing LED dies, which includes: testing LED dies on the wafer Wf1 and Wf2 of a first emission color and defining LED dies on the wafer as different categories according to the result of testing, selecting LED dies of a first category on two first-color wafers Wf1 and Wf2, and testing LED dies on the wafer Ws1 and Ws2 with a second emission color and defining LED dies on the wafer as different categories according to the result of testing, selecting LED dies of a second category on two second-color wafers Ws1 and Ws2, with a second emission color (FIG. 72); picking a plurality of LED groups (first and second LED groups, FIG. 71) of the first category respectively from the two wafers Wf1 and Wf2; placing the LED groups (first and second LED groups) of the first category to substrates, and transferring the LED dies from the substrates to two first-color carriers Tr1,1 and Tr1,2; picking third LED groups and fourth LED groups of the second category respectively from the two second-color wafers Ws1 and Ws2 (FIG. 72) on the substrates; sequentially placing the third and fourth LED groups of the second category from the substrates, to be separately on two second-color carriers Tr2,1 and Tr2,2; referring to FIG. 75, sequentially picking the LED dies from the first-color carriers Tr1,1 and Tr1,2 and the second-color carriers Tr2,1 and Tr2,2, in a plurality of groups, to be placed on a plurality of pixel carriers Tp1, Tp2, and Tp3, wherein each of the groups includes two LED dies of the first and second categories, and the LED dies of the second category are respectively adjacent to the LED dies of the first category on the pixel carriers Tp1, Tp2, and Tp3; when all of the pixel carriers are fully arranged with the LED dies, placing the pixel carriers Tp1, Tp2, and Tp3 on a light-emitting element device according to a predetermined pattern, wherein the predetermined pattern arranges one pixel carriers and a next pixel carriers based on a sequence of placing the LED dies on the pixel carriers (for example, the LED dies are placed first from the pixel carriers Tp1, then the pixel carriers Tp2, and then the pixel carriers Tp3), to be placed on two non-adjacent positions on the light-emitting element device. In an embodiment, the pixel carriers are arranged on adjacent positions of the light-emitting element device. In an embodiment, the LED die of the first category and LED die of the second category are picked from the pixel carriers to be arranged on adjacent positions of the light-emitting element device. In an embodiment, the LED dies arranged in a form of a pixel on the pixel carrier. Please refer to the aforementioned embodiments for the detail of the predetermined pattern, and the related explanation is not elaborated here. The LED dies of different categories are arranged on the pixel carriers in the first direction as shown in FIG. 75. In an embodiment, the LED dies of different categories are arranged on the pixel carriers in the second direction.

Figure 73:
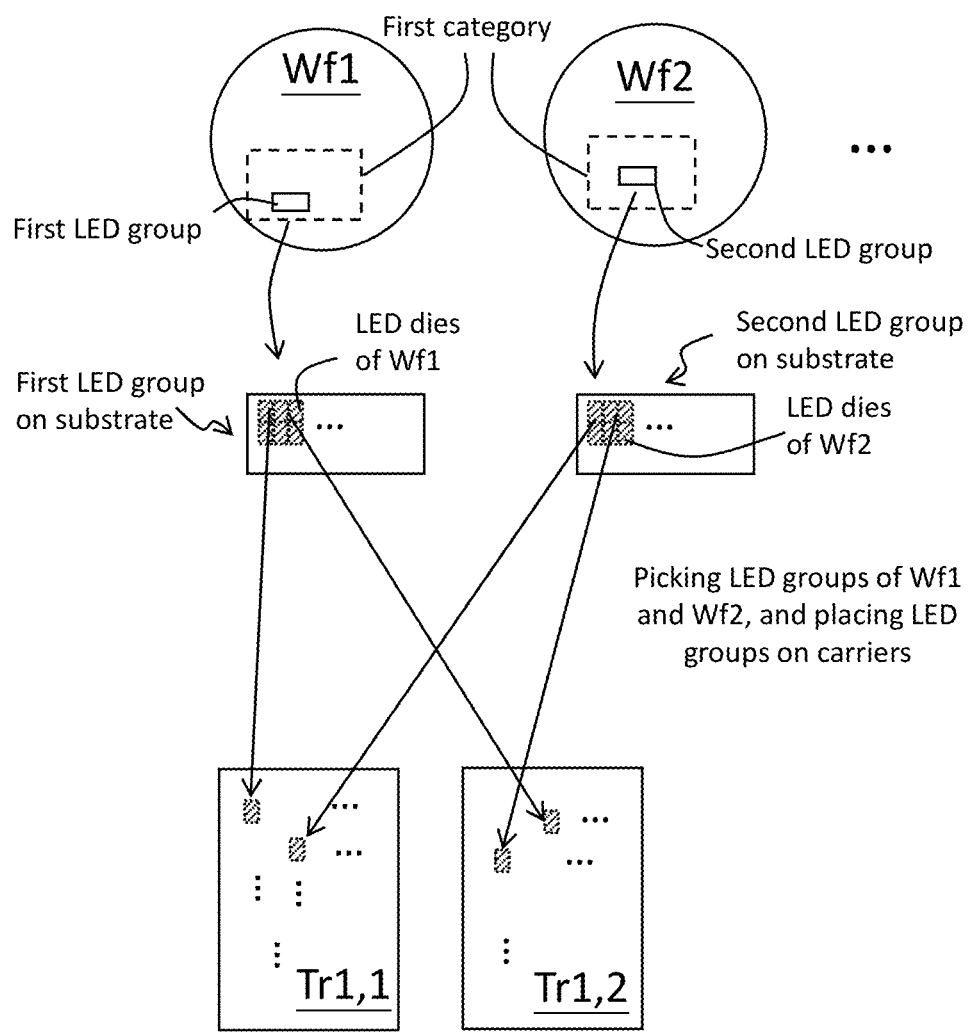

In one embodiment, the aforementioned step of placing the LED groups (first and second LED groups) of the first category to two first-color carriers Tr1,1 and Tr1,2, can be proceeded in another way: referring to FIG. 73, picking the LED dies from the first LED group and placing the LED dies from the first LED group of the first category on the first-color carriers Tr1,1 and Tr1,2, picking the LED dies from the second LED group of the first category, and placing the LED dies of the second LED group of the first category on the first-color carriers Tr1,1 and Tr1,2.

Figure 74:
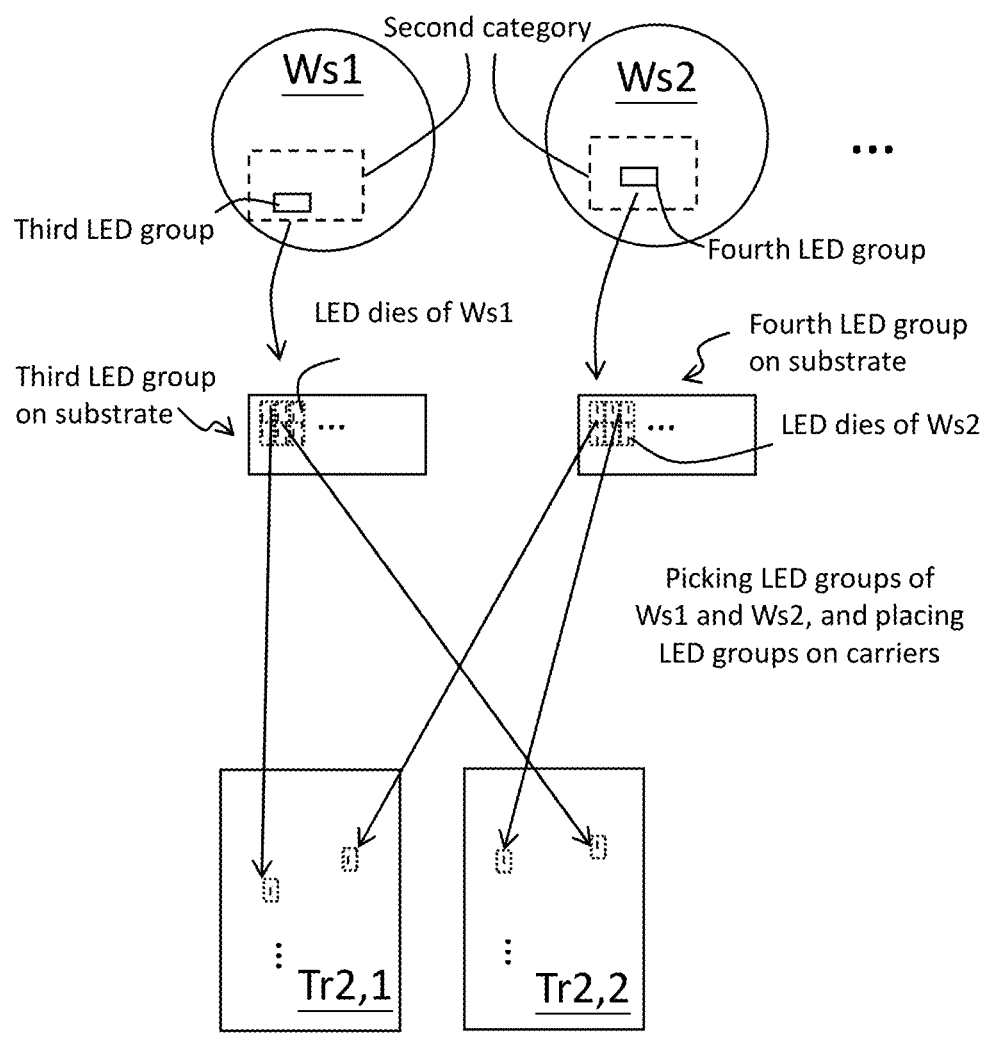

In one embodiment, the aforementioned step of sequentially placing the third and fourth LED groups of the second category to be separately on two second-color carriers Tr2,1 and Tr2,2, can be proceeded in another way: referring to FIG. 74, sequentially picking the LED dies from third LED group of the second category, sequentially placing the LED dies of the third LED group of the second category on the second-color carriers Tr2,1 and Tr2,2; sequentially picking the LED dies from fourth LED group of the second category, and sequentially placing the LED dies of the fourth LED group of the second category on the second-color carriers Tr2,1 and Tr2,2

Figure 76:
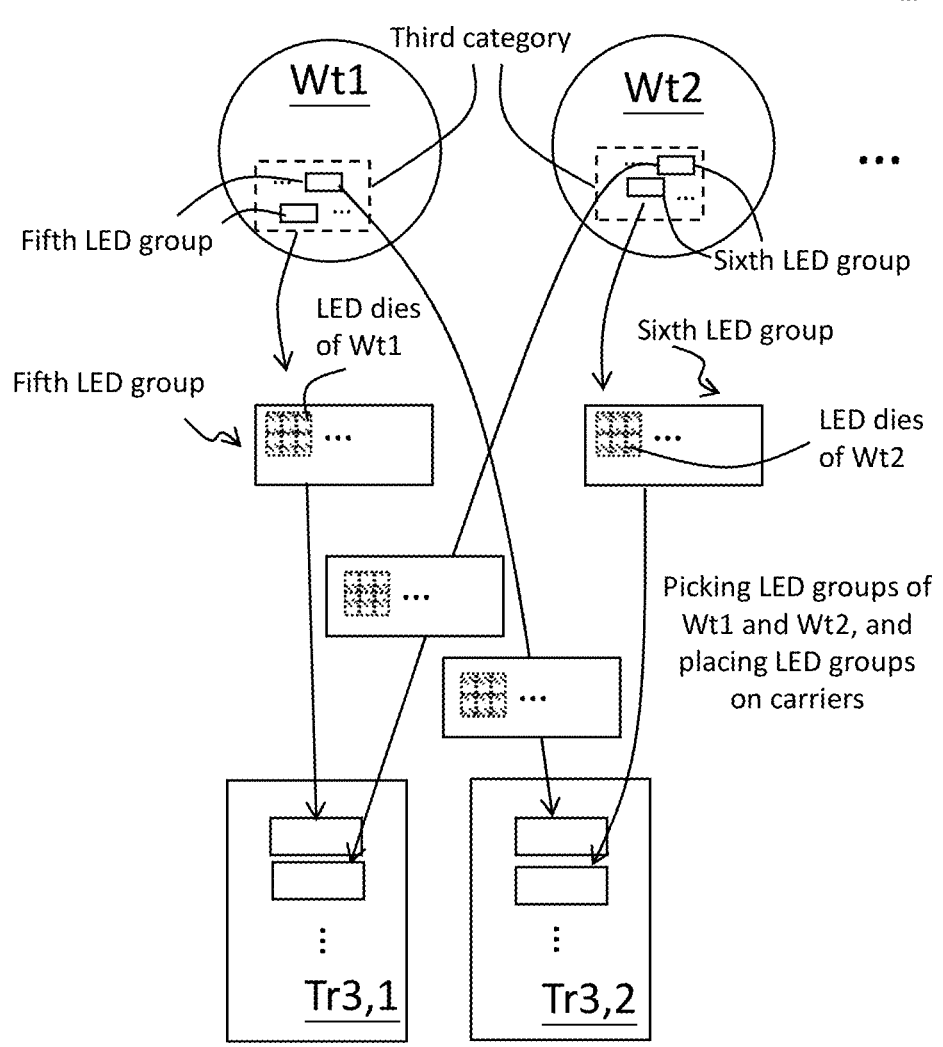
Figure 77:
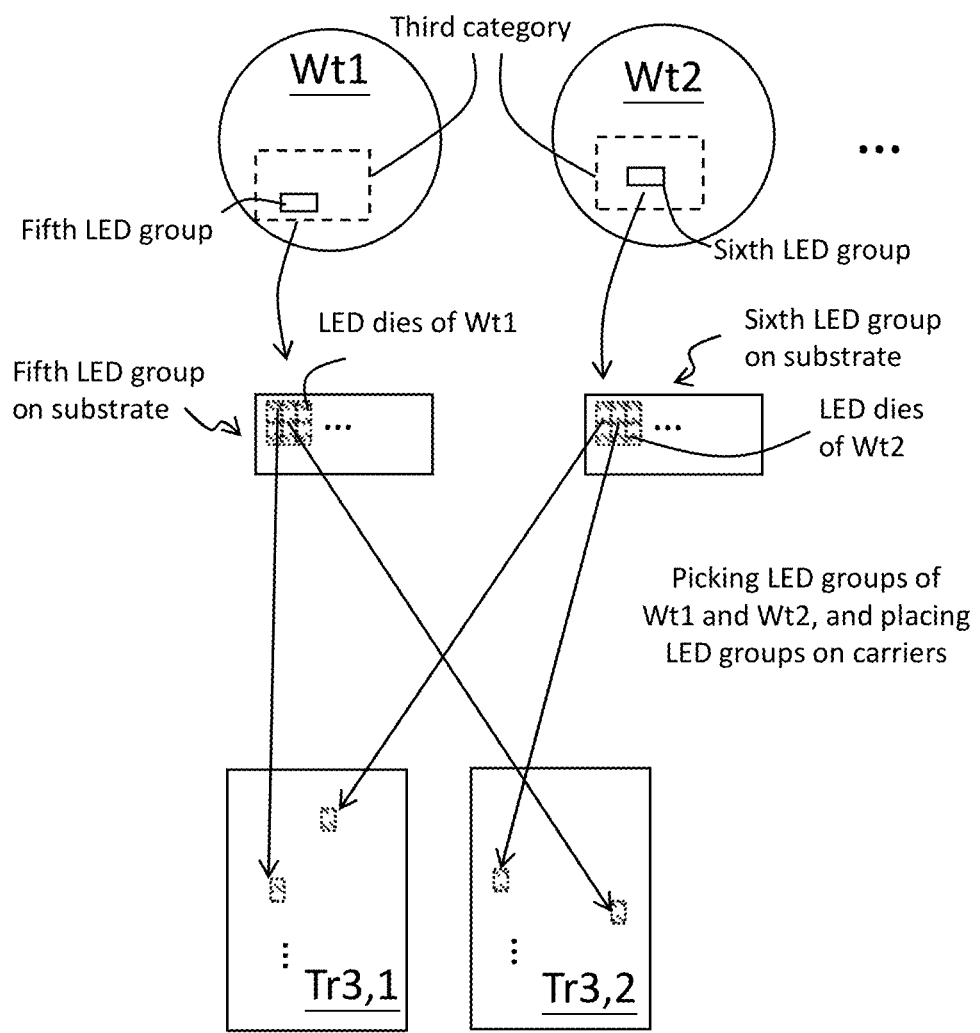
Figure 78:
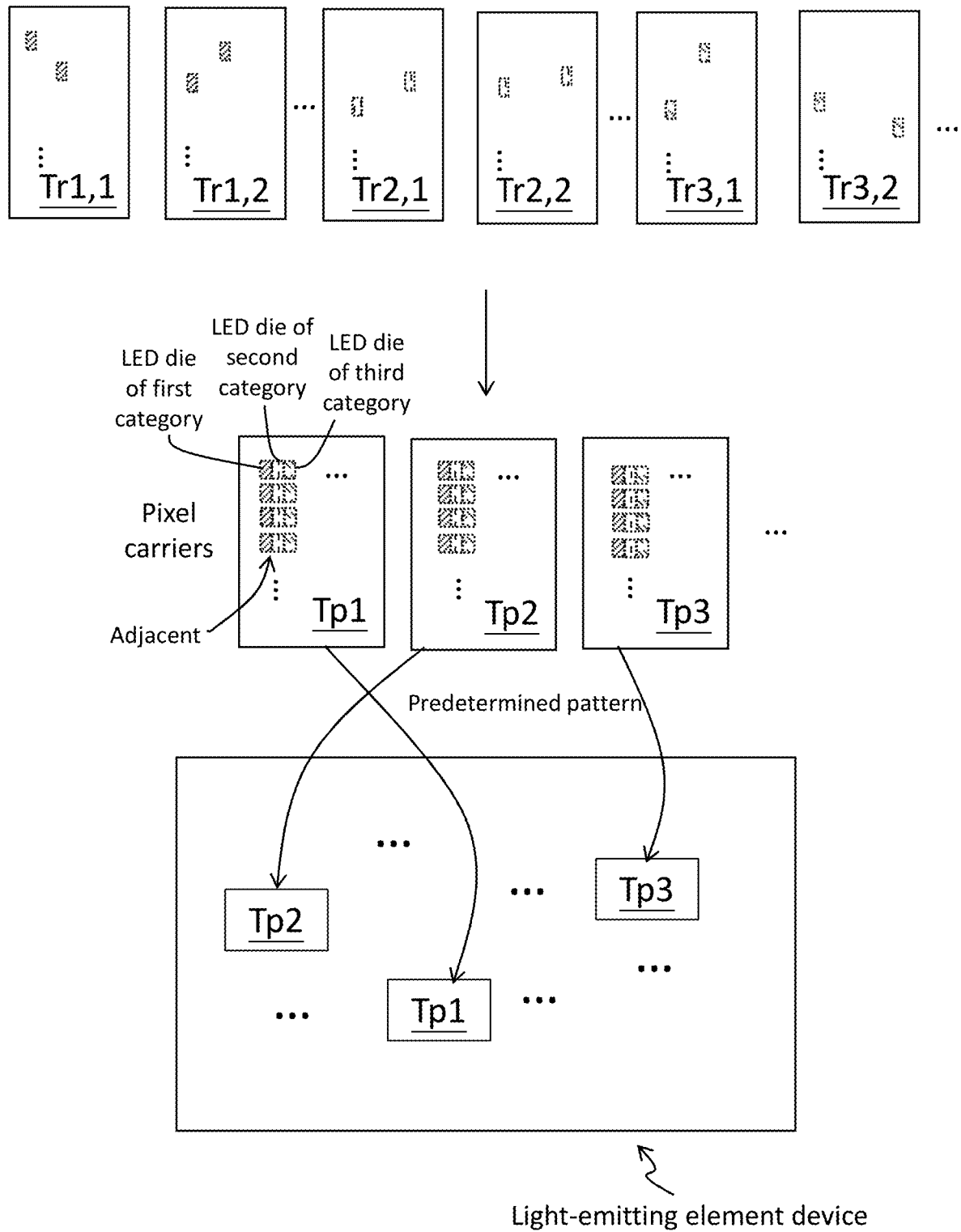

Referring to FIGS. 76, 77 and 78, the method of method of processing LED dies, may further include: assigning a third category to a plurality of LED dies on two third-color wafers Wt1 and Wt2, with a third emission color; transferring fifth LED groups and sixth LED groups of the third category respectively from the two third-color wafers Wt1 and Wt2 to two substrates; sequentially placing the fifth and sixth LED groups of the third category from the substrates, to be separately on two third-color carriers Tr3,1 and Tr3,2; with reference to FIG. 78, sequentially picking the LED dies from the first-color carriers Tr1,1 and Tr1,2, the second-color carriers Tr2,1 and Tr2,2, and the third-color carriers Tr3,1 and Tr3,2 in a plurality of groups, to be respectively placed on a plurality of pixel carriers Tp1, Tp2, and Tp3, wherein each of the groups includes three LED dies of the first, second, and third categories, and the LED dies of the third category are respectively adjacent to the LED dies of the second category on the pixel carriers Tp1, Tp2, and Tp3; and placing the pixel carriers Tp1, Tp2, and Tp3 on the light-emitting element device (FIG. 78). The LED dies are arranged on the pixel carriers in the first direction as shown in FIG. 78. In an embodiment, the LED dies are arranged on the pixel carriers in the second direction.

In one embodiment, the count of LED dies on the light-emitting element device, may be millions, tens of million, or hundreds of million. The count of LED dies depends on the size and the resolution of the light-emitting element device, and LED sizes in the light-emitting element device. The LED sizes may be in scales of smaller than 20 um, between 20 um and 100 um, between 100 um and 300 um, or larger than 300 um.

In one embodiment, the aforementioned step of sequentially placing the fifth and sixth LED groups of the third category, to be separately on two third-color carriers Tr3,1 and Tr3,2, can be proceeded in another way: referring to FIG. 77, sequentially picking the LED dies from the fifth LED group of the third category, sequentially placing the LED dies of the fifth LED group of the third category on a plurality of third-color carriers Tr3,1 and Tr3,2, sequentially picking the LED dies from the sixth LED group of the third category; and sequentially placing the LED dies of the sixth LED group of the third category on the plurality of third-color carriers Tr3,1 and Tr3,2.

In the aforementioned embodiments, the aforementioned first, second, and third emission colors, may be selected from a group of red, green, and blue. It is noted that the same emission color is further defined to be having an emission wavelength within a range. For example, the difference between the maximum value and the minimum value of the emission wavelengths of the light from the LED dies of the same emission color is less than 1% of the minimum value of the emission wavelengths of the light from the LED dies of the same emission color.

Twelfth Embodiment

Figure 79:
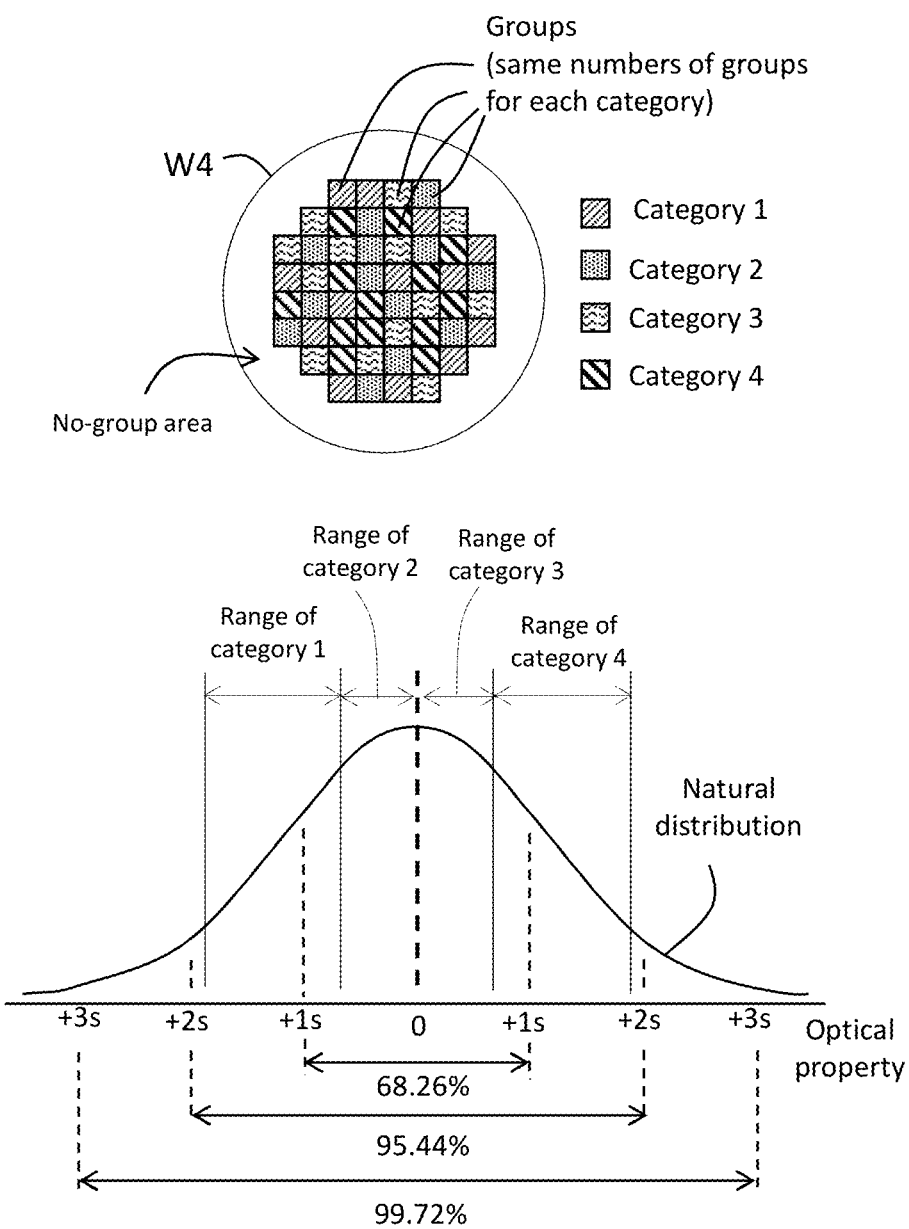
FIGS. 79-81 are schematic diagrams showing a method of processing LED dies according to the twelfth embodiment of the present invention.

Please refer to FIG. 79, wherein a majority of the LED dies arranged on a wafer W4 can take the form of multiple LED groups with each LED group having multiple LED dies of the same category. In the present embodiment, there are four categories. The categories can be decided according to optical properties, such as emission wavelength, the luminous intensity level, or the chromaticity scale of the LED dies. The sizes (or, scales) of all the LED groups are the same, and the numbers of the LED dies in the LED groups for every category can be but not limited to the same. For example, when the LED dies in one of the predetermined group ranges may belong to more than one categories, or the qualities of the LED dies in one of the groups may not be stable, the number of the qualified LED dies in the groups (of the same sizes/scales) may be different. When the number of the LED dies in one of the groups is less than a predetermined number (corresponding to the sizes/scales of the groups), the LED dies placed in the vacant LED positions therein can be chosen from other groups. The embodiment of FIG. 79 illustrates 52 LED groups corresponding to four categories, wherein each category corresponds to 13 LED groups. Importantly, the numbers of the categories or the LED groups on the wafer, are not limited to the numbers as shown in FIG. 79, and instead, other numbers can be assigned on demand.

Figure 79A:
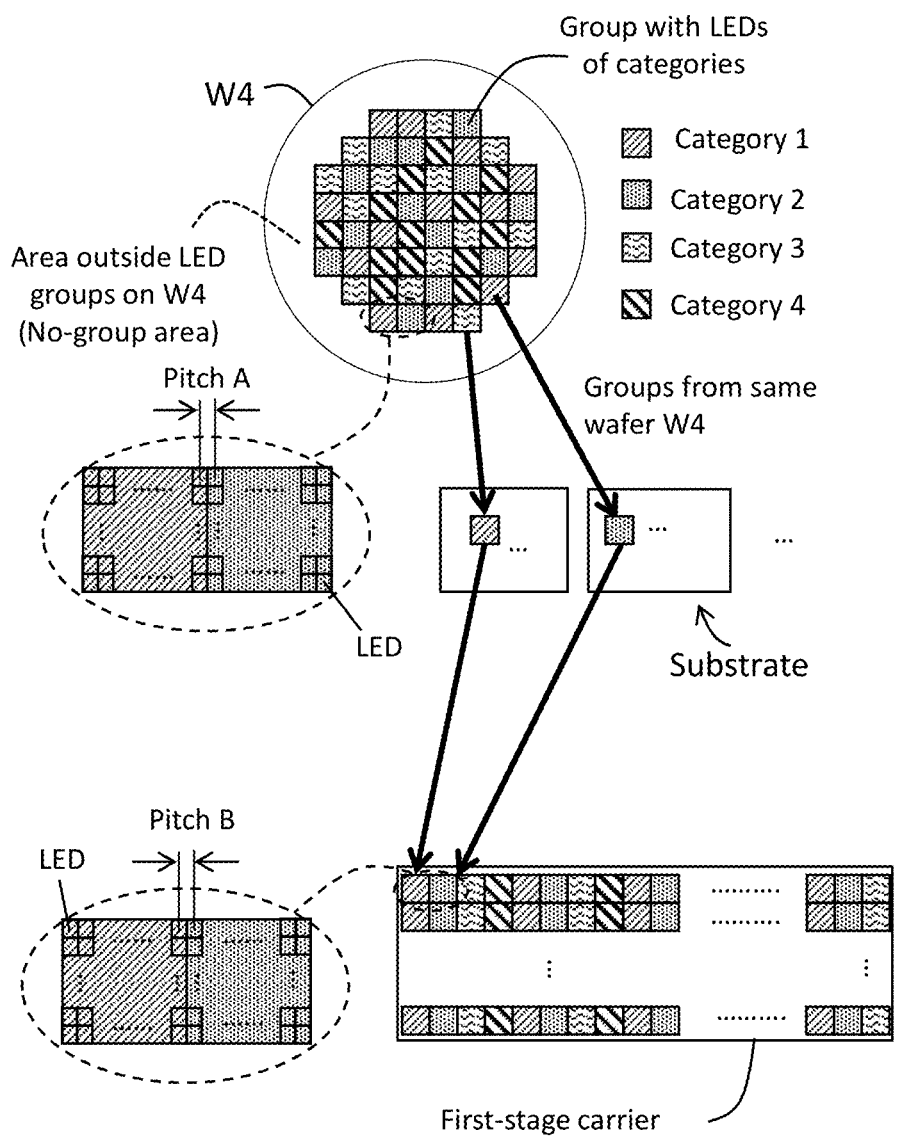

Please refer again to the bottom of FIG. 79, wherein a normal distribution of the optical properties of the LED dies on the wafer W4 is shown. It is noted that the LED groups include the majority of the LED dies near the average value (at the mean at 0) in the normal distribution, which excludes a part of the LED dies on the wafer W4. Usually, the configuration of the same size groups on the wafer W4 leaves a no-group area on the wafer W4 with some LED dies on such no-group area. Such arrangement is in favor of a fast and effective LED transferring operation, wherein the LED groups of the same category can be transferred to a substrate, and the LED groups from different substrates can have an initial LED mixing on a first-stage carrier (FIG. 79A), by transferring LED by groups instead picking the LED dies in a one-by-one fashion.

In one embodiment, please refer to FIG. 79A again, wherein the pitch A between the LED dies on wafer W4, is equal to the pitch B between the closest LED dies of the neighboring LED groups on the carrier. In detail, the operation of transferring the LED groups from the substrate to the first-stage carrier, may have no pitch adjustment between the neighboring LED dies on each same group. Further, the pitch (pitch B) between the closest LED dies of the neighboring LED groups on the first-stage carrier, can be the same as the pitch (pitch A) between the neighboring LED dies on the wafer W4, wherein the transfer operation can be done by the direct-release layer.

Figure 80:
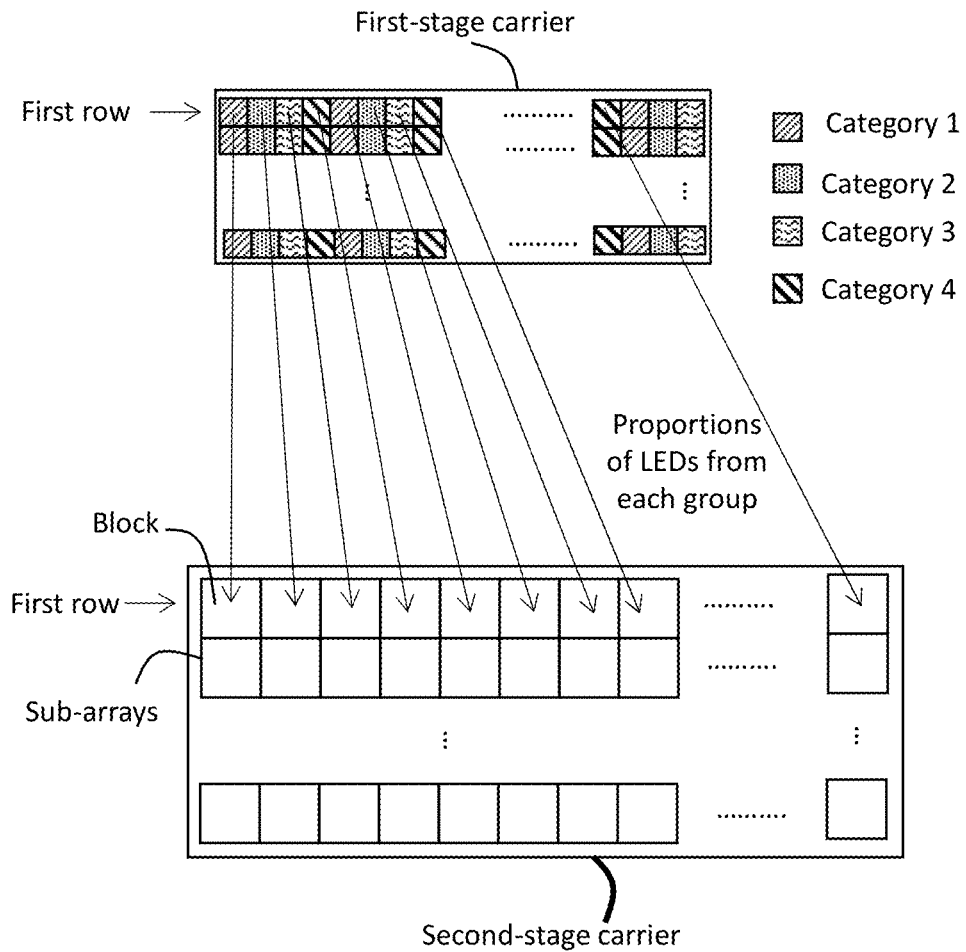

As shown in FIG. 80, the LED groups of different categories from the substrates are sequentially and repeatedly arranged in rows on the first-stage carrier. Each row on the first-stage carrier has multiple elements or multiple blocks corresponding thereto, and the LED groups of categories 1, 2, 3 and 4 are transferred from the wafer W4 to the respective blocks of the row in a repeated sequence (LED groups of categories 1, 2, 3, 4, 1, 2, 3, 4, ... ). The arrow lines illustrate operation associated with a mapping relationship between the LED dies transferred from the LED groups of the different categories on a first row of the first-stage carrier, to one of multiple sub-arrays on a first row of a second-stage carrier. The multiple sub-arrays are arranged on the second-stage carrier in rows, and each sub-array on a corresponding row has multiple elements or blocks corresponding thereto as shown. In FIG. 80, a proportion (for example, can be but not limited to 25%) of the LED dies of each LED group on the first row of the first-stage carrier are transferred to a corresponding block of the sub-array on the first row of the second-stage carrier.

Figure 80A:
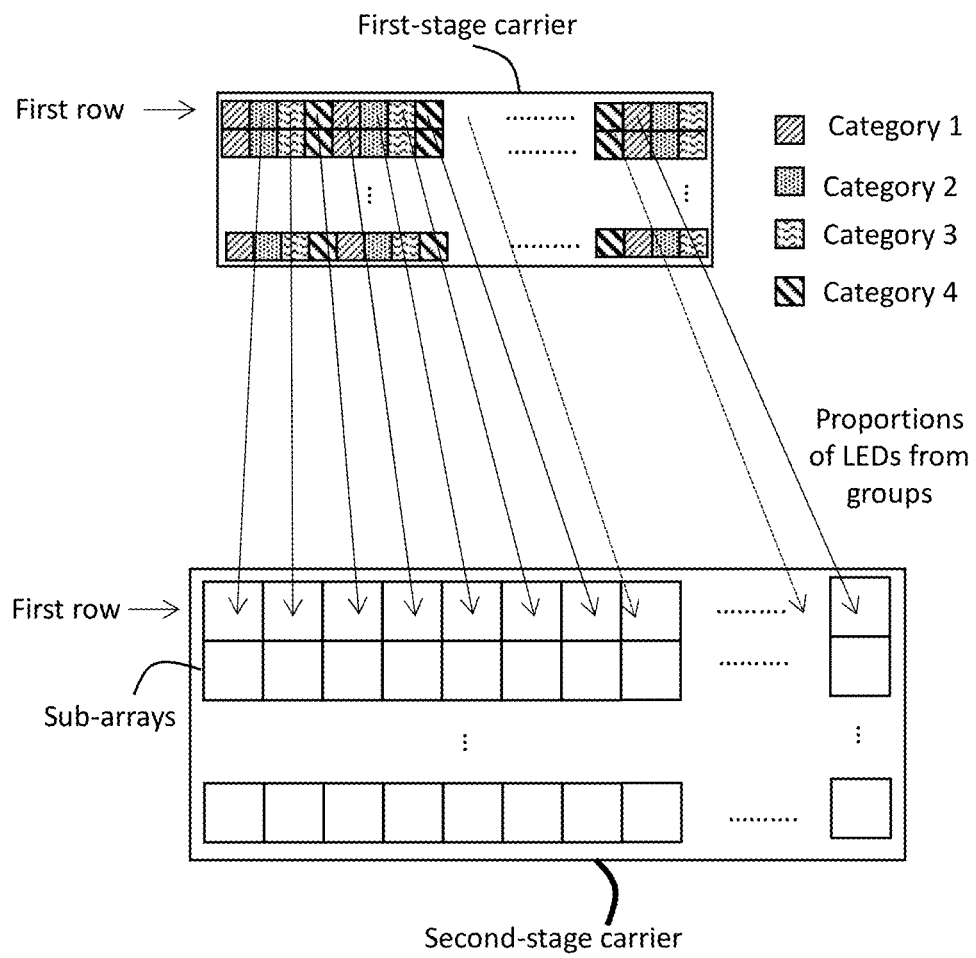

FIG. 80A illustrates a step next to the step illustrated in FIG. 80, wherein the arrow lines illustrate subsequent operation associated with the mapping relationship between the LED dies transferred from the LED groups of the different categories on the first row of the first-stage carrier, to the sub-array on a first row of the second-stage carrier. In comparison with FIG. 80, the LED groups shown in FIG. 80A used for providing the LED dies from the first row on the first-stage carrier are shifted rightward to next corresponding groups, and each block of the sub-array on the first row of the second-stage carrier, includes the LED dies with two different categories. The user can refer to the aforementioned embodiments for the patterns of placing the LED dies on the blocks of the sub-arrays with pitching and mixing operations, such as the random permutation method, etc. After the present step is done, each block of the sub-array on the first row of the second-stage carrier, includes a proportion (for example, 25%) of the LED dies therein with one category, and another proportion (for example, 25%) of the LED dies therein with another category.

Figure 80B:
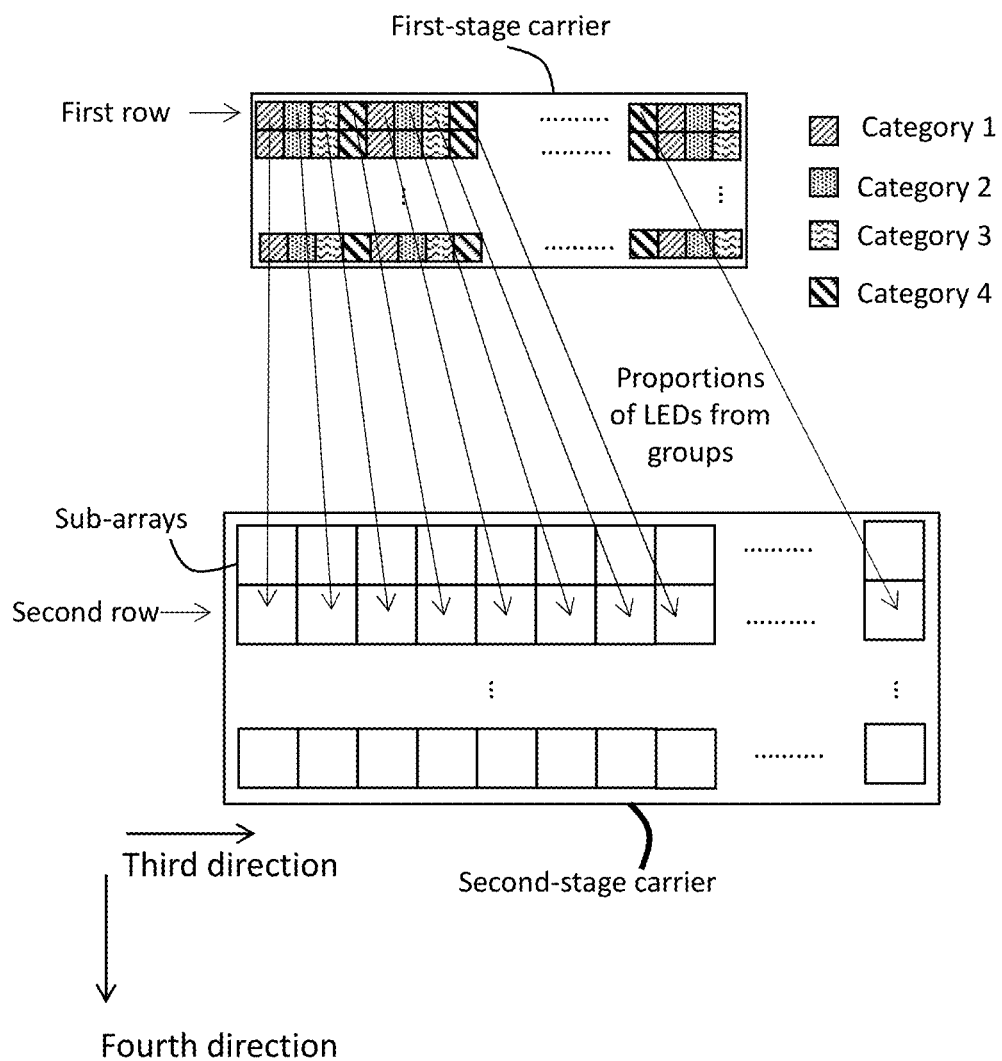

Please refer to FIG. 80B, wherein the LED groups on the first row of the first-stage carrier, are transferred to the subarray on a second row of the second-stage carrier. The arrow lines illustrate subsequent operation associated with mapping relation between the LED dies transferred from the groups with the different categories on the first row of the first-stage carrier, to the sub-array on the second row of the second-stage carrier. Therefore, the LED dies from the LED groups on the first row of the first-stage carrier are not only transferred to the sub-array on the first row of the second-stage carrier, but also to the sub-array on the second row of the second-stage carrier. Thus, the LED dies from the LED groups on the first row of the first-stage carrier can be distributed to the sub-arrays on the two rows of the second-stage carrier. From different point of view, the LED dies from the blocks on one row of the first-stage carrier can be distributed in two different directions (third and fourth directions), to have a LED mixing and distribution process.

Figure 80C:
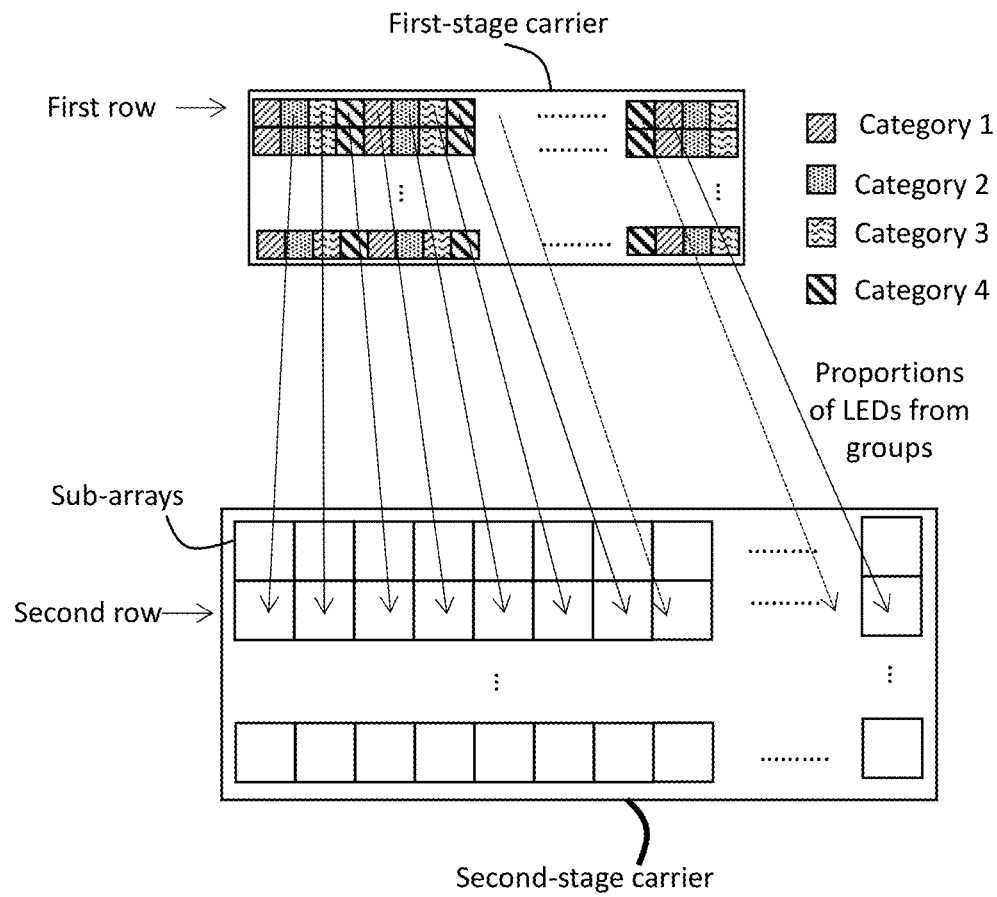

Please refer to FIG. 80C, in comparison with FIG. 80B, the LED groups shown in FIG. 80C for providing the LED dies on the first row from the first-stage carrier are additionally shifted rightward to next corresponding LED groups, and each block of the sub-array on the second row of the second-stage carrier, includes the LED dies of two different categories. Each of the block of the sub-array on the second row on the second-stage carrier, includes a proportion (for example, 25%) of the LED dies therein with one category, and another proportion (for example, 25%) of the LED dies therein with another category.

Figure 80D:
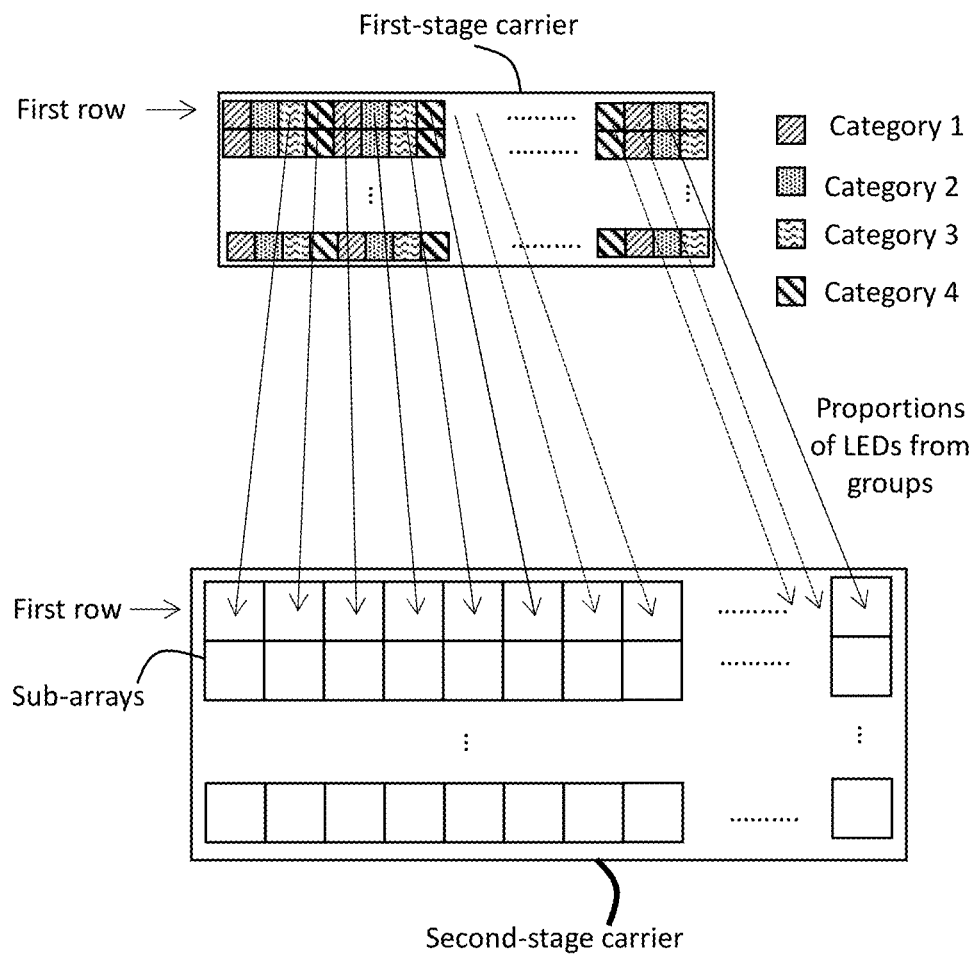
Figure 80E:
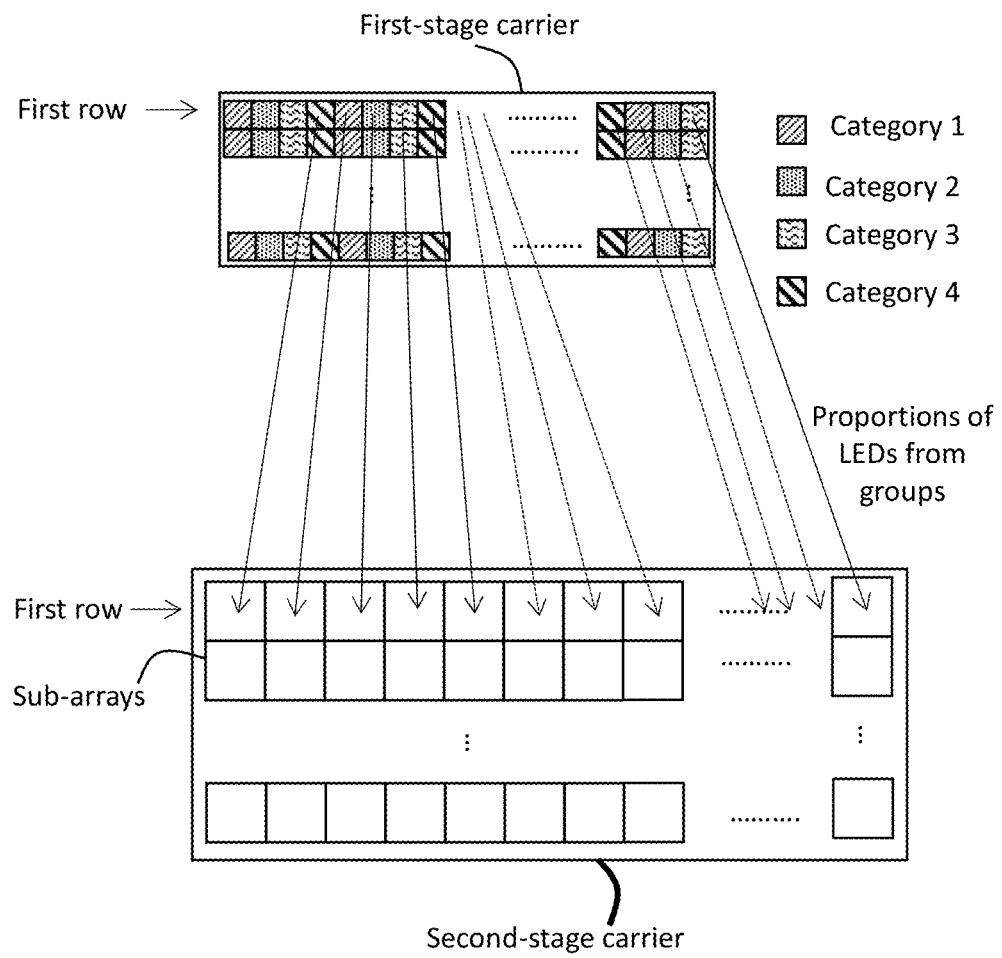

In FIG. 80D, the LED groups for providing the LED dies from the first row on the first-stage carrier are additionally shifted rightward to next corresponding LED groups in comparison with FIG. 80C, and each block of the sub-array on the first row of the second-stage carrier, includes the LED dies of three different categories. Each block of the sub-array on the first row of the second-stage carrier, includes a proportion (for example, 25%) of the LED dies therein with one category, another proportion (for example, 25%) LED dies therein with another category, and yet another proportion (for example, 25%) LED dies therein with yet another category. Further, in FIG. 80E, the LED groups for providing the LED dies from the first row on the first-stage carrier are additionally shifted rightward to next corresponding LED groups (in comparison with FIG. 80D), and each block of the sub-array on the first row of the second-stage carrier, includes the LED dies of four different categories, wherein the LED dies with four different categories are evenly placed on each block of the sub-array on the first row of the second-stage carrier. Users can follow the aforementioned steps for placing the LED dies on the first-stage carrier on other sub-arrays of the second-stage carrier.

In the aforementioned detail of the twelfth embodiment, the operation of one wafer, one first-stage carrier and one second-stage carrier is explained herein. In practical implementation, the LED dies from plural wafers can be transferred to one first-stage carrier, or the LED dies from one wafer can be transferred to plural first-stage carriers. Further, the LED dies from plural first-stage carriers can be transferred to one second-stage carrier or the LED dies from one first-stage carrier, can be transferred to plural the second-stage carriers.

Figure 81:
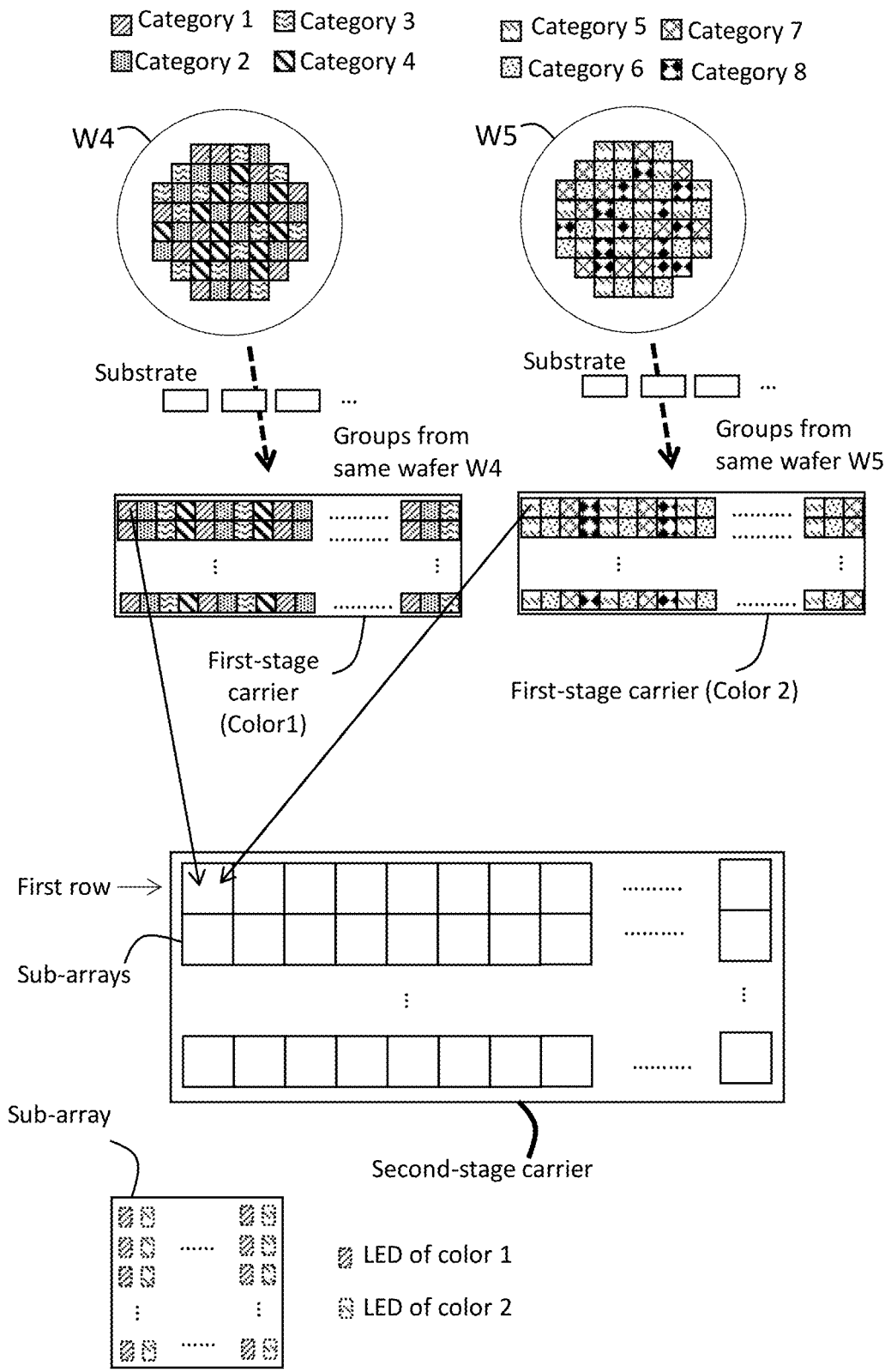

Besides, when the plural wafers include at least two wafers with different emission colors, please refer to FIG. 81, which illustrates one embodiment of wafers with two different emission colors, wherein the wafer W4 corresponds to emission color 1 and categories 1, 2, 3, and 4, and the wafer W5 corresponds to emission color 2 and categories 5, 6, 7, and 8. Please refer to the bottom of FIG. 81, wherein a block of one sub-array with LED dies of different emission colors is illustrated. The LED dies with different emission colors from wafers W4 and W5, are separately transferred to two first-stage carriers. The LED dies with different emission colors on corresponding LED groups of the two first-stage carriers, are placed on the respective identical blocks of the sub-arrays of the second-stage carrier. The user may refer to the aforementioned embodiments for this process of mixing LED dies of two emission colors from different carriers, and the detail is not elaborated herein.

The assignment of the LED categories as shown in figures is for illustrative purpose, and the categories can be decided according to an estimation by sensing optical properties of only a few LED dies on the wafer. Therefore, the category assignment can be quick and there is no need to calculate a large number of optical properties of all LED dies on the wafer.

In one perspective, the present invention provides a light-emitting element device, comprising: a carrier; and a plurality of light-emitting elements arranged on the carrier in a predetermined matrix dimension, wherein the plurality of light-emitting elements is fully classified into a plurality of categories by a quantity proportion according to an optical property; wherein the quantity proportion is not fitted into a normal distribution curve. In one embodiment, the category span of the emission wavelength can be defined as 0.5 nm, 1 nm, 2 nm, 5 nm, etc., according to the facility precision or resolution. The categories of the luminous intensity level can be defined according to an optical power (Po) of 5%, 6%, 8%, 10%, or others; or according to luminous intensity (Iv) of 5%, 6%, 8%, 10%, or others. In one embodiment, the plurality of categories comprise at least 4 categories for illustrating this non-normal distribution curve.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention.

What is claimed is:

1. A light-emitting element device, comprising:
   a carrier; and
   a plurality of matrices, arranged on the carrier, and each of the plurality of matrices including a plurality of light-emitting elements which is grouped into a plurality of categories, wherein numbers of the light-emitting elements of the plurality of categories have a quantity priority;
   wherein each of the plurality of matrices is distinguished from other matrices,
   wherein each of the plurality of categories is different from other categories,
   wherein the light-emitting elements of the plurality of matrices have a same emission color,
   wherein the plurality of categories is classified by emission wavelength, luminous intensity level, or chromaticity scale, and
   wherein the quantity priority of each of the plurality of matrices is substantially the same as the quantity priority of other matrices.

2. The device of claim 1, wherein any two of the plurality of matrices substantially have an equivalent number of the light-emitting elements in each of the plurality of categories.

3. The device of claim 1, wherein the plurality of categories is characterized based on emission wavelength and each of the plurality of categories has a wavelength interval of less than 0.1 nm, 0.5 nm, 1 nm, or 2 nm.

4. The device of claim 1, wherein the plurality of categories is characterized based on luminous intensity level and each of the plurality of categories has an interval with a range from 5% to 10% of a difference between the maximum value and the minimum value of the luminous intensity levels of the light-emitting elements.

5. The device of claim 1, wherein the plurality of light-emitting elements has a quantity of not less than 5000.

6. The device of claim 5, wherein the quantities of the plurality of light-emitting elements in any two of the plurality of matrices are the same.

7. The device of claim 1, wherein the each of the plurality of matrices has a quantity distribution curve corresponding to the plurality of categories, and the quantity distribution curve is a combination of straight lines.

8. The device of claim 7, wherein the quantity distribution curve of the each of the plurality of matrices has no single peak.

9. The device of claim 7, wherein the quantity distribution curve of the each of the plurality of matrices has no long tail on a minimum limit, a maximum limit, or both.

10. The device of claim 7, wherein any two of the plurality of matrices have two distribution curves with a quantity deviation of less than 20%.

11. The device of claim 1, wherein any two of the plurality of matrices have the same dimension.

12. The device of claim 1, wherein the ratios of numbers of the light-emitting elements of the plurality of categories in any two of the plurality of matrices are substantially the same.

13. The device of claim 1, wherein the plurality of categories comprises at least 4 categories.

14. The device of claim 1, wherein the plurality of light-emitting elements in each of the matrix has a quantity of not less than 9.

15. The device of claim 1, wherein the plurality of matrices has a quantity of not less than 4.

16. The device of claim 1, wherein each light-emitting element of the plurality of light-emitting elements is an LED die.

17. The device of claim 1, wherein the emission color of the plurality of light-emitting elements is either red, green or blue.

18. A light-emitting element device, comprising:
   a carrier;
   a first matrix, arranged on the carrier, and including a plurality of first light-emitting elements which is grouped into a plurality of first categories comprising a category 1, a category 2, and a category 3 arranged in a first quantity priority; and
   a second matrix, arranged on the carrier, and including a plurality of second light-emitting elements which is grouped into a plurality of second categories comprising the category 1, the category 2, and the category 3 arranged in a second quantity priority;

wherein the category 1, the category 2 and the category 3 are different from each other, wherein the plurality of first light-emitting elements and the plurality of second light-emitting elements have a same emission color, and the first quantity priority and the second quantity priority are substantially the same, and wherein the plurality of first categories and the plurality of second categories are classified by emission wavelength, luminous intensity level, or chromaticity scale.

19. The device of claim 18, wherein the first matrix and the second matrix have the same dimension.

20. The device of claim 18, wherein the plurality of first light-emitting elements has a quantity of not less than 5000.

* * * * *